(12) United States Patent
Inoue et al.

(10) Patent No.: US 9,929,356 B2
(45) Date of Patent: Mar. 27, 2018

(54) LIGHT-EMITTING ELEMENT, LIGHT-EMITTING DEVICE, ELECTRONIC APPLIANCE, AND LIGHTING DEVICE

(71) Applicant: Semiconductor Energy Laboratory Co., Ltd., Kanagawa-ken (JP)

(72) Inventors: Hideko Inoue, Kanagawa (JP); Tomoka Nakagawa, Kanagawa (JP); Satoshi Seo, Kanagawa (JP); Nobuharu Ohsawa, Kanagawa (JP); Kunihiko Suzuki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 1030 days.

(21) Appl. No.: 14/091,966

(22) Filed: Nov. 27, 2013

(65) Prior Publication Data

US 2014/0151662 A1   Jun. 5, 2014

(30) Foreign Application Priority Data

Nov. 30, 2012  (JP) .................................. 2012-261797

(51) Int. Cl.
| | | |
|---|---|---|
| *H01L 51/00* | (2006.01) | |
| *H01L 51/50* | (2006.01) | |
| *H01L 51/52* | (2006.01) | |

(52) U.S. Cl.
CPC ...... *H01L 51/0085* (2013.01); *H01L 51/5016* (2013.01); *H01L 51/5278* (2013.01)

(58) Field of Classification Search
CPC .................................................. H01L 51/0085
See application file for complete search history.

(56) References Cited

U.S. PATENT DOCUMENTS 7,659,010 B2   2/2010   Burn et al.
8,216,699 B2   7/2012   Burn et al.
(Continued)

FOREIGN PATENT DOCUMENTS

CN   001696243 A   11/2005
CN   001791655 A   6/2006
(Continued)

OTHER PUBLICATIONS

Wu, Z.L. et al., "Synthesis and Photoluminescence of a Novel Iridium Complex (BuPhOXD)2Ir(acac) with Unit of 1,3,4-Oxadiazole," Chinese Chemical Letters, vol. 16, No. 2, 2005, pp. 241-244, Chinese Chemical Society.
(Continued)

*Primary Examiner* — Alex A Rolland
(74) *Attorney, Agent, or Firm* — Husch Blackwell LLP

(57) ABSTRACT

A light-emitting element in which a light-emitting layer contains an organic compound capable of emitting phosphorescence is provided. A light-emitting element which can have low driving voltage, high current efficiency, or a long lifetime is provided. In a light-emitting element in which a light-emitting layer is interposed between a pair of electrodes, the light-emitting layer contains an organic compound. The organic compound has a 1,2,4-triazole skeleton, a phenyl skeleton, an arylene skeleton, and a Group 9 metal or a Group 10 metal. The nitrogen atom at the 4-position of the 1,2,4-triazole skeleton coordinates to the Group 9 metal or the Group 10 metal. The nitrogen atom at the 1-position of the 1,2,4-triazole skeleton is bonded to a phenyl skeleton. The arylene skeleton is bonded to the 3-position of the 1,2,4-triazole skeleton and the Group 9 metal or the Group 10 metal.

18 Claims, 32 Drawing Sheets

(56) References Cited

U.S. PATENT DOCUMENTS

| | | | |
|---|---|---|---|
| 9,065,061 | B2 | 6/2015 | Inoue et al. |
| 9,406,894 | B2* | 8/2016 | Inoue .................. H01L 51/0067 |
| 9,735,374 | B2 | 8/2017 | Akino et al. |
| 2006/0036097 | A1 | 2/2006 | Qiu et al. |
| 2007/0085073 | A1 | 4/2007 | Inoue et al. |
| 2009/0102370 | A1* | 4/2009 | Taka .................... C07D 233/58 313/504 |
| 2010/0164378 | A1* | 7/2010 | Radivojevic .............. F21K 2/04 313/506 |
| 2011/0101854 | A1 | 5/2011 | Inoue et al. |
| 2011/0198988 | A1 | 8/2011 | Inoue et al. |
| 2011/0220882 | A1 | 9/2011 | Inoue et al. |
| 2012/0305896 | A1 | 12/2012 | Inoue et al. |
| 2015/0287936 | A1 | 10/2015 | Inoue et al. |

FOREIGN PATENT DOCUMENTS

| | | |
|---|---|---|
| CN | 102574883 A | 7/2012 |
| EP | 1 777 229 A1 | 4/2007 |
| JP | 2007-137872 | 6/2007 |
| JP | 2007-208102 | 8/2007 |
| JP | 2008-69221 | 3/2008 |
| JP | 2008-069268 A | 3/2008 |
| JP | 2011-253980 A | 12/2011 |
| JP | 2013-147449 A | 8/2013 |
| WO | WO 2004/101707 A1 | 11/2004 |
| WO | WO 2008/035664 A1 | 3/2008 |
| WO | WO 2009/107497 A1 | 9/2009 |
| WO | WO 2011/052516 A1 | 5/2011 |

OTHER PUBLICATIONS

Van Diemen, J.H. et al., "Synthesis and Characterization of Orthometalated Rhodium (III) Complexes Containing Substituted Triazoles," Inorganic Chemistry, vol. 30, No. 21, 1991, pp. 4038-4043, American Chemical Society.

Zamora, F. et al., "Synthesis of Several Palladium Complexes Derived from 2,5-diphenyl-1,3,4-Oxadiazole. Reactivity Against Nucleobase Models,", Journal of Inorganic Biochemistry, vol. 68, No. 4, Dec. 1, 1997, pp. 257-263.

Baldo, M.A. et al., "Very High-Efficiency Green Organic Light-Emitting Devices Based on Electrophosphorescence," Applied Physics Letters, vol. 75, No. 1, Jul. 5, 1999, pp. 4-6.

Liu, J. et al., "Green-Yellow Electrophosphorescence from di [2,5-diphenyl-1,3,4-oxadiazole $C^{2'}$, $N^{3}$] Platinum(II) Doped PVK Devices," Chinese Physics Letters, vol. 22, No. 3, pp. 2005, 723-726.

Wu, Z.L. et al., "Synthesis and Photoluminescence of a Novel Iridium Complex (BuPhOXD)2Ir(acac) with Unit of 1,3,4-Oxadiazole," Chinese Chemical Society, vol. 16, No. 2, 2005, pp. 241-244.

Chen, L. et al., "Synthesis, Structure, Electrochemistry, Photophysics and Electroluminescence of 1,3,4-Oxadiazole-Based Ortho-Metalated Iridium(III) Complexes,", Journal of Organometallic Chemistry, vol. 691, No. 16, Aug. 1, 2006, pp. 3519-3530.

Lo, S.-C. et al, "Blue Phosphorescence from Iridium(III) Complexes at Room Temperature," Chemistry of Materials, vol. 18, No. 21, 2006, pp. 5119-5129, American Chemical Society.

Chinese Office Action re Application No. CN 201310627193.9, dated Apr. 27, 2017.

* cited by examiner

- - fluorescence spectrum of the first organic compound 213
  (or the third organic compound 215)

- - - phosphorescence spectrum of the first organic compound 213
  (or the third organic compound 215)

—— absorption spectrum of the second organic compound 214

—— emission spectrum of exciplex

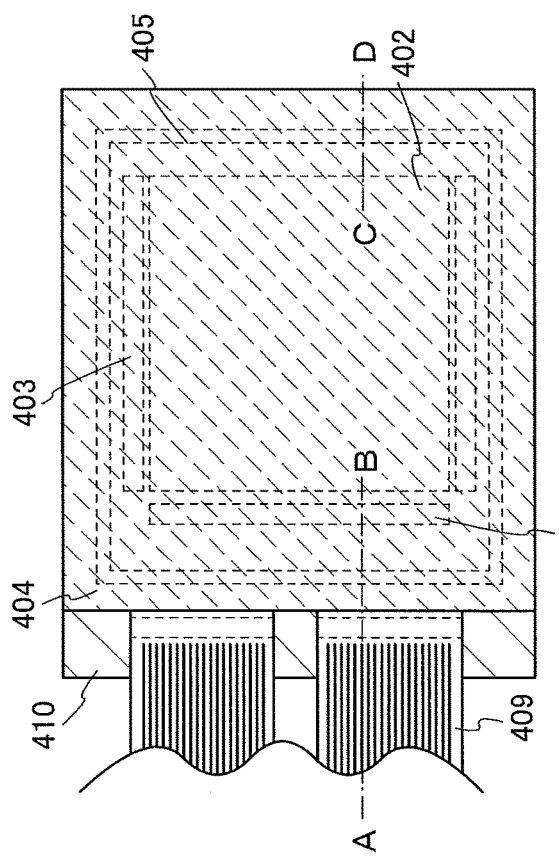
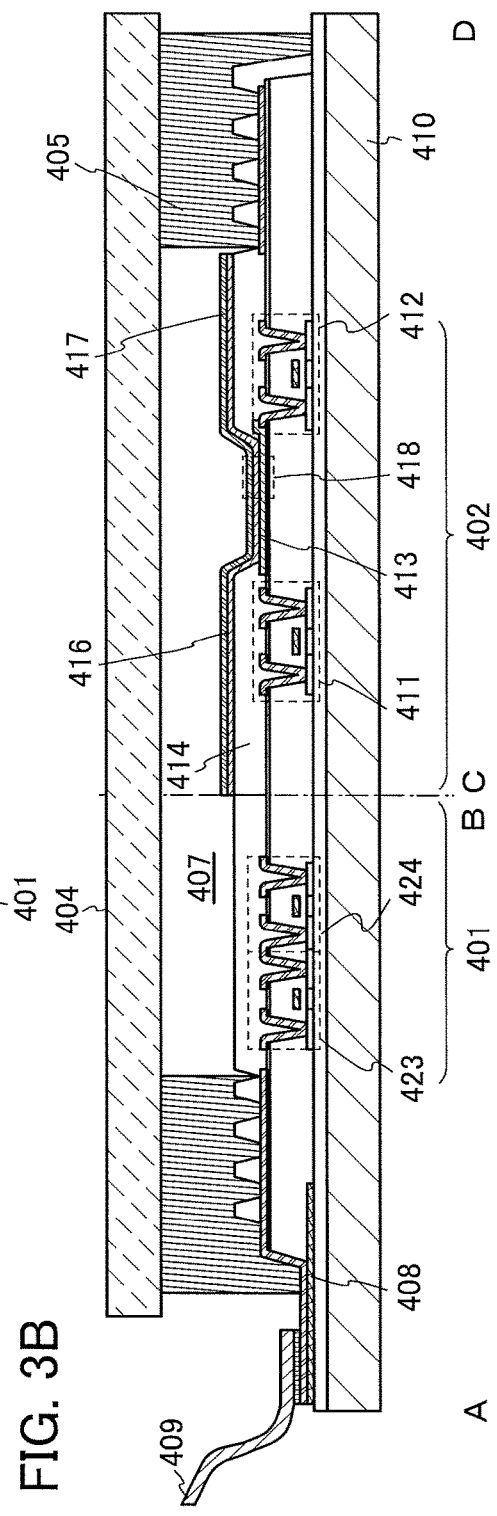
FIG. 3A
FIG. 3B

LIGHT-EMITTING ELEMENT, LIGHT-EMITTING DEVICE, ELECTRONIC APPLIANCE, AND LIGHTING DEVICE

BACKGROUND OF THE INVENTION

1. Field of the Invention

The present invention relates to an object, a method, a manufacturing method, a process, a machine, manufacture, or a composition of matter. In particular, the present invention relates to, for example, a semiconductor device, a display device, a light-emitting device, a method for driving any of them, or a method for manufacturing any of them. In particular, the present invention relates to, for example, a light-emitting element. In particular, the present invention relates to, for example, a light-emitting element containing an organic compound that is capable of converting triplet excited energy into luminescence. The present invention also relates to, for example, a light-emitting device, an electronic appliance, and a lighting device each of which includes the light-emitting element.

2. Description of the Related Art

In recent years, a light-emitting element using a light-emitting organic compound or inorganic compound as a light-emitting material has been actively developed. In particular, a light-emitting element called an EL (electroluminescence) element has attracted attention as a next-generation flat panel display element because it has a simple structure in which a light-emitting layer containing a light-emitting material is provided between electrodes, and characteristics such as feasibility of being thin, lightweight, and highly responsive to input signals, and able to be driven with direct current at low voltage. In addition, a display using such a light-emitting element has a feature that it is excellent in contrast and image quality, and has a wide viewing angle. Further, since such a light-emitting element is a plane light source, the light-emitting element is considered to be applicable to a light source such as a backlight of a liquid crystal display and lighting.

In the case where the light-emitting substance is an organic compound having a light-emitting property, the emission mechanism of the light-emitting element is a carrier-injection type. That is, by applying voltage with a light-emitting layer interposed between electrodes, electrons and holes injected from the electrodes recombine to make the light-emitting substance excited, and light is emitted when the excited state returns to a ground state. There are two types of the excited states that are possible: a singlet excited state (S*) and a triplet excited state (T*). In addition, the statistical generation ratio of S* to T* in a light-emitting element is thought to be 1:3.

In general, the ground state of a light-emitting organic compound is a singlet state. Light emission from the singlet excited state (S*) is referred to as fluorescence where electron transition occurs between the same multiplicities. On the other hand, light emission from the triplet excited state (T*) is referred to as phosphorescence where electron transition occurs between different multiplicities. At room temperature, observations of a compound which emits fluorescence (hereinafter referred to as a fluorescent compound) usually show only fluorescence without phosphorescence. Therefore, the internal quantum efficiency (the ratio of the number of generated photons to the number of injected carriers) of a light-emitting element including the fluorescent compound is assumed to have a theoretical limit of 25%, on the basis of S*:T*=1:3.

On the other hand, when a phosphorescent compound is used as a light-emitting organic compound, the internal quantum efficiency can be theoretically increased to 100%. In other words, the emission efficiency can be four times as much as that of the fluorescence compound. For this reason, light-emitting elements using a phosphorescent compound have been recently under active development so that high-efficiency light-emitting elements can be achieved.

In particular, an organometallic complex in which iridium or the like is a central metal has attracted attention as a phosphorescent compound owing to its high phosphorescence quantum yield. As a typical phosphorescent material emitting green to blue light, there is a metal complex in which iridium (Ir) is a central metal (hereinafter referred to as an "Ir complex") (e.g., see Patent Document 1, Patent document 2, and Patent Document 3). Disclosed in Patent Document 1 is an Ir complex where a triazole derivative is a ligand.

REFERENCE

[Patent Document 1] Japanese Published Patent Application No. 2007-137872
[Patent Document 2] Japanese Published Patent Application No. 2008-069221
[Patent Document 3] PCT International Publication No. 2008-035664

SUMMARY OF THE INVENTION

As disclosed in Patent Documents 1 to 3, although phosphorescent materials have been developed, there is room for improvement in terms of emission efficiency, reliability, light-emitting characteristics, synthesis yield, cost, or the like, and further development is required for obtaining more excellent phosphorescent materials.

Further, in order to obtain a light-emitting device, an electronic device, and a lighting device each having reduced power consumption and high reliability, a light-emitting element having low driving voltage, a light-emitting element having high current efficiency, or a light-emitting element having a long lifetime has been demanded.

In view of the above, an object of one embodiment of the present invention is to provide a light-emitting element in which a light-emitting layer contains an organic compound capable of emitting phosphorescence.

Another object of one embodiment of the present invention is to provide a light-emitting element which can achieve low driving voltage. Another object of one embodiment of the present invention is to provide a light-emitting element which can achieve high current efficiency. Another object of one embodiment of the present invention is to provide a light-emitting element which can achieve a long lifetime.

Another object of one embodiment of the present invention is to provide a light-emitting device, an electronic appliance, and a lighting device each of which includes the above light-emitting element.

Note that the descriptions of these objects do not disturb the existence of other objects. Note that in one embodiment of the present invention, there is no need to achieve all of the objects. Note that other objects will be apparent from the description of the specification, the drawings, the claims, and the like and other objects can be derived from the description of the specification, the drawings, the claims, and the like.

One embodiment of the present invention is a light-emitting element in which a light-emitting layer is interposed between a pair of electrodes. The light-emitting layer contains an organic compound. The organic compound has a 1,2,4-triazole skeleton, a phenyl skeleton, an arylene skeleton, and a Group 9 metal or a Group 10 metal. Nitrogen at the 4-position of the 1,2,4-triazole skeleton coordinates to the Group 9 metal or the Group 10 metal. Nitrogen at the 1-position of the 1,2,4-triazole skeleton is bonded to the phenyl skeleton. The arylene skeleton is bonded to the 3-position of the 1,2,4-triazole skeleton and the Group 9 metal or the Group 10 metal.

Note that the above organic compound can emit phosphorescence.

A light-emitting device, an electronic appliance, and a lighting device each of which includes the above light-emitting element also belong to the category of the present invention. Note that the light-emitting device in this specification includes, in its category, an image display device and a light source. In addition, the light-emitting device includes, in its category, all of a module in which a connector such as a flexible printed circuit (FPC), a tape automated bonding (TAB) tape or a tape carrier package (TCP) is connected to a panel, a module in which a printed wiring board is provided on the tip of a TCP, and a module in which an integrated circuit (IC) is directly mounted on a light-emitting element by a chip on glass (COG) method.

The use of the light-emitting element of one embodiment of the present invention can provide a light-emitting element in which a light-emitting layer contains an organic compound capable of emitting phosphorescence.

The use of the light-emitting element of one embodiment of the present invention can achieve low driving voltage, high current efficiency, or a long lifetime. Furthermore, a light-emitting device, an electronic appliance, and a lighting device each of which includes the light-emitting element can be provided.

BRIEF DESCRIPTION OF THE DRAWINGS

FIGS. 3A and 3B illustrate a light-emitting device of one embodiment of the present invention.

DETAILED DESCRIPTION OF THE INVENTION

Figure 1A:
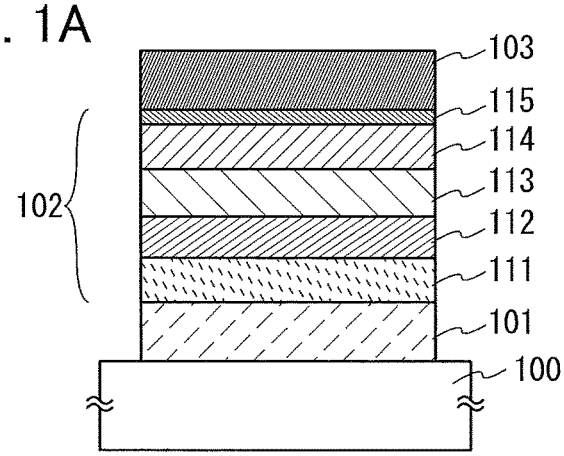
FIGS. 1A to 1C each illustrate a light-emitting element of one embodiment of the present invention.

Embodiments will be described in detail with reference to the drawings. Note that the present invention is not limited to the description below, and it will be easily understood by those skilled in the art that various changes and modifications can be made without departing from the spirit and scope of the present invention. Therefore, the invention should not be construed as being limited to the description in the following embodiments. Note that in the structures of the invention described below, the same portions or portions having similar functions are denoted by the same reference numerals in different drawings, and descriptions of such portions will not be repeated.

Embodiment 1

In this embodiment, light-emitting elements each of which includes a light-emitting layer between a pair of electrodes are described with reference to FIGS. 1A to 1C.

First, the light-emitting element illustrated in FIG. 1A is described.

As illustrated in FIG. 1A, the light-emitting element in this embodiment includes an EL layer 102 between a first electrode 101 and a second electrode 103. The EL layer 102 includes at least a light-emitting layer 113 and also includes a hole-injection layer 111, a hole-transport layer 112, an electron-transport layer 114, an electron-injection layer 115, and the like. Note that in this embodiment, the first electrode 101 is used as an anode and the second electrode 103 is used as a cathode.

The light-emitting layer 113 contains an organic compound. The organic compound has a 1,2,4-triazole skeleton, a phenyl skeleton, an arylene skeleton, and a Group 9 metal or a Group 10 metal. Nitrogen at the 4-position of the 1,2,4-triazole skeleton coordinates to the Group 9 metal or the Group 10 metal. Nitrogen at the 1-position of the 1,2,4-triazole skeleton is bonded to the phenyl skeleton. The arylene skeleton is bonded to the 3-position of the 1,2,4-triazole skeleton and the Group 9 metal or the Group 10 metal.

The organic compound can emit phosphorescence. Specifically, the organic compound with a tris structure emits blue phosphorescence with extremely high color purity. In the tris structure, three 1-phenyl-3-aryl-1H-1,2,4-triazole skeletons in each of which nitrogen at the 4-position coordinates to iridium are included and an aryl group is bonded to iridium.

By application of voltage to the above light-emitting element containing the organic compound between the pair of electrodes can emit blue phosphorescence with extremely high color purity and with high efficiency. Thus, the use of the organic compound in a light-emitting element enables the light-emitting element to have low driving voltage, high current efficiency, and a long lifetime.

Further details of the light-emitting elements in this embodiment are given below.

A substrate 100 is used as a support of the light-emitting element. For example, glass, quartz, plastic, or the like can be used for the substrate 100. Furthermore, a flexible substrate may be used. The flexible substrate is a substrate that can be bent, such as a plastic substrate made of, for example, polycarbonate, polyarylate, or poly(ether sulfone). Alternatively, a film (made of polypropylene, polyester, polyvinyl fluoride, polyvinyl chloride, or the like), an inorganic film formed by evaporation, or the like can be used. Note that another material may be used as long as it can function as a support in a process of manufacturing the light-emitting element.

As the first electrode 101 and the second electrode 103, a metal, an alloy, an electrically conductive compound, a mixture thereof, and the like can be used. Specific examples include indium oxide-tin oxide (ITO: indium tin oxide), indium oxide-tin oxide containing silicon or silicon oxide, indium oxide-zinc oxide, indium oxide containing tungsten oxide and zinc oxide, gold (Au), platinum (Pt), nickel (Ni), tungsten (W), chromium (Cr), molybdenum (Mo), iron (Fe), cobalt (Co), copper (Cu), palladium (Pd), and titanium (Ti). Further, any of the following materials can be used: elements that belong to Group 1 or Group 2 of the periodic table, that is, alkali metals such as lithium (Li) and cesium (Cs) or alkaline earth metals such as calcium (Ca) and strontium (Sr), magnesium (Mg), and alloys containing at least one of the metal (e.g., Mg—Ag and Al—Li); rare earth metals such as europium (Eu) and ytterbium (Yb), and alloys containing at least one of the metal; graphene; and the like. The first electrode 101 and the second electrode 103 can be formed by, for example, a sputtering method, an evaporation method (including a vacuum evaporation method), or the like.

As a substance with a high hole-transport property that is used for the hole-injection layer 111 and the hole-transport layer 112, a π-electron rich heteroaromatic compound (e.g., a carbazole derivative or an indole derivative) or an aromatic amine compound can be used. For example, the following substances can be used: a compound having an aromatic amine skeleton such as 4,4'-bis[N-(1-naphthyl)-N-phenylamino]biphenyl (abbreviation: NPB), N,N-bis(3-methylphenyl)-N,N-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]spiro-9,9'-bifluoren-2-amine (abbreviation: PCBASF); a compound having a carbazole skeleton such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP); a compound having a thiophene skeleton such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV); and a compound having a furan skeleton such as 4,4',4"-(benzene-1,3,5-triyl)tri(dibenzofuran) (abbreviation: DBF3P-II) or 4-{3-[3-(9-phenyl-9H-fluoren-9-yl)phenyl]
phenyl}dibenzofuran (abbreviation: mmDBFFLBi-II).

Among the materials given above, a compound having a carbazole skeleton is preferable because the compound is highly reliable and has a high hole-transport property to contribute to a reduction in driving voltage.

Further, as a material that can be used for the hole-injection layer 111 and the hole-transport layer 112, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine](abbreviation: Poly-TPD) can be used.

As each of the hole-injection layer 111 and the hole-transport layer 112, a layer in which any of the substances having a high hole-transport property given above and a substance having an acceptor property are mixed is preferably used, in which case a favorable carrier-injection property is obtained. Examples of the acceptor substance to be used include oxides of metals belonging to Groups 4 to 8 of the periodic table. Specifically, molybdenum oxide is particularly preferable.

The light-emitting layer 113 preferably contains, for example, an electron-transport material as a host material (a first organic compound), a light-emitting material which converts triplet excitation energy into light as a guest material (a second organic compound), and a hole-transport material as an assist material (a third organic compound). Note that the relation between the host material and the assist material is not limited to the above; an electron-transport material may be used as the assist material and a hole-transport material may be used as the host material.

Here, as the above guest material (the second organic compound), an organic compound is used which has a 1,2,4-triazole skeleton, a phenyl skeleton, an arylene skeleton, and a Group 9 metal or a Group 10 metal and in which nitrogen at the 4-position of the 1,2,4-triazole skeleton coordinates to the Group 9 metal or the Group 10 metal, nitrogen at the 1-position of the 1,2,4-triazole skeleton is bonded to the phenyl skeleton, and the arylene skeleton is bonded to the 3-position of the 1,2,4-triazole skeleton and the Group 9 metal or the Group 10 metal.

In the above structure, the phenyl skeleton is preferably bonded to a methyl skeleton, in which case synthesis yield can be increased.

In the above structure, the metal is preferably iridium, in which case phosphorescence quantum yield can be increased. In addition, when the metal is iridium, the spin-orbit interaction is increased and charge is likely to be transferred to the 1,2,4-triazole skeleton which is a ligand (this transfer is also called triplet metal to ligand charge transfer (triplet MLCT)). As a result, a forbidden transition such as phosphorescence is likely to occur and the triplet excitation lifetime decreases, so that there is an effect of increasing the emission efficiency of the organic compound, which is preferable.

Specifically, the above organic compound can be represented by the general formulae (G1) to (G3) below.

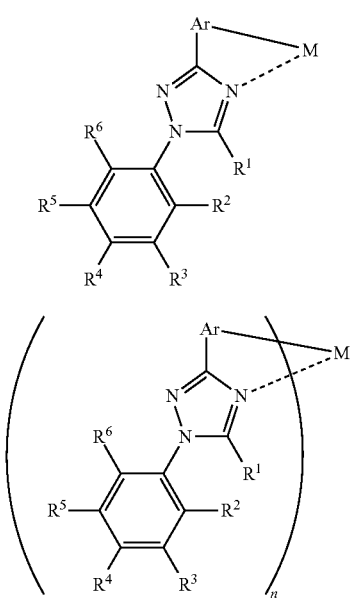

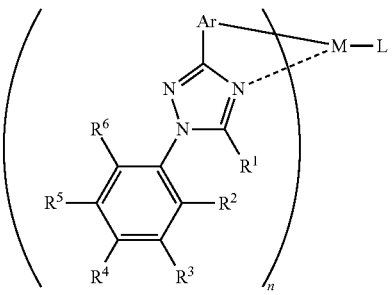

In the general formulae (G1), (G2), and (G3), Ar represents a substituted or unsubstituted arylene group having 6 to 13 carbon atoms. Further, $R^1$ represents hydrogen or an alkyl group having 1 to 4 carbon atoms, and $R^2$ to $R^6$ separately represent any of hydrogen, an alkyl group having 1 to 4 carbon atoms, and a substituted or unsubstituted phenyl group. Further, M represents a Group 9 element or a Group 10 element.

In the general formula (G2), n is 3 when M is a Group 9 element, and n is 2 when M is a Group 10 element.

In the general formula (G3), L represents a monoanionic bidentate ligand. Moreover, n is 2 when M is a Group 9 element, and n is 1 when M is a Group 10 element.

Note that the organic compound having the structure represented by the general formula (G1) can emit phosphorescence and thus can be advantageously applied to a light-emitting layer of a light-emitting element.

In particular, an organic compound which has the structure represented by the general formula (G1) and in which the lowest triplet excited state is formed can efficiently emit phosphorescence, and thus is preferable. In order to obtain such a mode, another skeleton (i.e., a ligand) which is included in the organic compound can be selected such that the lowest triplet excitation energy is equal to or lower than the lowest triplet excitation energy of the ligand, for example. In that case, regardless of what the ligand is, the lowest triplet excited state is formed in the whole molecule at last, so that phosphorescence is thus obtained. Therefore, phosphorescence can be highly efficiently obtained. For example, vinyl polymer having the structure represented by the general formula (G1) as a side chain can be given.

Here, examples of methods of synthesizing an organic compound having the structure represented by the general formula (G1), an organic compound represented by the general formula (G2), and an organic compound represented by the general formula (G3) are described.

<Method of Synthesizing 1H-1,2,4-triazole Derivative Represented by the General Formula (G0)>

First, an example of a method of synthesizing a 1H-1,2,4-triazole derivative represented by the general formula (G0) below is described.

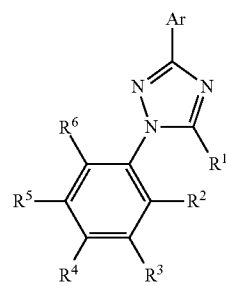

In the general formula (G0), Ar represents a substituted or unsubstituted arylene group having 6 to 13 carbon atoms. In addition, $R^1$ represents hydrogen or an alkyl group having 1 to 4 carbon atoms, and $R^2$ to $R^6$ separately represent any of hydrogen, an alkyl group having 1 to 4 carbon atoms, and a substituted or unsubstituted phenyl group.

As shown in a synthesis scheme (a) below, an acylamidine compound (A1) reacts with a hydrazine compound (A2), so that a 1H-1,2,4-triazole derivative can be obtained. Note that Z in the formula represents a group (a leaving group) that is detached through a ring closure reaction, such as an alkoxy group, an alkylthio group, an amino group, or a cyano group.

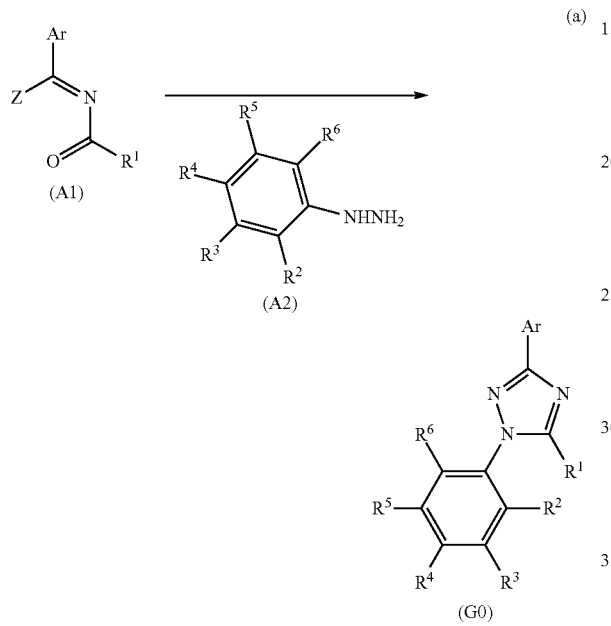

(a)

In the synthesis scheme (a), Ar represents a substituted or unsubstituted arylene group having 6 to 13 carbon atoms. In addition, $R^1$ represents hydrogen or an alkyl group having 1 to 4 carbon atoms, and $R^2$ to $R^6$ separately represent any of hydrogen, an alkyl group having 1 to 4 carbon atoms, and a substituted or unsubstituted phenyl group.

Note that the method of synthesizing a 1H-1,2,4-triazole derivative is not limited to the synthesis scheme (a). For example, there is also a method in which a 1,3,4-oxadiazole derivative and arylamine are heated.

As described above, the 1H-1,2,4-triazole derivative represented by the general formula (G0) can be synthesized by a simple synthesis scheme.

Note that various kinds of the above compounds (A1) and (A2) are commercially available or can be synthesized. For example, the acylamidine compound (A1) can be synthesized by making alkanoyl chloride react with aryl imino ether; in this case, the leaving group Z is an alkoxyl group. In this manner, various types of the 1H-1,2,4-triazole derivative represented by the general formula (G0) can be synthesized. Thus, the organic compound having the structure represented by General Formula (G1) features abundant variations in ligands. By using such an organic compound having wide variations of a ligand in a light-emitting element, fine adjustment of element characteristics required for the light-emitting element can be performed easily.

<Method of Synthesizing Organic Compound Represented by the General Formula (G2)>

The organic compound represented by the general formula (G2) can be synthesized by a synthesis scheme (b) shown below. That is, the 1H-1,2,4-triazole derivative represented by the general formula (G0) is mixed with a metal compound of a Group 9 or Group 10 element which contains a halogen (e.g., rhodium chloride hydrate, palladium chloride, iridium chloride, iridium bromide, iridium iodide, or potassium tetrachloroplatinate) or with an organometallic complex compound of a Group 9 or Group 10 element (e.g., an acetylacetonate complex or a diethylsulfide complex), and then the mixture is heated, so that the organic compound represented by the general formula (G2) can be obtained.

Further, this heating process may be performed in an alcohol-based solvent (e.g., glycerol, ethylene glycol, 2-methoxyethanol, or 2-ethoxyethanol). There is no particular limitation on a heating means, and an oil bath, a sand bath, or an aluminum block may be used. Alternatively, microwaves can be used as a heating means.

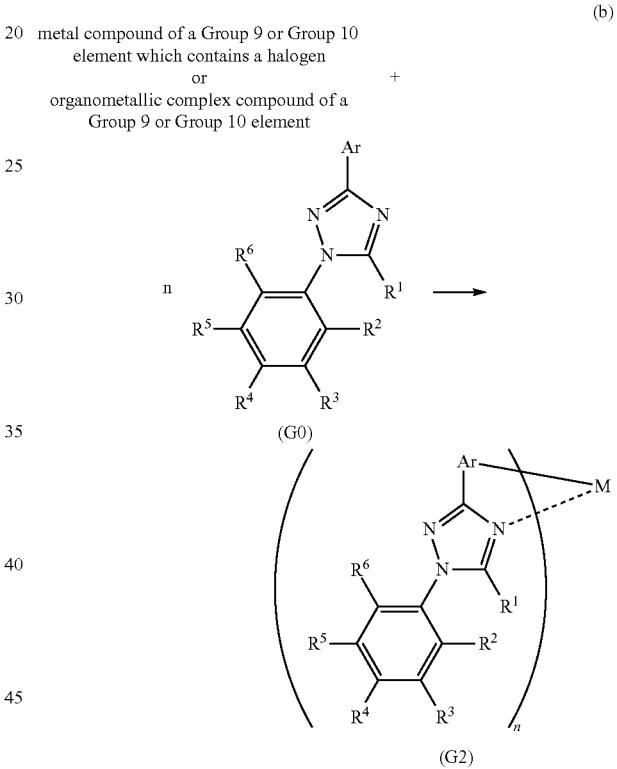

(b)

In the synthesis scheme (b), Ar represents a substituted or unsubstituted arylene group having 6 to 13 carbon atoms. In addition, $R^1$ represents hydrogen or an alkyl group having 1 to 4 carbon atoms, and $R^2$ to $R^6$ separately represent any of hydrogen, an alkyl group having 1 to 4 carbon atoms, and a substituted or unsubstituted phenyl group. In addition, M represents a Group 9 element or a Group 10 element. In addition, n is 3 when M is a Group 9 element, and n is 2 when M is a Group 10 element.

Note that the method of synthesizing the organic compound represented by the general formula (G2) is not limited to the synthesis scheme (b). For example, there is also a method in which a halogen-bridged dinuclear complex (B) illustrated in a synthesis scheme (c) shown below and the 1H-1,2,4-triazole derivative represented by General Formula (G0) are heated. In that case, a silver salt such as silver trifluoroacetate or silver trifluoromethylsulfonate may be added to enhance the reaction.

<Method of Synthesizing Organic Compound Represented by the General Formula (G3)>

The organic compound represented by the general formula (G3) can be synthesized by the synthesis scheme (c) shown below. That is, the 1H-1,2,4-triazole derivative represented by General Formula (G0) and a metal compound of a Group 9 or Group 10 element which contains a halogen (e.g., rhodium chloride hydrate, palladium chloride, iridium chloride, iridium bromide, iridium iodide, or potassium tetrachloroplatinate) are heated in an inert gas atmosphere by using no solvent, an alcohol-based solvent (e.g., glycerol, ethylene glycol, 2-methoxyethanol, or 2-ethoxyethanol) alone, or a mixed solvent of water and one or more of the alcohol-based solvents, whereby the dinuclear complex (B), which is one type of an organometallic complex including a halogen-bridged structure and is a novel substance, can be obtained. There is no particular limitation on a heating means, and an oil bath, a sand bath, or an aluminum block may be used. Alternatively, microwaves can be used as a heating means.

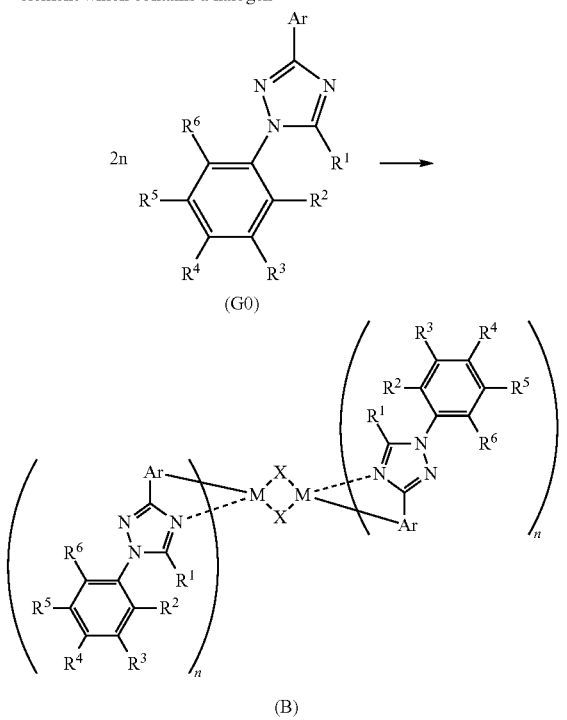

In the synthetic scheme (c), X represents a halogen, and Ar represents a substituted or unsubstituted arylene group having 6 to 13 carbon atoms. In addition, $R^1$ represents hydrogen or an alkyl group having 1 to 4 carbon atoms, and $R^2$ to $R^6$ separately represent any of hydrogen, an alkyl group having 1 to 4 carbon atoms, and a substituted or unsubstituted phenyl group. In addition, M represents a Group 9 element or a Group 10 element. In addition, n is 2 when M is a Group 9 element, and n is 1 when M is a Group 10 element.

Furthermore, as shown in a synthesis scheme (d) shown below, the dinuclear complex (B) obtained in the synthesis scheme (c) above is reacted with HL which is a material of a monoanionic ligand in an inert gas atmosphere, whereby a proton of HL is separated and L coordinates to M. Thus, the organic compound represented by the general formula (G3) can be obtained. There is no particular limitation on a heating means, and an oil bath, a sand bath, or an aluminum block may be used. Alternatively, microwaves can be used as a heating means.

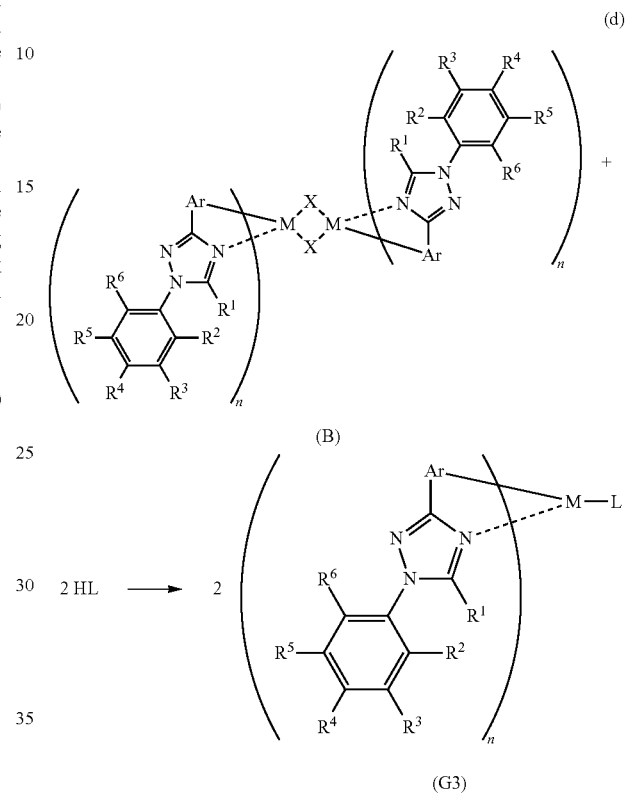

In the synthesis scheme (d), L represents a monoanionic bidentate ligand, X represents a halogen, and Ar represents a substituted or unsubstituted arylene group having 6 to 13 carbon atoms. In addition, $R^1$ represents hydrogen or an alkyl group having 1 to 4 carbon atoms, and $R^2$ to $R^6$ separately represent any of hydrogen, an alkyl group having 1 to 4 carbon atoms, and a substituted or unsubstituted phenyl group. In addition, M represents a Group 9 element or a Group 10 element. In addition, n is 2 when M is a Group 9 element, and n is 1 when M is a Group 10 element.

Note that examples of a monoanionic bidentate ligand include a monoanionic bidentate chelate ligand having a β-diketone structure, a monoanionic bidentate chelate ligand having a carboxyl group, a monoanionic bidentate chelate ligand having a phenolic hydroxyl group, and a monoanionic bidentate chelate ligand in which two ligand elements are both nitrogen; specifically, ligands represented by structural formulae (L1) to (L6) shown below can be given.

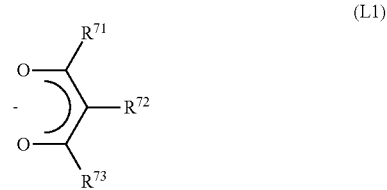

-continued

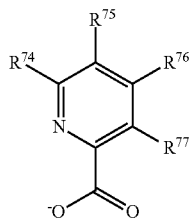 (L2)

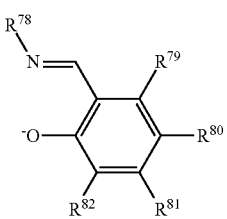 (L3)

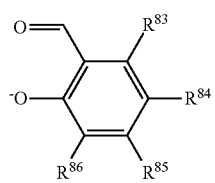 (L4)

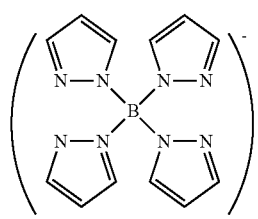 (L5)

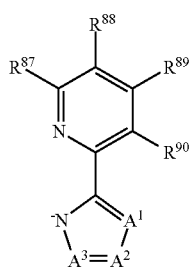 (L6)

In the structural formulae (L1) to (L6), $R^{71}$ to $R^{90}$ separately represent any of hydrogen, an alkyl group having 1 to 4 carbon atoms, a halogen group, a haloalkyl group, an alkoxy group having 1 to 4 carbon atoms, and an alkylthio group having 1 to 4 carbon atoms. In addition, $A^1$, $A^2$, and $A^3$ separately represent nitrogen N or carbon C—R; R represents any of hydrogen, an alkyl group having 1 to 4 carbon atoms, a halogen group, a haloalkyl group having 1 to 4 carbon atoms, or a phenyl group.

Although the examples of the synthesis methods are described above, the organic compound contained in the light-emitting element of one embodiment of the present invention may be synthesized by any other synthesis method.

As specific examples of organic compounds having the structures represented by the general formulae (G1) to (G3), organic compounds represented by structural formulae (100) to (135) can be given. However, the organic compound contained in the light-emitting element of one embodiment of the present invention is not limited thereto.

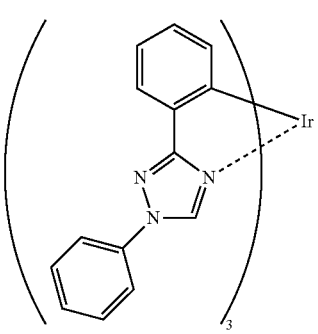 (100)

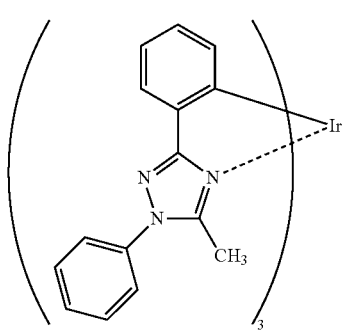 (101)

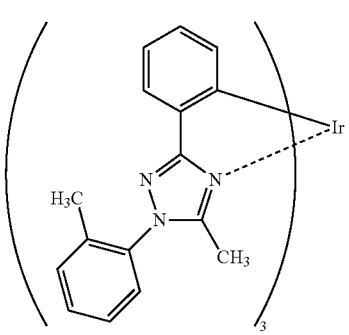 (102)

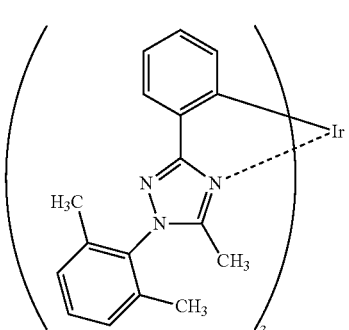 (103)

(104) 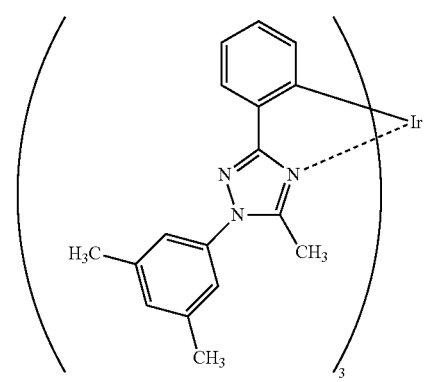
(105) 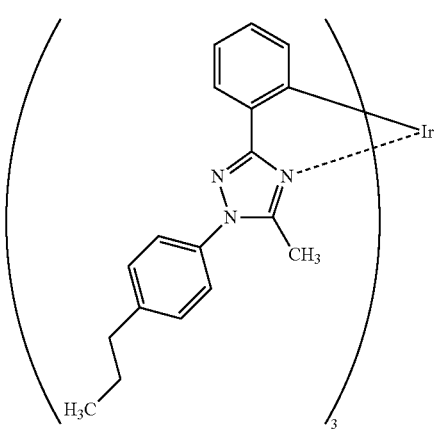
(106) 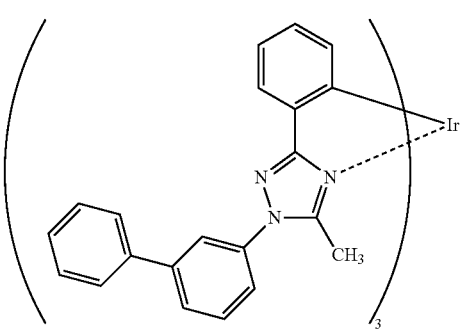
(107) 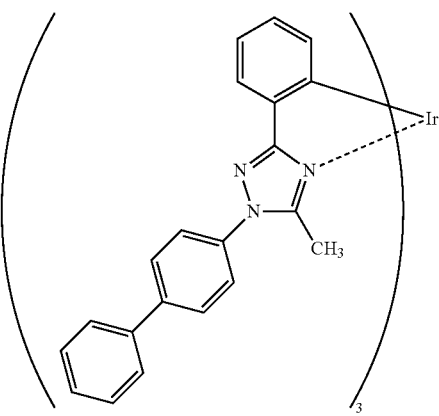
(108) 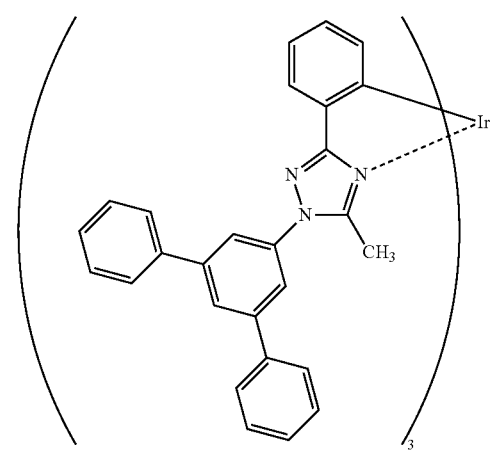
(109) 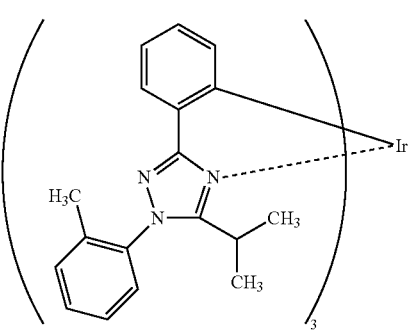
(110) 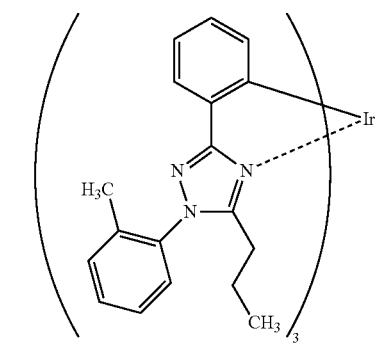
(111) 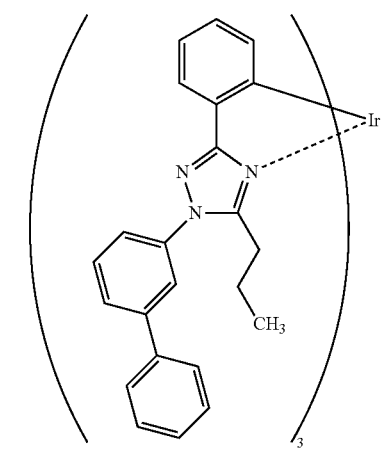

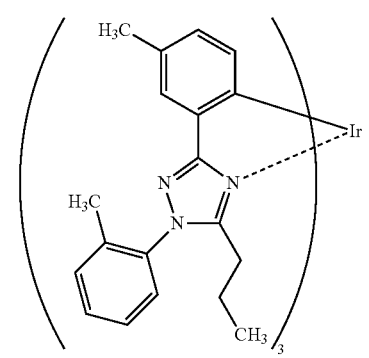
(112)
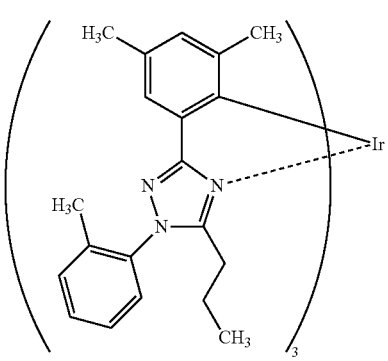
(113)
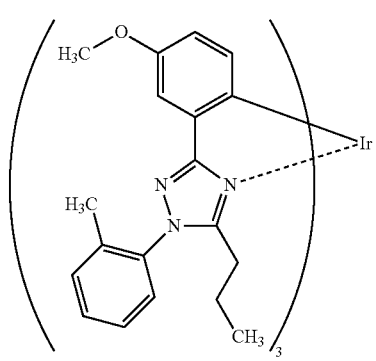
(114)
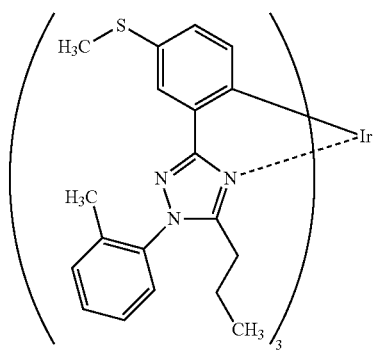
(115)
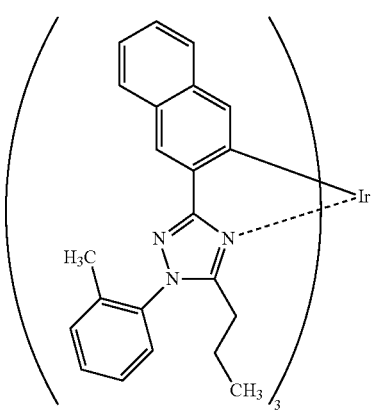
(116)
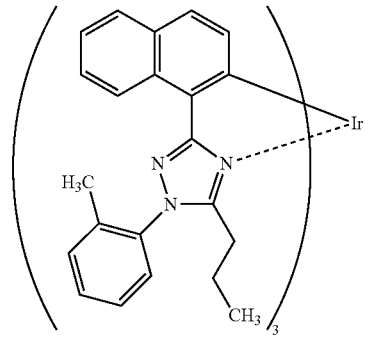
(117)
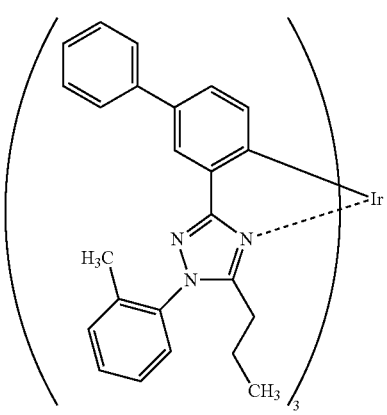
(118)
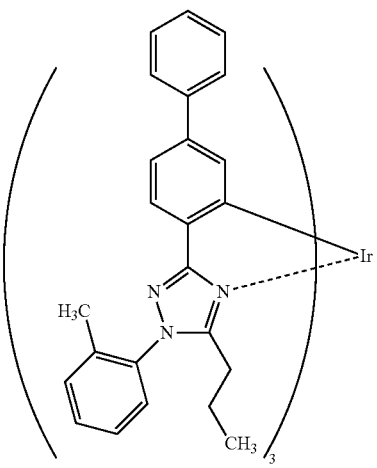
(119)

(120)
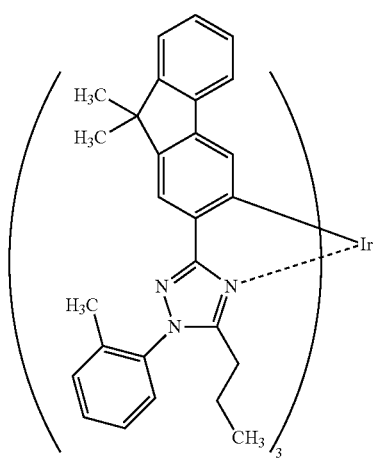
(121)
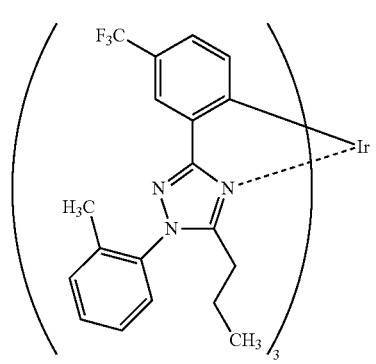
(122)
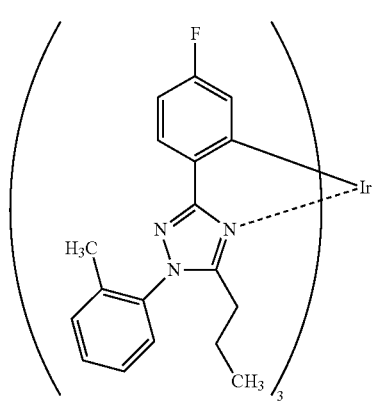
(123)
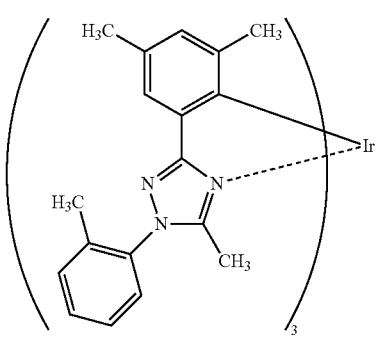
(124)
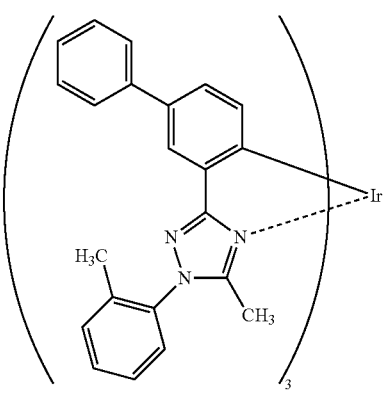
(125)
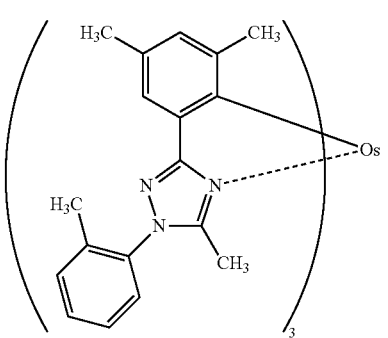
(126)
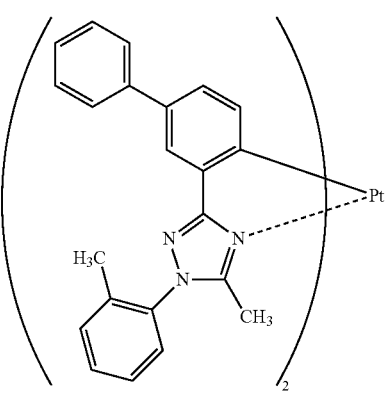
(127)
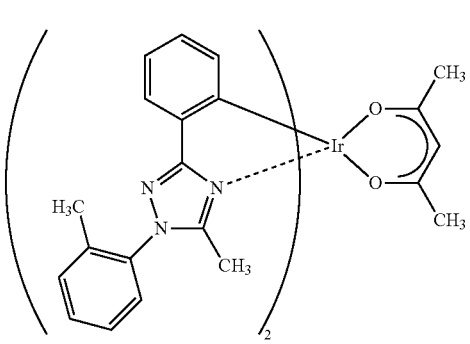

(128)

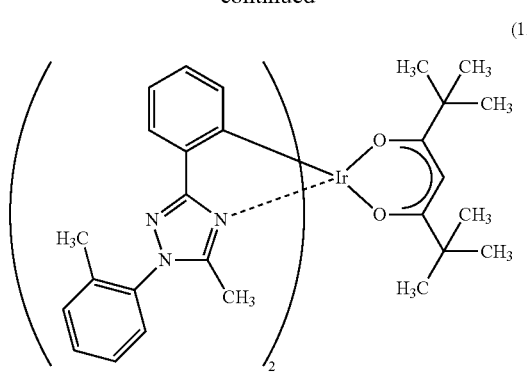

(129)

(130)

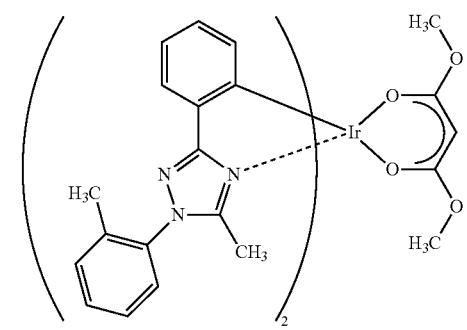

(131)

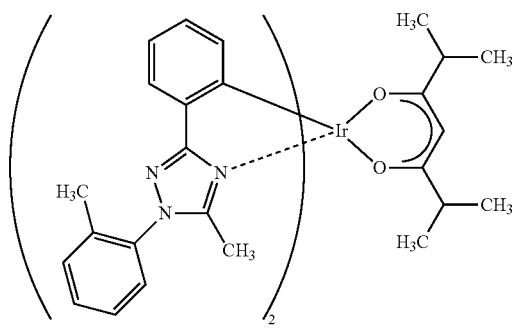

(132)

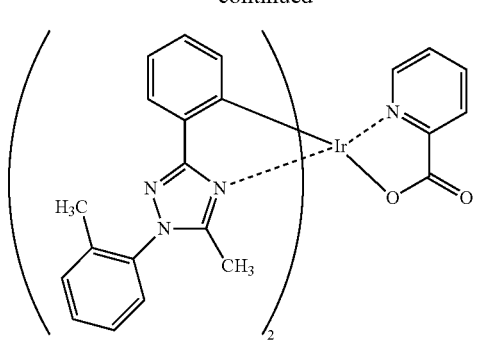

(133)

(134)

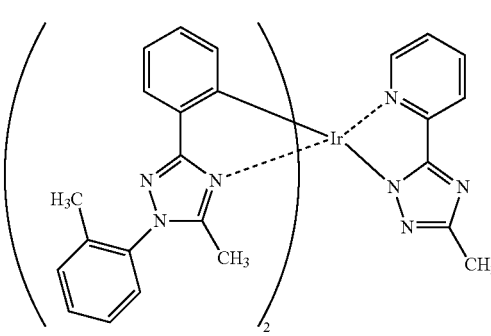

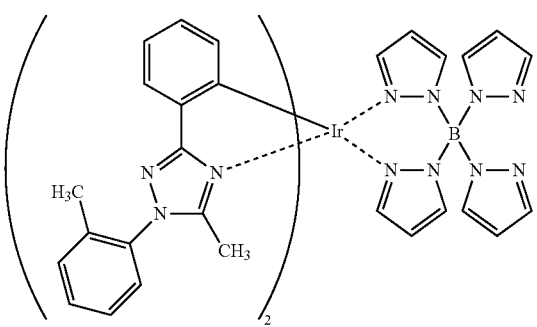

(135)

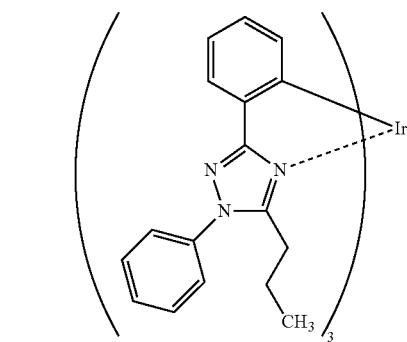

The organic compounds represented by the above structural formulae (100) to (135) have, depending on the type of the ligand, stereoisomers which are also included in the organic compound of the light-emitting element of one embodiment of the present invention.

As the hole-transport material used for the light-emitting layer 113, i.e., the assist material (the third organic compound), a substance with a high hole-transport property which can be used for the hole-injection layer 111 and the hole-transport layer 112 may be used.

Specifically, a compound having a carbazole skeleton is preferable as the assist material (the third organic compound) contained in the light-emitting layer 113 owing to its high reliability, high hole-transport property, and contribution to a reduction in driving voltage.

It is preferable that each of the host material (the first organic compound) and the assist material (the third organic compound) do not have its absorption spectrum in the blue wavelength range. Specifically, an absorption edge of the absorption spectrum is preferably at 440 nm or less.

The electron-transport layer 114 is a layer containing a substance with a high electron-transport property. For the electron-transport layer 114, in addition to the electron-transport materials given above, a metal complex such as tris(8-quinolinolato)aluminum (abbreviation: Alq$_3$), tris(4-methyl-8-quinolinolato)aluminum (abbreviation: Almq$_3$), bis(10-hydroxybenzo[h]quinolinato)beryllium (abbreviation: BeBq$_2$), BAlq, Zn(BOX)$_2$, or bis[2-(2-hydroxyphenyl) benzothiazolato]zinc (abbreviation: Zn(BTZ)$_2$) can be used. Further, a heteroaromatic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl] benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), or 4,4'-bis(5-methylbenzoxazol-2-yl)stilbene (abbreviation: BzOs) can also be used. A high molecular compound such as poly(2,5-pyridinediyl) (abbreviation: PPy), poly[(9,9-dihexylfluorene-2,7-diyl)-co-(pyridine-3,5-diyl)](abbreviation: PF-Py) or poly[(9,9-dioctylfluorene-2,7-diyl)-co-(2,2'-bipyridine-6,6'-diyl)](abbreviation: PF-BPy) can also be used. The substances given here are mainly ones having an electron mobility of $10^{-6}$ cm$^2$/Vs or higher. Note that any substance other than the above substances may be used for the electron-transport layer 114 as long as the electron-transport property is higher than the hole-transport property.

The electron-transport layer 114 is not limited to a single layer, but may be a stack of two or more layers containing any of the above substances.

The electron-injection layer 115 is a layer containing a substance with a high electron-injection property. For the electron-injection layer 115, a compound of an alkali metal or an alkaline earth metal, such as lithium fluoride (LiF), cesium fluoride (CsF), calcium fluoride (CaF$_2$), or lithium oxide (LiO$_x$), can be used. A rare earth metal compound like erbium fluoride (ErF$_3$) can also be used. Any of the above substances for forming the electron-transport layer 114 can also be used.

A composite material in which an organic compound and an electron donor (donor) are mixed may also be used for the electron-injection layer 115. Such a composite material is excellent in an electron-injection property and an electron-transport property because electrons are generated in the organic compound by the electron donor. In this case, the organic compound is preferably a material excellent in transporting the generated electrons. Specifically, for example, the above materials for forming the electron-transport layer 114 (e.g., a metal complex or a heteroaromatic compound) can be used. As the electron donor, a substance exhibiting an electron-donating property with respect to the organic compound may be used. Specifically, an alkali metal, an alkaline earth metal, and a rare earth metal are preferable, and lithium, cesium, magnesium, calcium, erbium, ytterbium, and the like are given. Further, an alkali metal oxide or an alkaline earth metal oxide is preferable, and for example, lithium oxide, calcium oxide, barium oxide, and the like can be given. A Lewis base such as magnesium oxide can also be used. An organic compound such as tetrathiafulvalene (abbreviation: TTF) can also be used.

Note that each of the above hole-injection layer 111, hole-transport layer 112, light-emitting layer 113, electron-transport layer 114, and electron-injection layer 115, can be formed by a method such as an evaporation method (e.g., a vacuum evaporation method), an inkjet method, or a coating method.

In the above light-emitting element, current flows due to a potential difference between the first electrode 101 and the second electrode 103 and holes and electrons recombine in the EL layer 102, whereby light is emitted. Then, the emitted light is extracted to the outside through one or both of the first electrode 101 and the second electrode 103. Therefore, one or both of the first electrode 101 and the second electrode 103 are electrodes having light-transmitting properties.

Figure 1B:
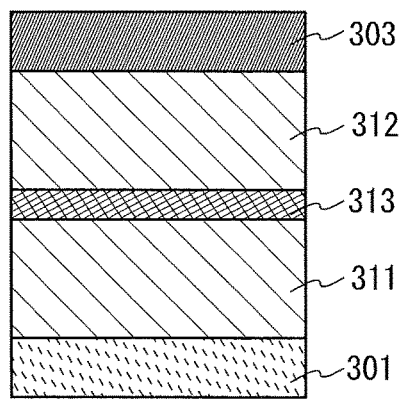
Figure 1C:
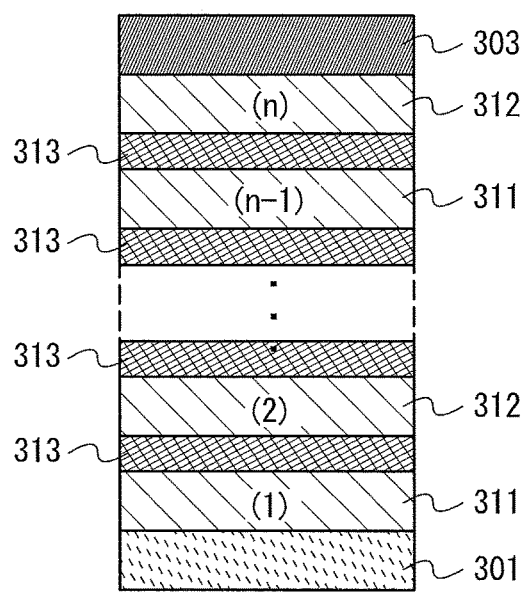

Next, the light-emitting elements illustrated in FIGS. 1B and 1C are described.

The light-emitting element illustrated in FIG. 1B is a tandem light-emitting element including a plurality of light-emitting layers (a first light-emitting layer 311 and a second light-emitting layer 312) between a first electrode 301 and a second electrode 303.

The first electrode 301 functions as an anode, and the second electrode 303 functions as a cathode. Note that the first electrode 301 and the second electrode 303 can have structures similar to those of the first electrode 101 and the second electrode 103.

In addition, the plurality of light-emitting layers (the first light-emitting layer 311 and the second light-emitting layer 312) can have a structure similar to that of the light-emitting layer 113. Note that the structures of the first light-emitting layer 311 and the second light-emitting layer 312 may be the same or different from each other as long as at least one of the first light-emitting layer 311 and the second light-emitting layer 312 has a structure similar to that of the light-emitting layer 113. Further, in addition to the first light-emitting layer 311 and the second light-emitting layer 312, the hole-injection layer 111, the hole-transport layer 112, the electron-transport layer 114, and the electron-injection layer 115 which are described above may be provided as appropriate.

A charge generation layer 313 is provided between the plurality of light-emitting layers (the first light-emitting layer 311 and the second light-emitting layer 312). The charge generation layer 313 has a function of injecting electrons into one of the light-emitting layers and a function of injecting holes into the other of the light-emitting layers when voltage is applied between the first electrode 301 and the second electrode 303. In this embodiment, when voltage is applied such that the potential of the first electrode 301 is higher than that of the second electrode 303, the charge generation layer 313 injects electrons into the first light-emitting layer 311 and injects holes into the second light-emitting layer 312.

Note that in terms of light extraction efficiency, the charge generation layer 313 preferably has a property of transmitting visible light (specifically, the charge generation layer 313 has a visible light transmittance of 40% or higher). Further, the charge generation layer 313 functions even when it has lower conductivity than the first electrode 301 or the second electrode 303.

The charge generation layer 313 may have either a structure in which an electron acceptor (acceptor) is added to an organic compound having a high hole-transport property or a structure in which an electron donor (donor) is added to an organic compound having a high electron-transport property. Alternatively, both of these structures may be stacked.

In the case of the structure in which an electron acceptor is added to an organic compound having a high hole-transport property, as the organic compound having a high hole-transport property, for example, an aromatic amine compound such as NPB, TPD, TDATA, MTDATA, or 4,4'-bis[N-(spiro-9,9'-bifluoren-2-yl)-N-phenylamino]biphenyl (abbreviation: BSPB), or the like can be used. The substances given here are mainly ones having a hole mobility of $10^{-6}$ cm$^2$/Vs or higher. However, any substance other than the above substances may be used as long as the hole-transport property is higher than the electron-transport property.

Further, as the electron acceptor, 7,7,8,8-tetracyano-2,3,5,6-tetrafluoroquinodimethane (abbreviation: F$_4$-TCNQ), chloranil, and the like can be given. A transition metal oxide can also be given. In addition, oxides of metals belonging to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable owing to their high electron-accepting properties. Among these, molybdenum oxide is especially preferable since it is stable in the air, has a low hygroscopic property, and is easy to handle.

In the case of the structure in which an electron donor is added to an organic compound having a high electron-transport property, as the organic compound having a high electron-transport property, for example, a metal complex having a quinoline skeleton or a benzoquinoline skeleton, such as Alq, Almq$_3$, BeBq$_2$, or BAlq, or the like can be used. A metal complex having an oxazole-based ligand or a thiazole-based ligand, such as Zn(BOX)$_2$ or Zn(BTZ)$_2$, or the like can also be used. Other than metal complexes, PBD, OXD-7, TAZ, BPhen, BCP, or the like can be used. The substances given here are mainly ones having an electron mobility of $10^{-6}$ cm$^2$/Vs or higher. Note that substances other than the above substances may be used as long as the electron-transport property is higher than the hole-transport property.

Further, as the electron donor, an alkali metal, an alkaline earth metal, a rare earth metal, a metal belonging to Group 13 of the periodic table, or an oxide or carbonate thereof can be used. Specifically, lithium (Li), cesium (Cs), magnesium (Mg), calcium (Ca), ytterbium (Yb), indium (In), lithium oxide, cesium carbonate, or the like is preferably used. An organic compound such as tetrathianaphthacene may be also used as the electron donor.

Note that forming the charge-generation layer 313 by using any of the above materials can suppress an increase in drive voltage caused by the stack of the light-emitting layers.

Although the light-emitting element having two light-emitting layers is illustrated in FIG. 1B, the present invention can be similarly applied to a light-emitting element in which n light-emitting layers (n is three or more) are stacked as illustrated in FIG. 1C. In the case where a plurality of light-emitting layers are provided between a pair of electrodes as in the light-emitting element of this embodiment, by providing the charge-generation layer 313 between the light-emitting layers, the light-emitting element can emit light in a high luminance region while the current density is kept low. Since the current density can be kept low, the element can have a long lifetime. In the case of a light-emitting device having a large emission area, voltage drop due to resistance of an electrode material can be reduced, thereby achieving homogeneous light emission in a large area.

By making emission colors of the light-emitting layers different, light of a desired color can be obtained from the light-emitting element as a whole. For example, the emission colors of first and second light-emitting layers are complementary in a light-emitting element having the two light-emitting layers, whereby the light-emitting element can be made to emit white light as a whole. Note that the term "complementary" means color relationship in which an achromatic color is obtained when colors are mixed. In other words, emission of white light can be obtained by mixture of light emitted from substances whose emission colors are complementary colors.

Further, the same applies to a light-emitting element having three light-emitting layers. For example, the light-emitting element as a whole can emit white light when the emission color of the first light-emitting layer is red, the emission color of the second light-emitting layer is green, and the emission color of the third light-emitting layer is blue.

As described above, in the light-emitting element including the light-emitting layer interposed between the pair of electrodes, which is described in this embodiment, the organic compound is contained in the light-emitting layer. The organic compound has a 1,2,4-triazole skeleton, a phenyl skeleton, an arylene skeleton, and a Group 9 metal or a Group 10 metal. Nitrogen at the 4-position of the 1,2,4-triazole skeleton coordinates to the Group 9 metal or the Group 10 metal, nitrogen at the 1-position of the 1,2,4-triazole skeleton is bonded to the phenyl skeleton, and the arylene skeleton is bonded to the 3-position of the 1,2,4-triazole skeleton and the Group 9 metal or the Group 10 metal.

By application of voltage to the above light-emitting element containing the organic compound between the pair of electrodes can emit blue phosphorescence with extremely high color purity and with high efficiency.

Note that the structure described in this embodiment can be used in combination with any of the structures described in the other embodiments, as appropriate.

Embodiment 2

In this embodiment, a light-emitting element in which organic compounds which form an excited complex (also referred to as an exciplex) are used for a light-emitting layer is described with reference to FIGS. 2A and 2B.

Figure 2A:
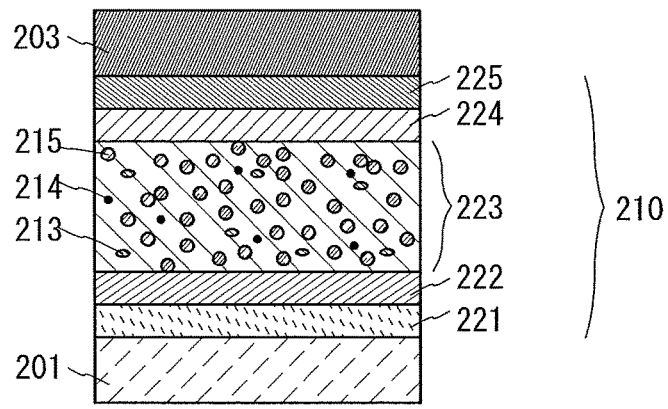
FIGS. 2A and 2B illustrate a light-emitting element of one embodiment of the present invention.
Figure 2B:
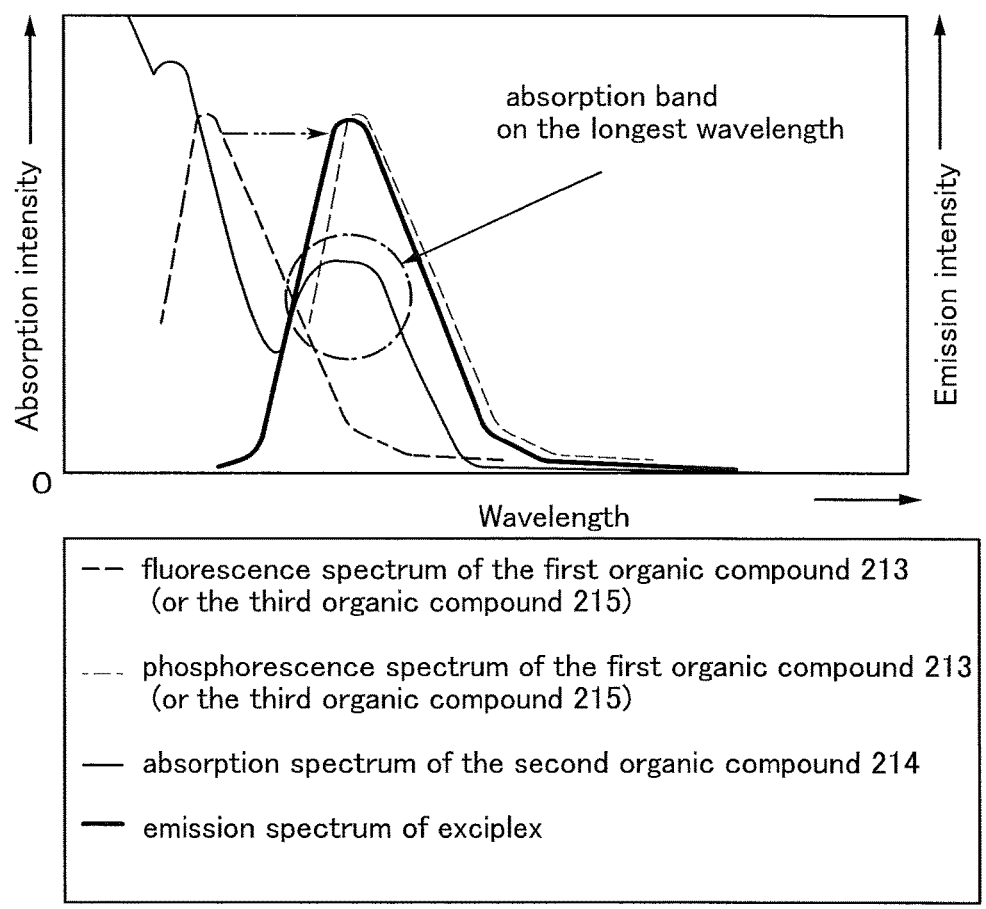

A light-emitting element described in this embodiment includes an EL layer 210 between a first electrode 201 and a second electrode 203 as illustrated in FIG. 2A. Note that the EL layer 210 includes at least a light-emitting layer 223 and may further include a hole-injection layer 221, a hole-transport layer 222, an electron-transport layer 224, an electron-injection layer 225, and the like. The materials in Embodiment 1 which can be used for the hole-injection layer 111, the hole-transport layer 112, the electron-transport layer 114, and the electron-injection layer 115 can be respectively used for the hole-injection layer 221, the hole-transport layer 222, the electron-transport layer 224, and the electron-injection layer 225. Further, in this embodiment, the first electrode 201 is used as an anode and the second electrode 203 is used as a cathode.

The light-emitting layer 223 includes a first organic compound 213, a second organic compound 214, and a third organic compound 215. In this embodiment, the first organic compound 213, the second organic compound 214, and the third organic compound 215 are used as a host material, a guest material, and an assist material, respectively.

When the light-emitting layer 223 has the structure in which the guest material is dispersed in the host material, the crystallization of the light-emitting layer can be suppressed. Further, it is possible to inhibit concentration quenching due to high concentration of the guest material; thus, the light-emitting element can have higher emission efficiency.

Note that it is preferable that the triplet excited energy level ($T_1$ level) of each of the first organic compound 213 (the host material) and the third organic compound 215 (the assist material) be higher than that of the second organic compound 214 (the guest material). The reason is as follows: when the $T_1$ level of the first organic compound 213 (or the third organic compound 215) is lower than that of the second organic compound 214, the triplet excitation energy of the second organic compound 214, which contributes to light emission, is quenched by the first organic compound 213 (or the third organic compound 215) and the emission efficiency decreases accordingly.

Here, for improvement in efficiency of energy transfer from a host material to a guest material, Förster mechanism (dipole-dipole interaction) and Dexter mechanism (electron exchange interaction), which are known as mechanisms of energy transfer between molecules, are considered. According to the mechanisms, it is preferable that an emission spectrum of a host material (fluorescence spectrum in energy transfer from a singlet excited state, phosphorescence spectrum in energy transfer from a triplet excited state) largely overlap with an absorption spectrum of a guest material (specifically, spectrum in an absorption band on the longest wavelength (lowest energy) side). However, in the case of a general phosphorescent guest material, it is difficult to obtain an overlap between a fluorescence spectrum of a host material and an absorption spectrum in an absorption band on the longest wavelength (lowest energy) side of a guest material. The reason for this is as follows: if the fluorescence spectrum of the host material overlaps with the absorption spectrum in the absorption band on the longest wavelength (lowest energy) side of the guest material, since a phosphorescence spectrum of the host material is located on a longer wavelength (lower energy) side as compared to the fluorescence spectrum, the $T_1$ level of the host material becomes lower than the $T_1$ level of the phosphorescent compound and the above-described problem of quenching occurs; yet, when the host material is designed in such a manner that the $T_1$ level of the host material is higher than the $T_1$ level of the phosphorescent compound to avoid the problem of quenching, the fluorescence spectrum of the host material is shifted to the shorter wavelength (higher energy) side, and thus the fluorescence spectrum does not have any overlap with the absorption spectrum in the absorption band on the longest wavelength (lowest energy) side of the guest material. For that reason, in general, it is difficult to obtain an overlap between a fluorescence spectrum of a host material and an absorption spectrum in an absorption band on the longest wavelength (lowest energy) side of a guest material so as to maximize energy transfer from a singlet excited state of a host material.

Thus, in this embodiment, a combination of the first organic compound 213 and the third organic compound 215 preferably forms an exciplex. In such a combination, in the light-emitting layer 223, a fluorescence spectrum of the first organic compound 213 and that of the third organic compound 215 are not observed and an emission spectrum of the exciplex which is located on the longer wavelength side can be obtained. Moreover, when the first organic compound 213 and the third organic compound 215 are selected in such a manner that the emission spectrum of the exciplex largely overlaps with the absorption spectrum of the guest material (the second organic compound 214), energy transfer from a singlet excited state can be maximized (see FIG. 2B).

It is assumed that energy transfer from the exciplex, not the excited state of only the host material, occurs also in the case of a triplet excited state.

Any of the electron-transport materials given in Embodiment 1 is preferably used as the first organic compound 213. As the second organic compound 214, an organic compound is used which has a 1,2,4-triazole skeleton, a phenyl skeleton, an arylene skeleton, and a Group 9 metal or a Group 10 metal and in which nitrogen at the 4-position of the 1,2,4-triazole skeleton coordinates to the Group 9 metal or the Group 10 metal, nitrogen at the 1-position of the 1,2,4-triazole skeleton is bonded to the phenyl skeleton, and the arylene skeleton is bonded to the 3-position of the 1,2,4-triazole skeleton and the Group 9 metal or the Group 10 metal. Any of the hole-transport materials given in Embodiment 1 is preferably used as the third organic compound 215.

The above-described combination of the first organic compound 213 and the third organic compound 215 is an example of the combination which enables an exciplex to be formed. The combination is determined so that the emission spectrum of the exciplex overlaps with the absorption spectrum of the second organic compound 214 and that the peak of the emission spectrum of the exciplex has a longer wavelength than the peak of the absorption spectrum of the second organic compound 214.

Note that since the electron-transport material and the hole-transport material are used as the first organic compound 213 and the third organic compound 215, respectively, adjusting the mixture ratio thereof can control the carrier balance. Specifically, the ratio of the first organic compound to the third organic compound is preferably in the range of 1:9 to 9:1.

In the light-emitting element described in this embodiment, energy transfer efficiency can be improved owing to energy transfer utilizing an overlap between an emission spectrum of an exciplex and an absorption spectrum of a phosphorescent compound. Thus, high external quantum efficiency of the light-emitting element can be achieved.

Note that the structure described in this embodiment can be used in combination with any of the structures described in the other embodiments, as appropriate.

Embodiment 3

In this embodiment, a light-emitting device which includes the light-emitting element of one embodiment of the present invention is described with reference to FIGS. 3A and 3B. Note that FIG. 3A is a top view illustrating a light-emitting device, and FIG. 3B is a cross-sectional view taken along lines A-B and C-D in FIG. 3A.

The light-emitting device of this embodiment includes a source side driver circuit 401 and a gate side driver circuit 403 which are driver circuit portions, a pixel portion 402, a sealing substrate 404, a sealant 405, a flexible printed circuit (FPC) 409, and an element substrate 410. A portion enclosed by the sealant 405 is a space.

Note that a lead wiring 408 is a wiring for transmitting signals that are to be input to the source driver circuit 401 and the gate driver circuit 403, and receives a video signal, a clock signal, a start signal, a reset signal, and the like from an FPC 409 which serves as an external input terminal. Although only the FPC is illustrated here, a printed wiring board (PWB) may be attached to the FPC. The light-emitting device in this specification includes, in its category, not only the light-emitting device itself but also the light-emitting device provided with the FPC or the PWB.

The driver circuit portion and the pixel portion are formed over the element substrate 410 illustrated in FIG. 3A. In FIG. 3B, the source side driver circuit 401 which is the driver circuit portion and one pixel in the pixel portion 402 are illustrated.

Note that as the source side driver circuit 401, a CMOS circuit in which an n-channel TFT 423 and a p-channel TFT 424 are combined is formed. The driver circuit may be any of a variety of circuits formed with TFTs, such as a CMOS circuit, a PMOS circuit, or an NMOS circuit. Although a driver-integrated type in which a driver circuit is formed over a substrate is described in this embodiment, one embodiment of the present invention is not limited to this type, and the driver circuit can be formed outside the substrate.

The pixel portion 402 includes a plurality of pixels having a switching TFT 411, a current control TFT 412, and a first electrode 413 electrically connected to a drain of the current control TFT 412. An insulator 414 is formed to cover an end portion of the first electrode 413. Here, the insulator 414 is formed using a positive type photosensitive acrylic resin film.

In order to improve the coverage, the insulator 414 is provided such that either an upper end portion or a lower end portion of the insulator 414 has a curved surface with a curvature. For example, in the case of using a positive photosensitive acrylic resin as a material for the insulator 414, it is preferable that the insulator 414 be formed so as to have a curved surface with radius of curvature (0.2 µm to 3 µm) only at the upper end portion thereof.

An EL layer 416 and a second electrode 417 are formed over the first electrode 413. The first electrode 413, the EL layer 416, and the second electrode 417 can be formed using any of the materials given in Embodiment 1.

The sealing substrate 404 is attached to the element substrate 410 with the sealant 405; thus, a light-emitting element 418 is provided in the space 407 enclosed by the element substrate 410, the sealing substrate 404, and the sealant 405. The space 407 is filled with a filler and may be filled with an inert gas (such as nitrogen or argon) or the sealing material.

Note that as the sealant 405, an epoxy-based resin is preferably used. It is preferable that such a material do not transmit moisture or oxygen as much as possible. As a material for the sealing substrate 404, a glass substrate, a quartz substrate, or a plastic substrate including fiber-reinforced plastics (FRP), polyvinyl fluoride (PVF), polyester, acrylic, or the like can be used.

As described above, the active matrix light-emitting device having the light-emitting element of one embodiment of the present invention can be obtained.

Figure 4A:
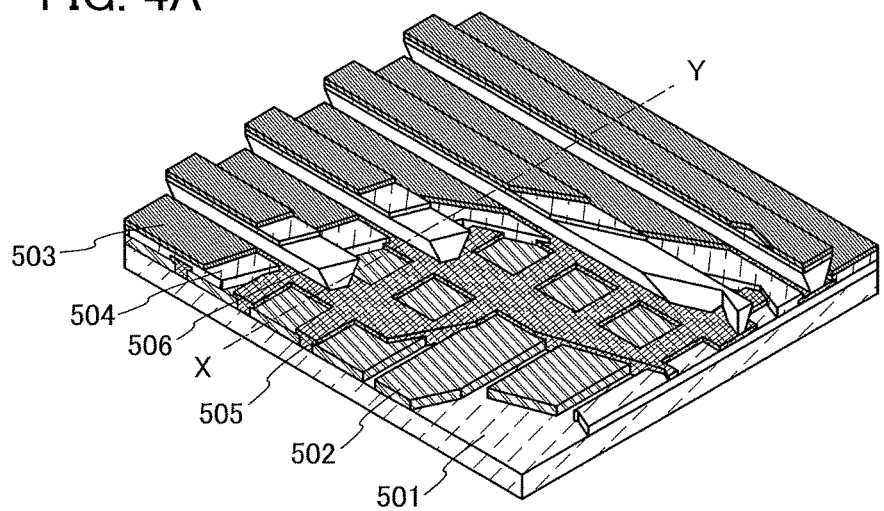
FIGS. 4A and 4B illustrate a light-emitting device of one embodiment of the present invention.
Figure 4B:
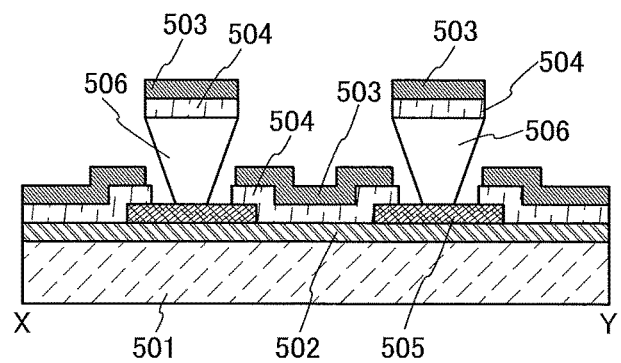

Further, a light-emitting element of one embodiment of the present invention can be used for a passive matrix light-emitting device as well as the above active matrix light-emitting device. FIGS. 4A and 4B illustrate a perspective view and a cross-sectional view of a passive matrix light-emitting device using a light-emitting element of one embodiment of the present invention. FIG. 4A is a perspective view of the light-emitting device, and FIG. 4B is a cross-sectional view taken along line X-Y in FIG. 4A.

In FIGS. 4A and 4B, an EL layer 504 is provided between a first electrode 502 and a second electrode 503 over a substrate 501. An end portion of the first electrode 502 is covered with an insulating layer 505. In addition, a partition layer 506 is provided over the insulating layer 505. The sidewalls of the partition layer 506 slope so that the distance between one sidewall and the other sidewall gradually decreases toward the surface of the substrate. In other words, a cross section taken along the direction of the short side of the partition layer 506 is trapezoidal, and the lower side (a side in contact with the insulating layer 505) is shorter than the upper side (a side not in contact with the insulating layer 505). With the partition layer 506 provided in such a way, a defect of a light-emitting element due to crosstalk or the like can be prevented.

Thus, the light-emitting device which includes the light-emitting element of one embodiment of the present invention can be obtained.

Note that the light-emitting devices described in this embodiment are both manufactured using the light-emitting element of one embodiment of the present invention, and thus can have low driving voltage, high current efficiency, or a long lifetime.

Note that this embodiment can be combined with any of the other embodiments as appropriate.

Embodiment 4

In this embodiment, with reference to FIGS. 5A to 5E and FIGS. 6A and 6B, examples of a variety of electronic devices and lighting devices that are each completed with the use of the light-emitting device of one embodiment of the present invention is described.

Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large game machine such as a pachinko machine, and the like.

An electronic device or a lighting device that has a light-emitting portion with a curved surface can be obtained with the use of the light-emitting element of one embodiment of the present invention, which is manufactured over a substrate having flexibility.

In addition, an electronic device or a lighting device that has a see-through light-emitting portion can be obtained with the use of the light-emitting element of one embodiment of the present invention, in which a pair of electrodes are formed using a material having a property of transmitting visible light.

Further, a light-emitting device to which one embodiment of the present invention is applied can also be applied to lighting for motor vehicles, examples of which are lighting for a dashboard, a windshield, a ceiling, and the like.

Figure 5A:
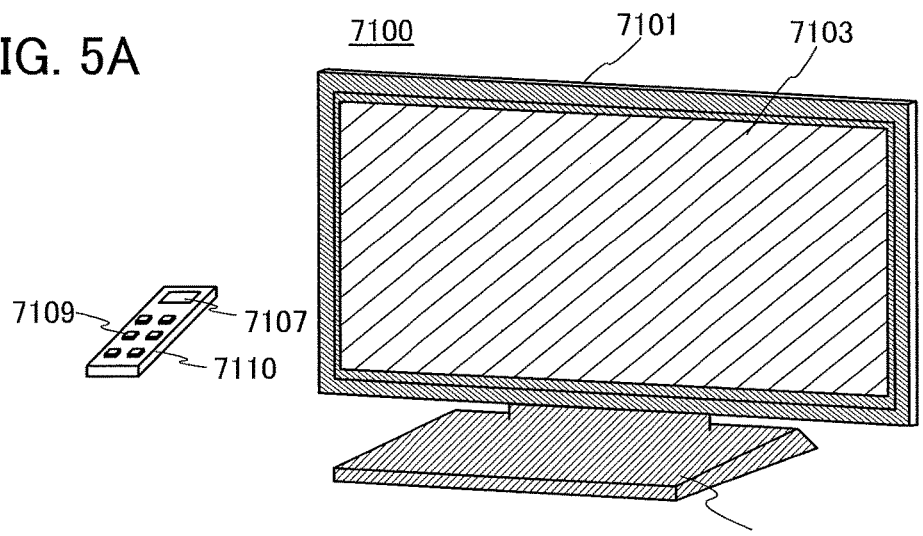
FIGS. 5A to 5E each illustrate an electronic device of one embodiment of the present invention.

FIG. 5A illustrates an example of a television device. In the television device 7100, a display portion 7103 is incorporated in a housing 7101. Images can be displayed by the display portion 7103, and the light-emitting device can be used for the display portion 7103. In addition, here, the housing 7101 is supported by a stand 7105.

The television device 7100 can be operated by an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the receiver, a general television broadcast can be received. Furthermore, when the television device 7100 is connected to a communication network by wired or wireless connection via the modem, one-way (from a transmitter to a receiver) or two-way (between a transmitter and a receiver, between receivers, or the like) data communication can be performed.

Figure 5B:
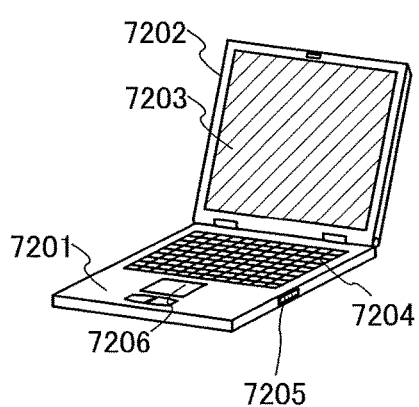

FIG. 5B illustrates a computer having a main body 7201, a housing 7202, a display portion 7203, a keyboard 7204, an external connecting port 7205, a pointing device 7206, and the like. This computer is manufactured by using the light-emitting device of one embodiment of the present invention for the display portion 7203.

Figure 5C:
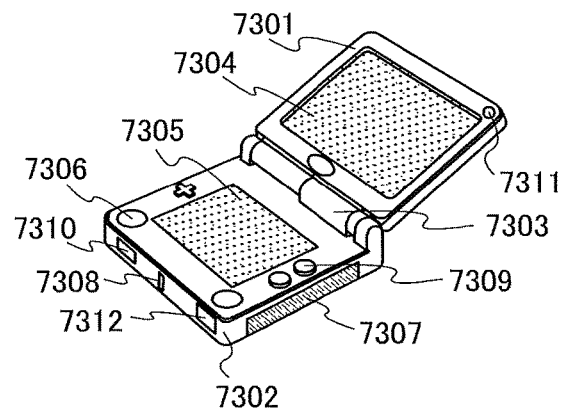

FIG. 5C illustrates a portable game machine having two housings, a housing 7301 and a housing 7302, which are connected with a joint portion 7303 so that the portable game machine can be opened or folded. A display portion 7304 is incorporated in the housing 7301 and a display portion 7305 is incorporated in the housing 7302. In addition, the portable game machine illustrated in FIG. 5C includes a speaker portion 7306, a recording medium insertion portion 7307, an LED lamp 7308, an input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 7312), and the like. It is needless to say that the structure of the portable game machine is not limited to the above as long as a light-emitting device is used for at least either the display portion 7304 or the display portion 7305, or both, and may include other accessories as appropriate. The portable game machine illustrated in FIG. 5C has a function of reading out a program or data stored in a storage medium to display it on the display portion, and a function of sharing information with another portable game machine by wireless communication. The portable game machine illustrated in FIG. 5C can have a variety of functions without limitation to the above.

Figure 5D:
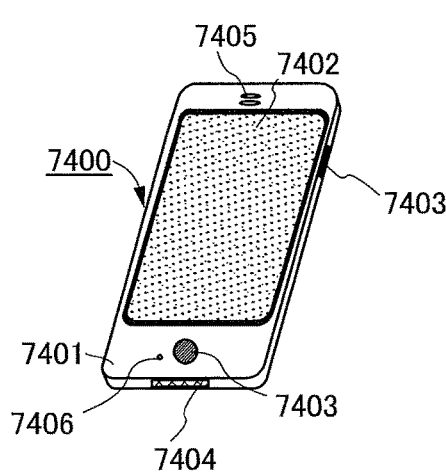

FIG. 5D illustrates an example of a mobile phone. The mobile phone 7400 is provided with a display portion 7402 incorporated in a housing 7401, operation buttons 7403, an external connection port 7404, a speaker 7405, a microphone 7406, and the like. Note that the cellular phone 7400 is manufactured using a light-emitting device for the display portion 7402.

When the display portion 7402 of the cellular phone 7400 illustrated in FIG. 5D is touched with a finger or the like, data can be input into the cellular phone 7400. Further, operations such as making a call and composing e-mail can be performed by touch on the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a text input mode mainly for inputting text is selected for the display portion 7402 so that text displayed on a screen can be input. In this case, it is preferable to display a keyboard or number buttons on almost the entire screen of the display portion 7402.

When a detection device including a sensor for detecting inclination such as an acceleration sensor, a gyroscope, or the like is provided inside the mobile phone 7400, display on the screen of the display portion 7402 can be automatically changed by determining the orientation of the mobile phone 7400 (whether the mobile phone is placed horizontally or vertically for a landscape mode or a portrait mode).

The screen modes are switched by touching the display portion 7402 or operating the operation buttons 7403 of the housing 7401. Alternatively, the screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed within a specified period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a backlight or a sensing light source which emits a near-infrared light in the display portion, an image of a finger vein, a palm vein, or the like can be taken.

Figure 5E:
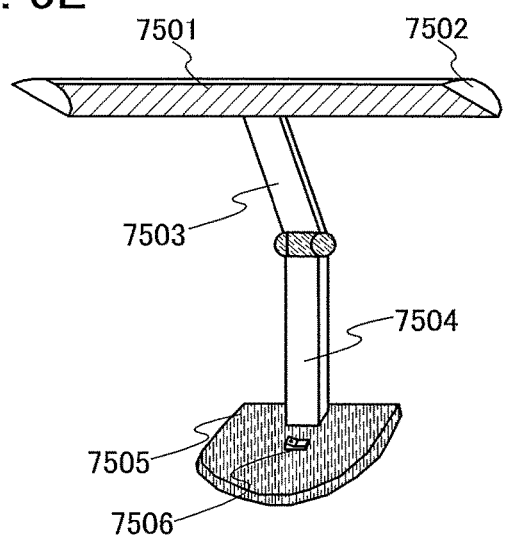

FIG. 5E illustrates a desk lamp including a lighting portion 7501, a shade 7502, an adjustable arm 7503, a support 7504, a base 7505, and a power supply 7506. The desk lamp is manufactured using a light-emitting device for the lighting portion 7501. Note that a lamp includes a ceiling light, a wall light, and the like in its category.

Figure 6A:
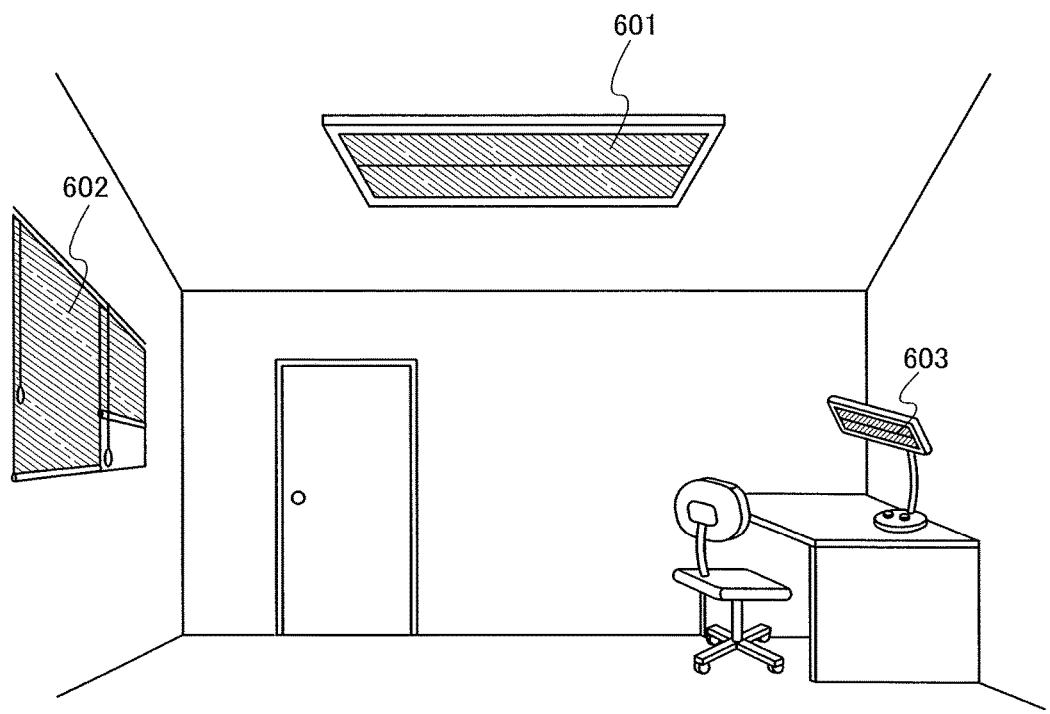
FIGS. 6A and 6B each illustrate a lighting device of one embodiment of the present invention.

FIG. 6A illustrates an example in which the light-emitting device is used for an interior lighting device 601 is illustrated. Since the light-emitting device can have a larger area, it can be used as a lighting device having a large area. Furthermore, the light-emitting device can be used as a roll-type lighting device 602. As illustrated in FIG. 6A, a desk lamp 603 may also be used in a room provided with the interior lighting device 601.

Figure 6B:
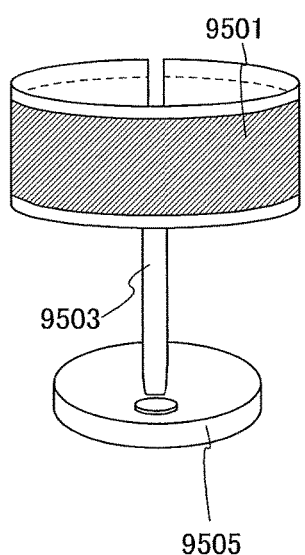

FIG. 6B illustrates an example of another lighting device. A desk lamp illustrated in FIG. 6B includes a lighting portion 9501, a support 9503, a support base 9505, and the like. The lighting portion 9501 includes the light-emitting device of one embodiment of the present invention. Thus, a lighting device that has a curved surface or a lighting portion that can be flexibly bent can be provided by fabrication of a light-emitting element over a substrate having flexibility. The use of a flexible light-emitting device for a lighting device as described above not only improves the degree of freedom in design of the lighting device but also enables the lighting device to be mounted onto a portion having a curved surface, such as the ceiling or a dashboard of a car.

As described above, the electronic devices and the lighting devices can be obtained by application of the light-emitting device. The light-emitting device has a remarkably wide application range and can be applied to electronic appliances in a variety of fields.

Note that the structure described in this embodiment can be combined with any of the structures described in the other embodiments as appropriate.

Embodiment 5

In this embodiment, a light-emitting device manufactured using the light-emitting element of one embodiment of the present invention is described with reference to FIGS. 30A and 30B.

Figure 30A:
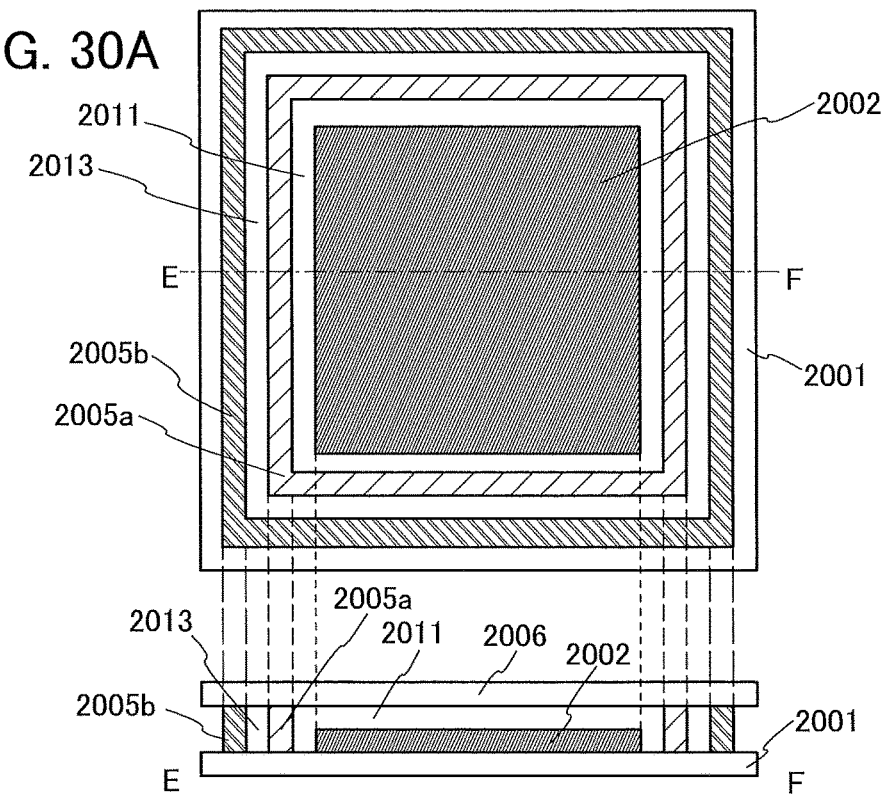
FIGS. 30A and 30B each illustrate a light-emitting element of one embodiment of the present invention.

In FIG. 30A, a plan view of a light-emitting device described in this embodiment and a cross-sectional view taken along dashed-dotted line E-F in the plan view are illustrated.

The light-emitting device illustrated in FIG. 30A includes a light-emitting portion 2002 including a light-emitting element over a first substrate 2001. The light-emitting device has a structure in which a first sealant 2005a is provided so as to surround the light-emitting portion 2002 and a second sealant 2005b is provided so as to surround the first sealant 2005a (i.e., a double sealing structure).

Thus, the light-emitting portion 2002 is positioned in a space surrounded by the first substrate 2001, the second substrate 2006, and the first sealant 2005a.

Note that in this specification, the first sealant 2005a and the second sealant 2005b are not necessarily in contact with the first substrate 2001 and the second substrate 2006. For example, the first sealant 2005a may be in contact with an insulating film or a conductive film formed over the first substrate 2001.

In the above structure, the first sealant 2005a is a resin layer containing a desiccant and the second sealant 2005b is a glass layer, whereby an effect of suppressing entry of impurities such as moisture and oxygen from the outside (hereinafter, referred to as a sealing property) can be increased.

The first sealant 2005a is the resin layer as described above, whereby the glass layer that is the second sealant 2005b can be prevented from having breaking or cracking (hereinafter, collectively referred to as a crack). Further, in the case where the sealing property of the second sealant 2005b is not sufficient, even when impurities enter a first space 2013, entry of the impurities such as moisture and oxygen into a second space 2011 can be suppressed owing to a high sealing property of the first sealant 2005a. Thus, deterioration of an organic compound, a metal material, and the like contained in the light-emitting element because of entry of impurities into the light-emitting portion 2002 can be suppressed.

Figure 30B:
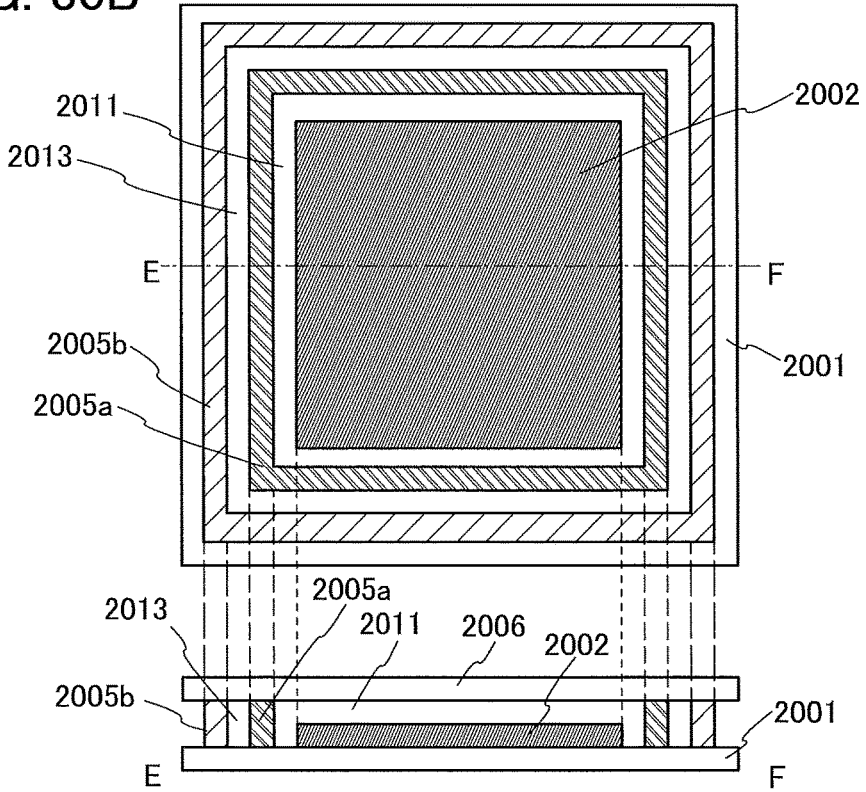

In addition, the structure illustrated in FIG. 30B can be employed: the first sealant 2005a is a glass layer and the second sealant 2005b is a resin layer containing a desiccant.

In each of the light-emitting devices described in this embodiment, distortion due to external force or the like increases toward the outer portion of the light-emitting device. In view of the above, the first sealant 2005a which has relatively small distortion due to external force or the like is a glass layer and the second sealant 2005b is a resin layer which has excellent impact resistance and excellent heat resistance and is not easily broken by deformation due to external force or the like, whereby entry of moisture and oxygen into the first space 2013 can be suppressed.

In addition to the above structure, a material serving as a desiccant may be contained in each of the first space 2013 and the second space 2011.

In the case where the first sealant 2005a or the second sealant 2005b is a glass layer, for example, a glass frit or a glass ribbon can be used. Note that at least a glass material is contained in a glass frit or a glass ribbon.

The glass frit contains a glass material as a frit material. The glass frit may contain, for example, magnesium oxide, calcium oxide, strontium oxide, barium oxide, cesium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, manganese dioxide, molybdenum oxide, niobium oxide, titanium oxide, tungsten oxide, bismuth oxide, zirconium oxide, lithium oxide, antimony oxide, lead borate glass, tin phosphate glass, vanadate glass, or borosilicate glass. The glass frit preferably contains at least one or more kinds of transition metals to absorb infrared light.

Further, in the case where a glass layer is formed using any of the above glass frits, for example, a frit paste is applied to a substrate and is subjected to heat treatment, laser light irradiation, or the like. The frit paste contains the frit material and a resin (also referred to as a binder) diluted by an organic solvent. The frit paste can be formed using a variety of materials and can employ a variety of structures. An absorber which absorbs light having a wavelength of laser light may be added to the frit material. For example, an Nd:YAG laser or a semiconductor laser is preferably used as the laser. The shape of laser light may be circular or quadrangular.

Note that the thermal expansion coefficient of the glass layer to be formed is preferably close to that of the substrate. The closer the thermal expansion coefficients are, the more generation of a crack in the glass layer or the substrate due to thermal stress can be suppressed.

Although any of a variety of materials, for example, photocurable resins such as an ultraviolet curable resin and thermosetting resins can be used in the case where the first sealant 2005a or the second sealant 2005b is a resin layer, it is particularly preferable to use a material which does not transmit moisture or oxygen. In particular, a photocurable resin is preferably used. The light-emitting element contains a material having low heat resistance in some cases. A photocurable resin, which is cured by light irradiation, can suppress change in film quality and deterioration of an organic compound itself caused by heating of the light-emitting element. Furthermore, any of the organic compounds that can be used for the light-emitting element of one embodiment of the present invention may be used.

As the desiccant contained in the resin layer, the first space 2013, or the second space 2011, a known material can be used. As the desiccant, a substance which adsorbs moisture and the like by chemical adsorption or a substance which adsorbs moisture and the like by physical adsorption can be used. Examples thereof are alkali metal oxides, alkaline earth metal oxide (e.g., calcium oxide and barium oxide), sulfate, metal halides, perchlorate, zeolite, silica gel, and the like.

One or both of the first space 2013 and the second space 2011 may have, for example, an inert gas such as a rare gas or a nitrogen gas or may contain an organic resin. Note that these spaces are each in an atmospheric pressure state or a reduced pressure state.

As described above, the light-emitting device described in this embodiment has a double sealing structure, in which one of the first sealant 2005a and the second sealant 2005b is the glass layer having excellent productivity and an excellent sealing property, and the other is the resin layer which is hardly broken because of external force or the like, and can contain the desiccant inside, so that a sealing property of suppressing entry of impurities such as moisture and oxygen from the outside can be improved.

Thus, the use of the structure described in this embodiment can provide a light-emitting device in which deterioration of a light-emitting element due to impurities such as moisture and oxygen is suppressed.

Note that the structure described in this embodiment can be combined with any of the structures described in the other embodiments and the examples as appropriate.

Embodiment 6

In this embodiment, a light-emitting device in which the light-emitting element of one embodiment of the present invention is used is described with reference to FIGS. 31A and 31B.

Figure 31A:
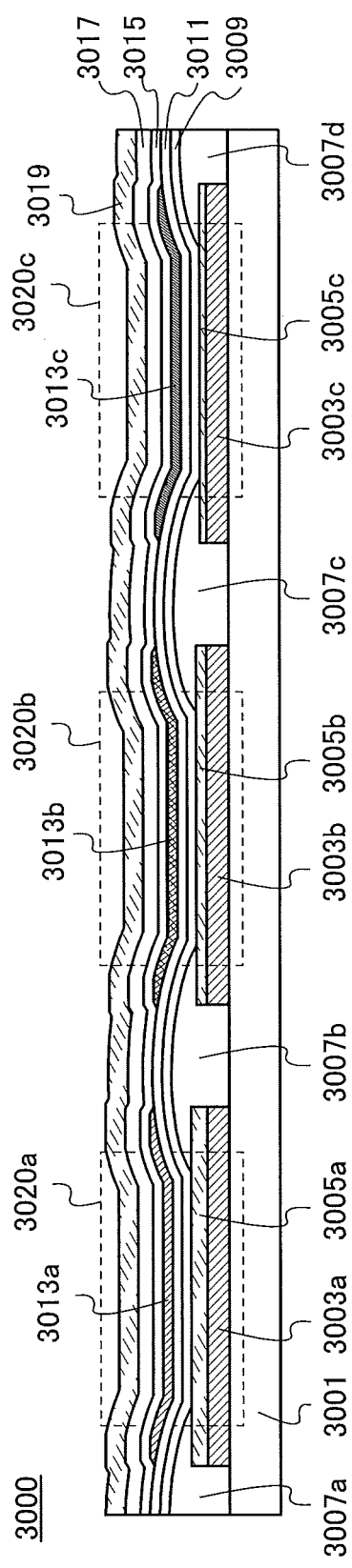
FIGS. 31A and 31B each illustrate a light-emitting element of one embodiment of the present invention.
Figure 31B:
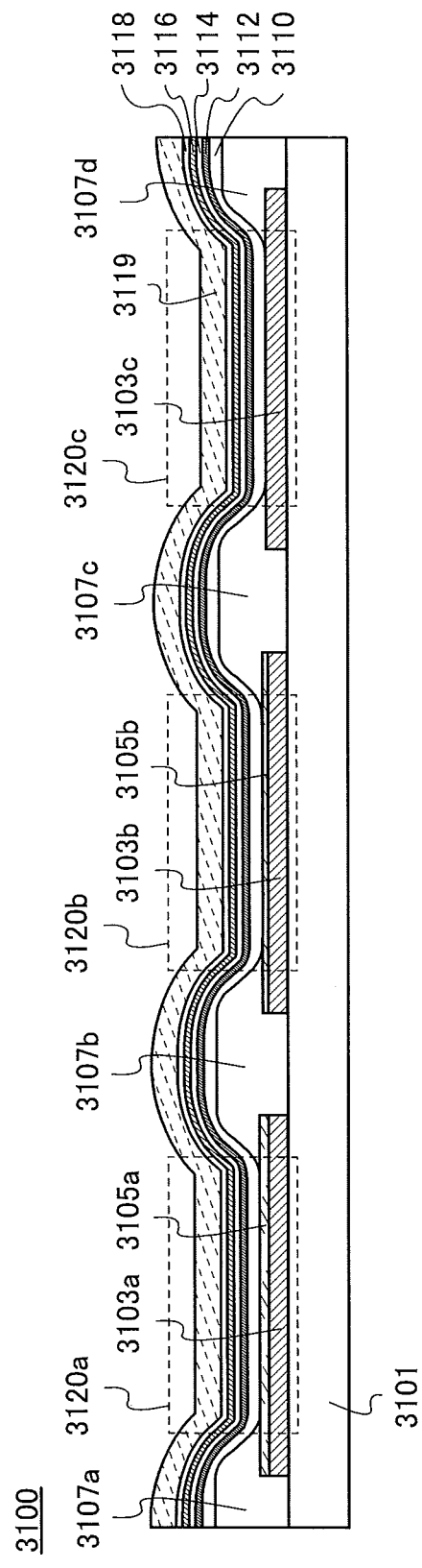

FIGS. 31A and 31B are each an example of a cross-sectional image of a light-emitting device including a plurality of light-emitting elements. A light-emitting device 3000 illustrated in FIG. 31A includes light-emitting elements 3020a, 3020b, and 3020c.

The light-emitting device 3000 includes island-shaped lower electrodes 3003a, 3003b, and 3003c over a substrate 3001. The lower electrodes 3003a, 3003b, and 3003c can function as anodes of the respective light-emitting elements. Reflective electrodes may be provided as the lower electrodes 3003a, 3003b, and 3003c. Transparent conductive layers 3005a, 3005b, and 3005c may be provided over the lower electrodes 3003a, 3003b, and 3003c, respectively. The transparent conductive layers 3005a, 3005b, and 3005c preferably have different thicknesses depending on emission colors of the elements.

Further, the light-emitting device 3000 includes partitions 3007a, 3007b, 3007c, and 3007d. Specifically, the partition 3007a covers one edge portion of the lower electrode 3003a and one edge portion of the transparent conductive layer 3005a; the partition 3007b covers the other edge portion of the lower electrode 3003a and the other edge portion of the transparent conductive layer 3005a and also covers one edge portion of the lower electrode 3003b and one edge portion of the transparent conductive layer 3005b; the partition 3007c covers the other edge portion of the lower electrode 3003b and the other edge portion of the transparent conductive layer 3005b and also covers one edge portion of the lower electrode 3003c and one edge portion of the transparent conductive layer 3005c; the partition 3007d covers the other edge portion of the lower electrode 3003c and the other edge portion of the transparent conductive layer 3005c.

Further, the light-emitting device 3000 includes a hole-injection layer 3009 over the lower electrodes 3003a, 3003b, and 3003c and the partitions 3007a, 3007b, 3007c, and 3007d.

Further, the light-emitting device 3000 includes a hole-transport layer 3011 over the hole-injection layer 3009. The light-emitting device 3000 also includes light-emitting layers 3013a, 3013b, and 3013c over the hole-transport layer 3011. The light-emitting device 3000 also includes an electron-transport layer 3015 over the light-emitting layers 3013a, 3013b, and 3013c.

Further, the light-emitting device 3000 includes an electron-injection layer 3017 over the electron-transport layer 3015. The light-emitting device 3000 also includes an upper electrode 3019 over the electron-injection layer 3017. The upper electrode 3019 can function as cathodes of the light-emitting elements.

Note that although an example in which the lower electrodes 3003a, 3003b, and 3003c function as the anodes of the light-emitting elements and the upper electrode 3019 functions as the cathodes of the light-emitting elements is described with reference to FIG. 31A, the stacking order of the anode and the cathode may be switched. In this case, the stacking order of the electron-injection layer, the electron-transport layer, the hole-transport layer, and the hole-injection layer may be changed.

The light-emitting element of one embodiment of the present invention can be applied to the light-emitting layers 3013a, 3013b, and 3013c. The light-emitting element can have low driving voltage, high current efficiency, or a long lifetime; thus, the light-emitting device 3000 can have low power consumption or a long lifetime.

A light-emitting device 3100 illustrated in FIG. 31B includes light-emitting elements 3120a, 3120b, and 3120c. The light-emitting elements 3120a, 3120b, and 3120c are tandem light-emitting elements in which a plurality of light-emitting layers are provided between lower electrodes 3103a, 3103b, and 3103c and an upper electrode 3119.

The light-emitting device 3100 includes the island-shaped lower electrodes 3103a, 3103b, and 3103c over a substrate 3101. The lower electrodes 3103a, 3103b, and 3103c function as anodes of the light-emitting elements. Reflective electrodes may be provided as the lower electrodes 3103a, 3103b, and 3103c. Transparent conductive layers 3105a and 3105b may be provided over the lower electrodes 3103a and 3103b. The transparent conductive layers 3105a and 3105b preferably have different thicknesses depending on emission colors of the elements. Although not illustrated, a transparent conductive layer may also be provided over the lower electrode 3103c.

Further, the light-emitting device 3100 includes partitions 3107a, 3107b, 3107c, and 3107d. Specifically, the partition 3107a covers one edge portion of the lower electrode 3103a and one edge portion of the transparent conductive layer 3105a; the partition 3107b covers the other edge portion of the lower electrode 3103a and the other edge portion of the transparent conductive layer 3105a and also covers one edge portion of the lower electrode 3103b and one edge portion of the transparent conductive layer 3105b; the partition 3107c covers the other edge portion of the lower electrode 3103b and the other edge portion of the transparent conductive layer 3105b and also covers one edge portion of the lower electrode 3103c and one edge portion of the transparent conductive layer 3105c; the partition 3107d covers the other edge portion of the lower electrode 3103c and the other edge portion of the transparent conductive layer 3105c.

Further, the light-emitting device 3100 includes a hole-injection and hole-transport layer 3110 over the lower electrodes 3103a, 3103b, and 3103c and the partitions 3107a, 3107b, 3107c, and 3107d.

Further, the light-emitting device 3100 includes a first light-emitting layer 3112 over the hole-injection and hole-transport layer 3110. The light-emitting device 3100 also includes a second light-emitting layer 3116 over the first light-emitting layer 3112 with a charge generation layer 3114 therebetween.

Further, the light-emitting device 3100 includes an electron-transport and electron-injection layer 3118 over the second light-emitting layer 3116. In addition, the light-emitting device 3100 includes the upper electrode 3119 over the electron-transport and electron-injection layer 3118. The upper electrode 3119 can function as cathodes of the light-emitting elements.

Note that although an example in which the lower electrodes 3103a, 3103b, and 3103c function as the anodes of the light-emitting elements and the upper electrode 3119 functions as the cathodes of the light-emitting elements is described with reference to FIG. 31B, the stacking order of the anode and the cathode may be switched. In this case, the stacking order of the electron-injection layer, the electron-transport layer, the hole-transport layer, and the hole-injection layer may be changed.

The light-emitting element of one embodiment of the present invention can be applied to the first light-emitting layer 3112 and the second light-emitting layer 3116. The light-emitting element can have low driving voltage, high current efficiency, or a long lifetime; thus, the light-emitting device 3100 can have low power consumption or a long lifetime.

Note that the structure described in this embodiment can be combined with any of the structures described in the other embodiments and the examples as appropriate.

Embodiment 7

In this embodiment, a lighting device manufactured using the light-emitting element of one embodiment of the present invention is described with reference to FIGS. 32A to 32E.

Figure 32A:
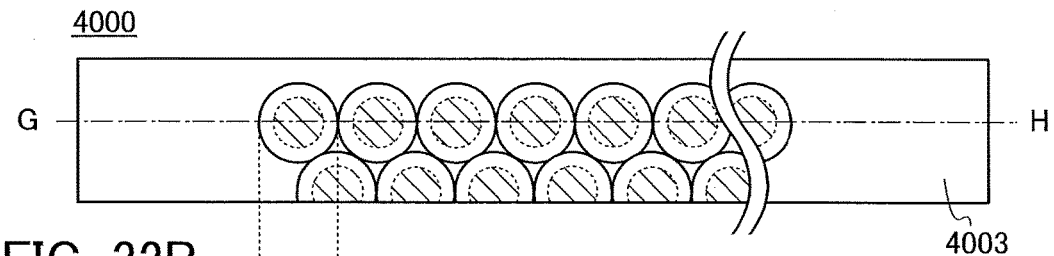
FIGS. 32A to 32E each illustrate a lighting device of one embodiment of the present invention.
Figure 32B:
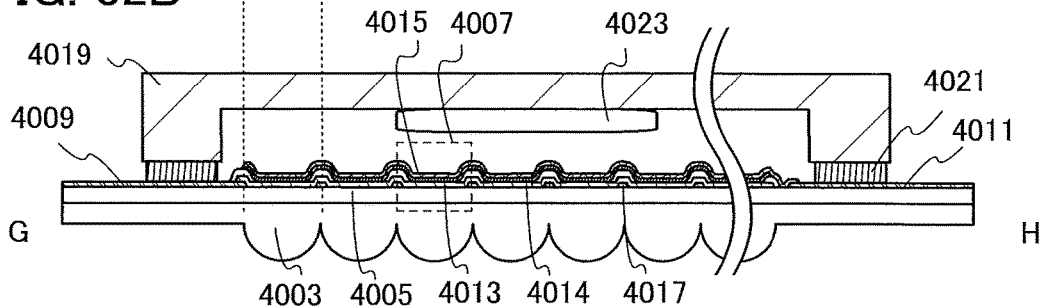
Figure 32C:
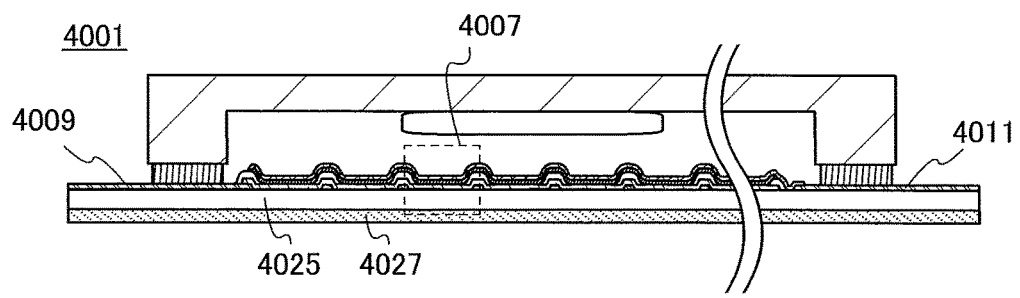

FIGS. 32A to 32E are a plan view and cross-sectional views of lighting devices. FIGS. 32A to 32C are bottom-emission lighting devices in which light is extracted from the substrate side. FIG. 32B is a cross-sectional view taken along dashed-dotted line G-H in FIG. 32A.

A lighting device 4000 illustrated in FIGS. 32A and 32B includes a light-emitting element 4007 over a substrate 4005. In addition, the lighting device 4000 includes a substrate 4003 with unevenness on the outside of the substrate 4005. The light-emitting element 4007 includes a lower electrode 4013, an EL layer 4014, and an upper electrode 4015.

The lower electrode 4013 is electrically connected to an electrode 4009, and the upper electrode 4015 is electrically connected to an electrode 4011. In addition, an auxiliary wiring 4017 electrically connected to the lower electrode 4013 may be provided.

The substrate 4005 and a sealing substrate 4019 are bonded to each other by a sealant 4021. A desiccant 4023 is preferably provided between the sealing substrate 4019 and the light-emitting element 4007.

The substrate 4003 has the unevenness illustrated in FIG. 32A, whereby the extraction efficiency of light emitted from the light-emitting element 4007 can be increased. Instead of the substrate 4003, a diffusion plate 4027 may be provided on the outside of the substrate 4025 as in a lighting device 4001 illustrated in FIG. 32C.

Figure 32D:
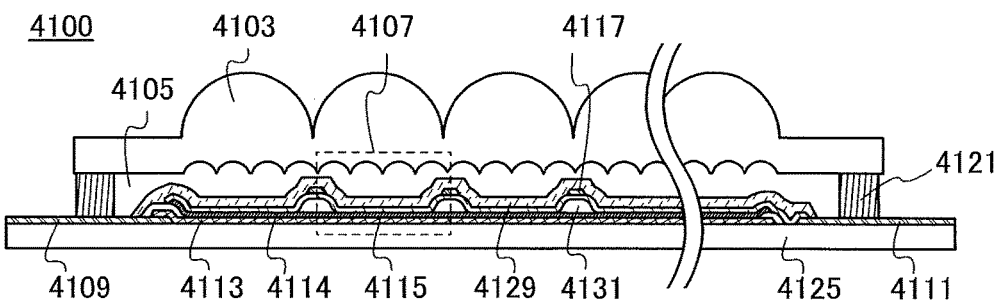
Figure 32E:
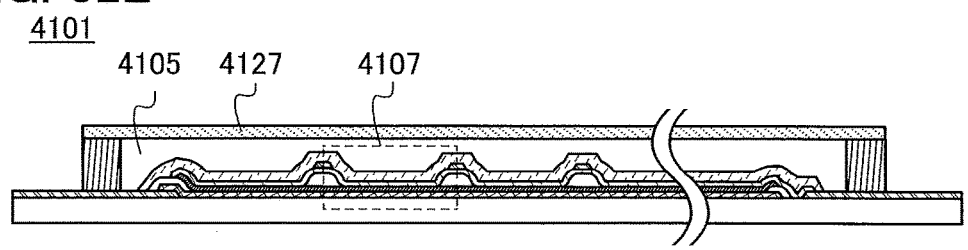

FIGS. 32D and 32E illustrate top-emission lighting devices in which light is extracted from the side opposite to the substrate.

A lighting device 4100 illustrated in FIG. 32D includes a light-emitting element 4107 over a substrate 4125. The light-emitting element 4107 includes a lower electrode 4113, an EL layer 4114, and an upper electrode 4115.

The lower electrode 4113 is electrically connected to an electrode 4109, and the upper electrode 4115 is electrically connected to an electrode 4111. An auxiliary wiring 4117 electrically connected to the upper electrode 4115 may be provided. An insulating layer 4131 may be provided under the auxiliary wiring 4117.

The substrate 4125 and a sealing substrate 4103 with unevenness are bonded to each other by a sealant 4121. A planarization film 4105 and a barrier film 4129 may be provided between the sealing substrate 4103 and the light-emitting element 4107.

The sealing substrate 4103 has the unevenness illustrated in FIG. 32D, the extraction efficiency of light emitted from the light-emitting element 4107 can be increased. Instead of the sealing substrate 4103, a diffusion plate 4127 may be provided over the light-emitting element 4107 as in a lighting device 4101 illustrated in FIG. 32E.

The light-emitting element of one embodiment of the present invention can be applied to light-emitting layers included in the EL layer 4014 and the EL layer 4114. The light-emitting element can have low driving voltage, high current efficiency, or a long lifetime; thus, the lighting devices 4000, 4001, 4100, and 4101 can have low power consumption or a long lifetime.

Note that the structure described in this embodiment can be combined with any of the structures described in the other embodiments and the examples as appropriate.

Embodiment 8

In this embodiment, a touch sensor and a display module which can be combined with the light-emitting device of one embodiment of the present invention are described with reference to FIGS. 33A and 33B, FIG. 34, FIG. 35, and FIG. 36.

Figure 33A:
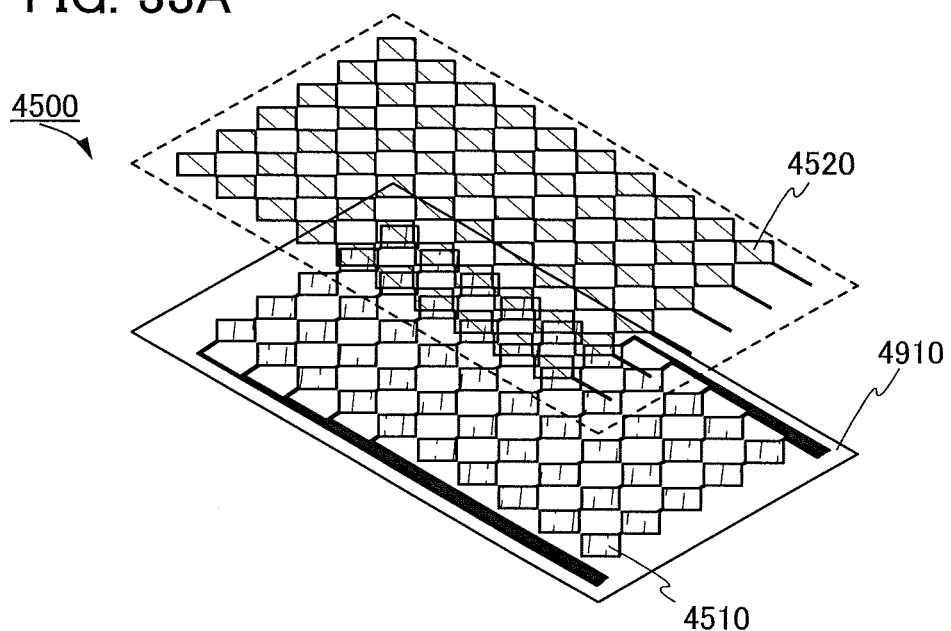
FIGS. 33A and 33B illustrate a touch sensor.
Figure 33B:
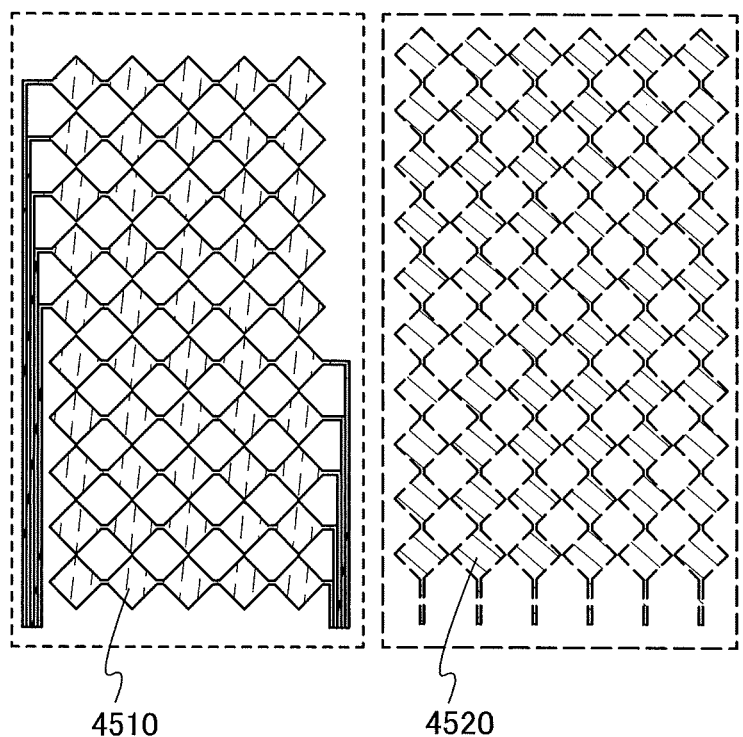

FIG. 33A is an exploded perspective view illustrating a structural example of a touch sensor 4500. FIG. 33B is a plan view illustrating a structural example of the touch sensor 4500.

The touch sensor 4500 illustrated in FIGS. 33A and 33B includes, over a substrate 4910, conductive layers 4510 arranged in the X-axis direction and conductive layers 4520 arranged in the Y-axis direction which intersect with the X-axis direction. In FIGS. 33A and 33B illustrating the touch sensor 4500, a plane over which conductive layers 4510 are formed and a plane over which conductive layers 4520 are formed are separately illustrated.

Figure 34:
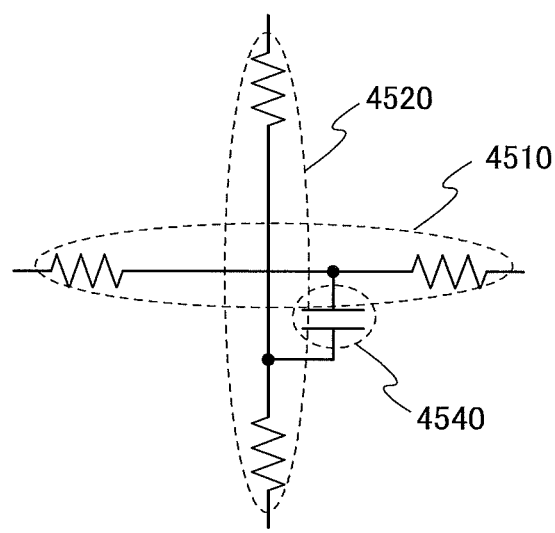
FIG. 34 is a circuit diagram illustrating the touch sensor.

FIG. 34 is an equivalent circuit diagram illustrating the portion where the conductive layer 4510 and the conductive layer 4520 of the touch sensor 4500 illustrated in FIGS. 33A and 33B intersect with each other. A capacitor 4540 is formed in the portion where the conductive layer 4510 and the conductive layer 4520 intersect with each other.

The conductive layer 4510 and the conductive layer 4520 each have a structure in which a plurality of quadrangular conductive films are connected to one another. The conductive layers 4510 and the conductive layers 4520 are provided so that the quadrangular conductive films of the conductive layer 4510 and the quadrangular conductive films of the conductive layer 4520 do not overlap with each other. In the portion where the conductive layer 4510 intersects with the conductive layer 4520, an insulating film is provided between the conductive layer 4510 and the conductive layer 4520 so that the conductive layer 4510 and the conductive layer 4520 are not in contact with each other.

Figure 35:
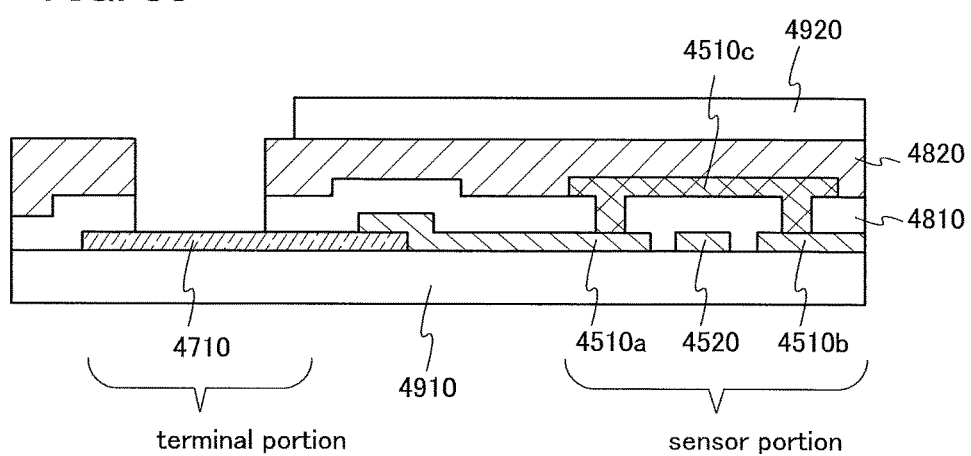
FIG. 35 is a cross-sectional view illustrating the touch sensor.

FIG. 35 is a cross-sectional view illustrating an example of a connection between the conductive layers 4510a, 4510b, and 4510c and the conductive layer 4520 and is an example of a cross-sectional view illustrating a portion where the conductive layers 4510a, 4510b, and 4510c intersect with the conductive layer 4520.

As illustrated in FIG. 35, the conductive layer 4510 includes the conductive layer 4510a and the conductive layer 4510b in the first layer and the conductive layer 4510c in the second layer over an insulating layer 4810. The conductive layer 4510a and the conductive layer 4510b are connected to each other by the conductive layer 4510c. The conductive layer 4520 is formed using the conductive layer in the first layer. The insulating layers 4810 and 4820 is formed so as to cover the conductive layers 4510a, 4510b, 4510c, and 4520 and part of a conductive layer 4710. As the insulating layers 4810 and 4820, for example, a silicon oxynitride film may be formed. Note that a base film formed of an insulating film may be formed between a substrate 4910 and the conductive layers 4710, 4510a, 4510b, and 4520. As the base film, for example, a silicon oxynitride film can be formed.

The conductive layers 4510a, 4510b, and 4510c and the conductive layer 4520 are formed using a conductive material having a property of transmitting visible light. Examples of the conductive material having a property of transmitting visible light include indium tin oxide containing silicon oxide, indium tin oxide, zinc oxide, indium zinc oxide, and zinc oxide to which gallium is added.

The conductive layer 4510a is connected to the conductive layer 4710. A terminal for connection to an FPC is formed using the conductive layer 4710. The conductive layer 4520 is connected to the conductive layer 4710 like the conductive layer 4510a. The conductive layer 4710 can be formed of, for example, a tungsten film.

The insulating layer 4820 is formed so as to cover the conductive layers 4510a, 4510b, 4510c, and 4520 and part of the conductive layer 4710. An opening is formed in the insulating layers 4810 and 4820 over the conductive layer 4710 so that the electrode 4710 is electrically connected to an FPC. A substrate 4920 is attached to and over the insulating layer 4820 using an adhesive, an adhesive film, or the like. The substrate 4910 side is bonded to a color filter substrate of a display panel with an adhesive or an adhesive film, so that a touch panel is completed.

Next, a display module which can be used for a display device of one embodiment of the present invention is described with reference to FIG. 36.

Figure 36:
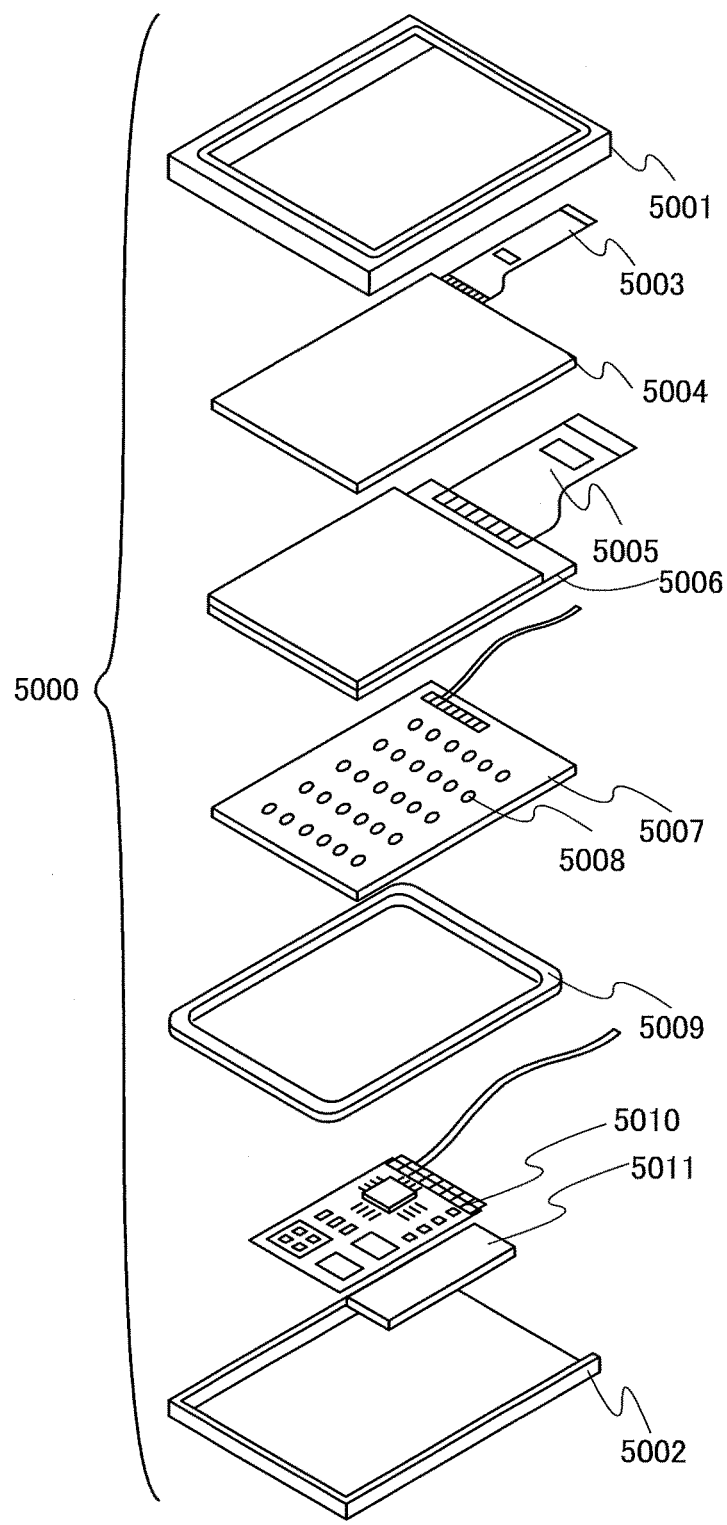
FIG. 36 illustrates a display module including a display device of one embodiment of the present invention.

In a display module 5000 illustrated in FIG. 36, a touch panel 5004 connected to an FPC 5003, a display panel 5006 connected to an FPC 5005, a backlight unit 5007, a frame 5009, a printed board 5010, and a battery 5011 are provided between an upper cover 5001 and a lower cover 5002.

The shapes and sizes of the upper cover 5001 and the lower cover 5002 can be changed as appropriate in accordance with the sizes of the touch panel 5004 and the display panel 5006.

The touch panel c5004 can be a resistive touch panel or a capacitive touch panel and can be formed to overlap with the display panel 5006. It is also possible to provide a touch panel function for a counter substrate (sealing substrate) of the display panel 5006. A photosensor may be provided in each pixel of the display panel 5006 so that an optical touch panel is obtained.

The backlight unit 5007 includes light sources 5008. Note that although a structure in which the light sources 5008 are provided over the backlight unit 5007 is illustrated in FIG. 36, one embodiment of the present invention is not limited to this structure. For example, a structure in which a light source 5008 is provided at an end portion of the backlight unit 5007 and a light diffusion plate is further provided may be employed. Note that the backlight unit 5007 is not necessarily provided.

The frame 5009 has a function of protecting the display panel 5006 and functions as an electromagnetic shield for blocking electromagnetic waves generated by the operation of the printed board 5010. The frame 5009 may function as a radiator plate.

The printed board 5010 has a power supply circuit and a signal processing circuit for outputting a video signal and a clock signal. As a power source for supplying electric power to the power supply circuit, an external commercial power source or a power source using a battery 5011 separately provided may be used. The battery 5011 can be omitted when a commercial power source is used.

The display module 5000 can be additionally provided with a member such as a polarizing plate, a retardation plate, or a prism sheet.

Note that the structure described in this embodiment can be combined with any of the structures described in the other embodiments and the examples as appropriate.

Example 1

Synthesis Example 1

In this example, a synthesis example of tris{3-[1-(2-methylphenyl)-5-propyl-1H-1,2,4-triazol-3-yl-N4]-2-naphthalenyl-κC}iridium(III) (another name: tris[1-(2-methylphenyl)-3-(2-naphthyl)-5-propyl-1H-1,2,4-triazolato] iridium(III)), (abbreviation: [Ir(Prn3tzl-mp)$_3$]) represented by the structural formula (116) described in Embodiment 1 is specifically described. The structure of [Ir(Prn3tzl-mp)$_3$] (abbreviation) is shown below.

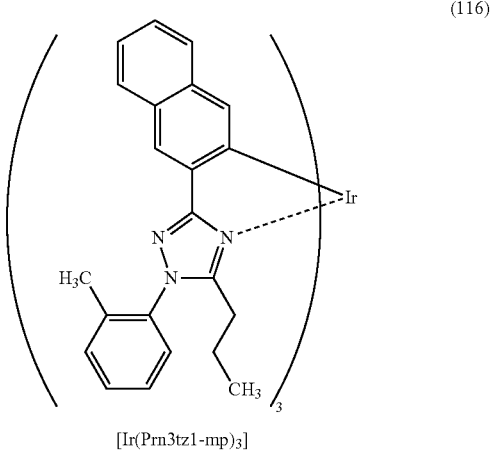

[Ir(Prn3tzl-mp)$_3$]

Step 1: Synthesis of N-(1-ethoxy-2-naphthylidene)butyramide

First, 5 g of ethyl 2-naphthalenecarboximidate hydrochloride, 50 mL of toluene, and 4.3 g of triethylamine (Et₃N) were put into a 300-mL three-neck flask and the mixture was stirred at room temperature for 10 minutes. With a 50-mL dropping funnel, a mixed solution of 2.3 g of butyryl chloride and 30 mL of toluene was added dropwise to this mixture, and the mixture was stirred at room temperature for 41.5 hours. After a predetermined time elapsed, the reaction mixture was suction-filtered, and the filtrate was concentrated to give N-(1-ethoxy-2-naphthylidene)butyramide (a yellow oily substance, a yield of 100%). The synthesis scheme of Step 1 is shown in (A-1).

drying. The mixture was gravity-filtered and the filtrate was concentrated to give an oily substance. The given oily substance was purified by silica gel column chromatography. As the developing solvent, a mixed solvent of hexane and ethyl acetate in a ratio of 10:1 (v/v) was used. The obtained fraction was concentrated, so that 1-methylphenyl-3-(2-naphthyl)-5-propyl-1H-1,2,4-triazole (abbreviation: HPrn3tzl-mp) was obtained (a pale red solid, 36% yield). The synthesis scheme of Step 2 is shown in (A-2).

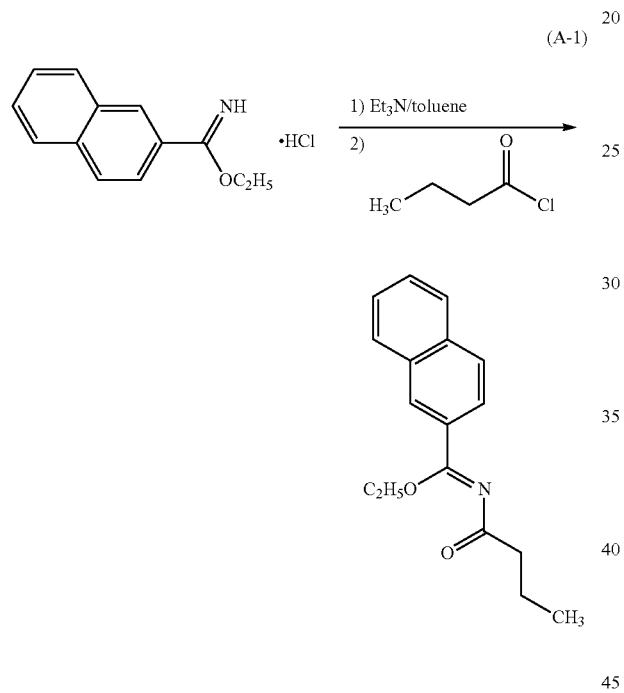

(A-1)

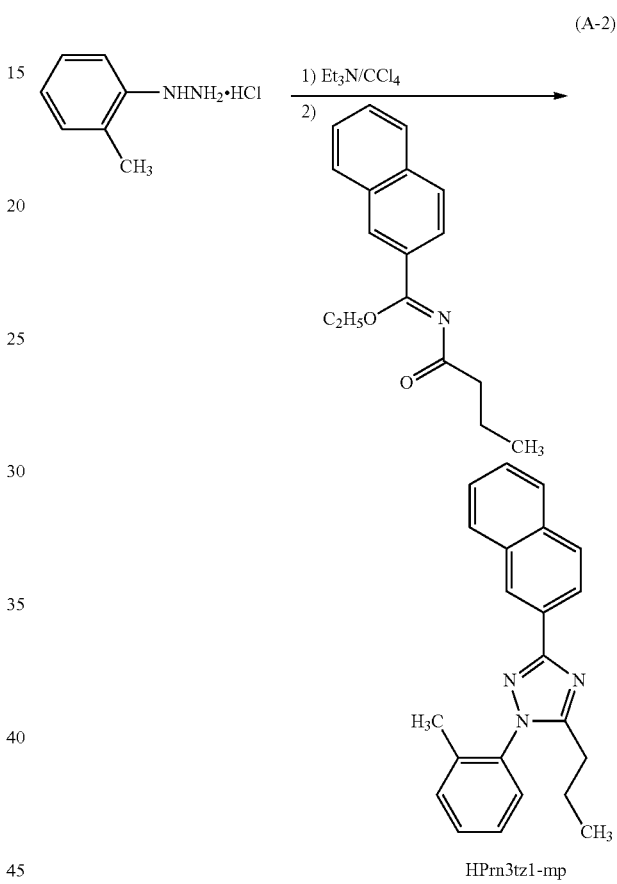

(A-2)

Step 2: Synthesis of 1-methylphenyl-3-(2-naphthyl)-5-propyl-1H-1,2,4-triazole (abbreviation: HPrn3tzl-mp)

Next, 4.0 g of o-tolyl hydrazine hydrochloride and 100 mL of carbon tetrachloride were put into a 300-mL three-neck flask, 3.0 g of triethylamine (Et₃N) was added dropwise to this mixture little by little, and the mixture was stirred at room temperature for 1 hour. After a predetermined time elapsed, 6.8 g of N-(1-ethoxy-2-naphthylidene)butyramide obtained in Step 1 above was added to the mixture, and the mixture was stirred at room temperature for 24 hours. After a predetermined time elapsed, water was added to the reacted solution and the mixture was stirred. The aqueous layer of this mixture was subjected to extraction with chloroform, and the obtained solution of the extract and the organic layer were combined and washed with saturated saline, and anhydrous magnesium sulfate was added for

Step 3: Synthesis of di-μ-chloro-tetrakis{3-[1-(2-methylphenyl)-5-propyl-1H-1,2,4-triazol-3-yl-κN4]-2-naphthalenyl-κC}diiridium(III) (abbreviation: [Ir(Prn3tzl-mp)₂Cl]₂)

Next, 0.8 g of HPrn3tzl-mp which is the ligand obtained in Step 2 above, 0.35 g of iridium chloride hydrate, 12 mL of 2-ethoxyethanol, and 4 mL of water were put into a 50-mL recovery flask and the air in the flask was replaced with argon. This reaction container was subjected to microwaves under conditions of 100 W and 100° C. for 1 hour to cause a reaction. After a predetermined time elapsed, the obtained reaction mixture was suction-filtered and the obtained solid was washed with ethanol to give a dinuclear complex [Ir(Prn3tzl-mp)₂Cl]₂ (abbreviation) (yellow powder, a yield of 93%). The synthesis scheme of Step 3 is shown in (A-3).

(A-3)

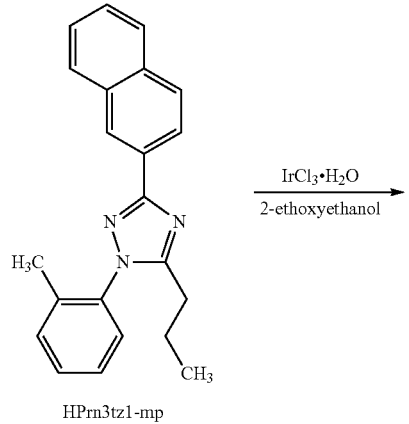

HPrn3tzl-mp

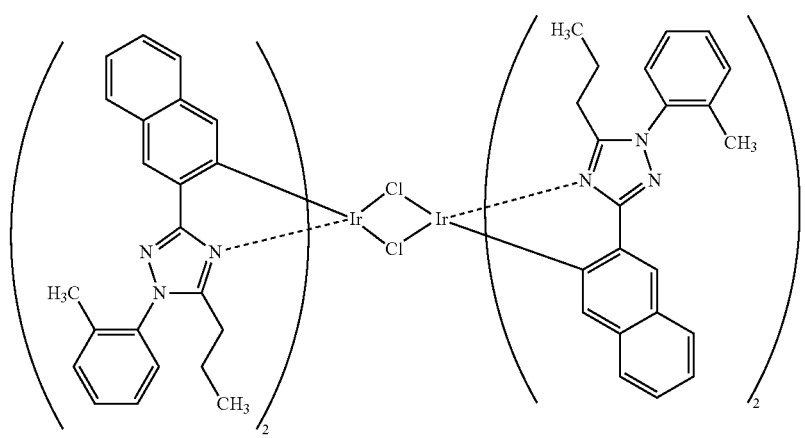

[Ir(Prn3tzl-mp)₂Cl]₂

Step 4: Synthesis of tris{3-[1-(2-methylphenyl)-5-propyl-1H-1,2,4-triazol-3-yl-iN4]-2-naphthalenyl-κC}iridium(III) (abbreviation: [Ir(Prn3tzl-mp)₃])

Next, 0.96 g of [Ir(Prn3tzl-mp)₂Cl]₂ (abbreviation) which is the dinuclear complex obtained in Step 3 above, 2.1 g of HPrn3tzl-mp which is the ligand obtained in Step 2 above, and 0.56 g of silver trifluoromethanesulfonate (TfOAg) were put into a reaction container provided with a three-way cock and a cold tube, and the air in the reaction container was replaced with argon. The mixture was heated and stirred at 170° C. for 45 hours. The obtained mixture was dissolved in dichloromethane and suction filtration was carried out to remove insoluble solids. The obtained filtrate was washed with water and saturated saline, and anhydrous magnesium sulfate was added to the organic layer for drying. This mixture was gravity-filtered, and the filtrate was concentrated to give an oily substance. This oily substance was purified by silica gel column chromatography. As the developing solvent, a mixed solvent of dichloromethane and hexane in a ratio of 5:1 (v/v) was used. The obtained fraction was concentrated to obtain a solid substance. This solid was washed with ethanol, and the obtained solid was recrystallized with a mixed solvent of dichloromethane and ethanol to give [Ir(Prn3tzl-mp)₃](abbreviation) (yellow powder, a yield of 10%). The synthesis scheme of Step 4 is shown in (A-4).

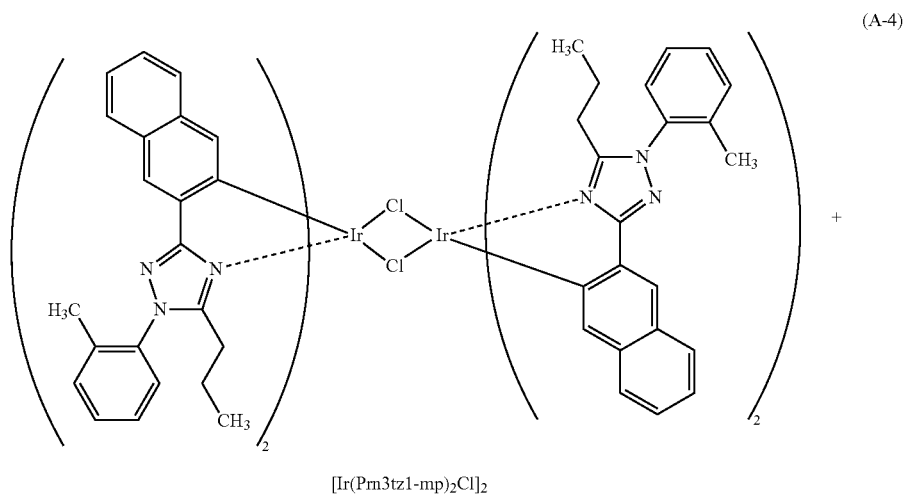

[Ir(Prn3tzl-mp)₂Cl]₂

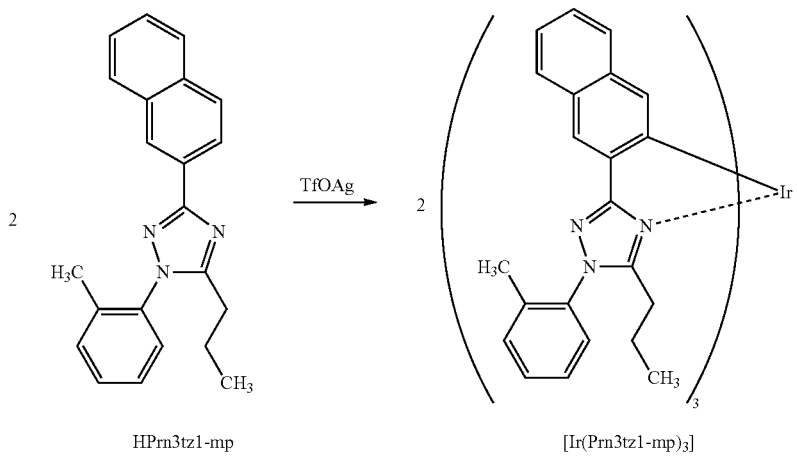

HPrn3tzl-mp → [Ir(Prn3tzl-mp)₃]

Figure 7:
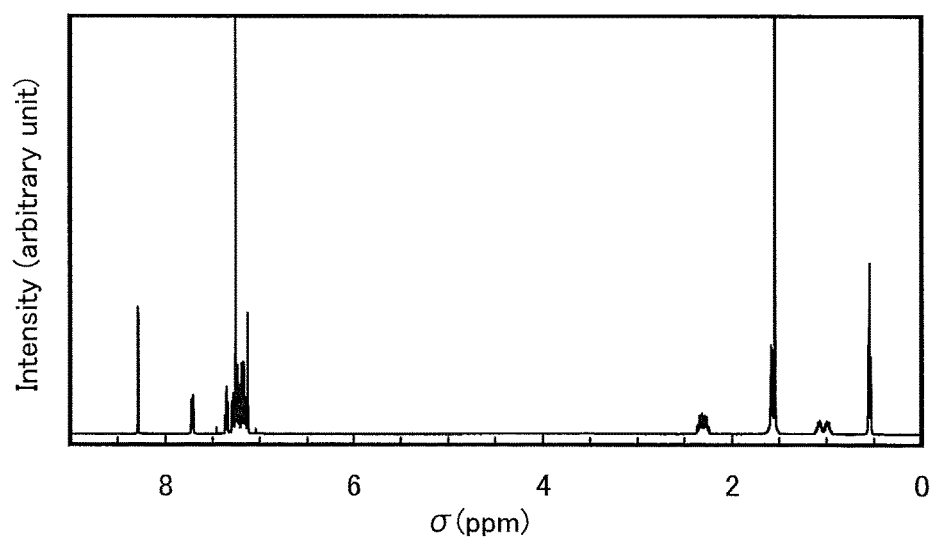
FIG. 7 is a $^1$H NMR chart of tris{3-[1-(2-methylphenyl)-5-propyl-1H-1,2,4-triazol-3-yl-κN4]-2-naphthalenyl-C}iridium(III) ([Ir(Prn3tzl-mp)$_3$](abbreviation)) represented by a structural formula (116).

An analysis result by nuclear magnetic resonance spectrometry ($^1$H NMR) of the yellow powder obtained in Step 4 above is described below. FIG. 7 is the $^1$H NMR chart. The results revealed that [Ir(Prn3tzl-mp)₃](abbreviation) represented by the structural formula (116) was obtained in Synthesis Example 1.

The following is the $^1$H NMR data of the obtained substance: $^1$H NMR. δ (CDCl₃): 0.54 (t, 9H), 0.93-1.13 (m, 6H), 1.58 (s, 9H), 2.24-2.37 (m, 6H), 7.13-7.29 (m, 21H), 7.35 (t, 3H), 7.71 (d, 3H), 8.29 (s, 3H).

Next, [Ir(Prn3tzl-mp)₃](abbreviation) obtained in this example was analyzed by liquid chromatography mass spectrometry (LC/MS).

The LC/MS analysis was carried out with Acquity UPLC (produced by Waters Corporation) and Xevo G2 T of MS (produced by Waters Corporation).

In the MS analysis, ionization was carried out by an electrospray ionization (ESI) method. At this time, the capillary voltage and the sample cone voltage were set to 3.0 kV and 30 V, respectively, and detection was performed in a positive mode. A component which underwent the ionization under the above-described conditions was made to collide with an argon gas in a collision cell to dissociate into product ions. The energy (collision energy) for the collision with argon was 70 eV. The range of the mass-to-charge ratio to be measured was m/z=100 to 1200.

Figure 8:
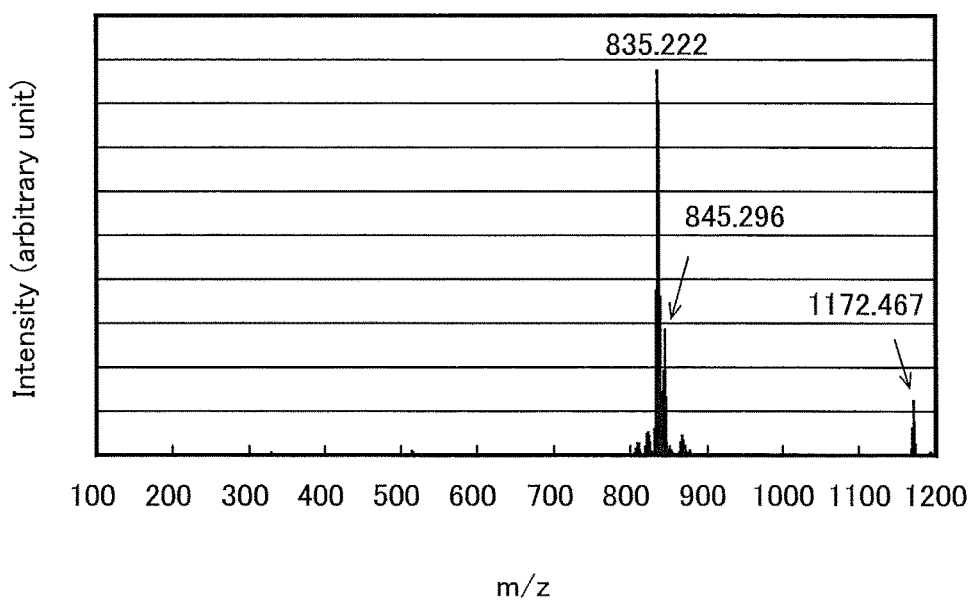
FIG. 8 shows results of LC/MS analysis of [Ir(Prn3tzl-mp)$_3$](abbreviation) represented by the structural formula (116).

FIG. 8 shows results of the MS analysis. The results in FIG. 8 revealed that as for [Ir(Prn3tzl-mp)$_3$](abbreviation) obtained in this example, peaks of product ions are detected mainly around m/z=835 and around m/z=845 and a peak derived from a precursor ion is detected around m/z=1172.

Here, in the LC/MS analysis, "around" is used to express changes in values of product ions and precursor ions due to the existence and absence of hydrogen ions and the existence of isotopes, and these changes in values are in an acceptable range included in similar skeletons. Note that the results in FIG. 8 show characteristics derived from [Ir(Prn3tzl-mp)$_3$](abbreviation) and therefore can be regarded as important data for identifying [Ir(Prn3tzl-mp)$_3$](abbreviation) contained in a mixture.

Figure 9A:
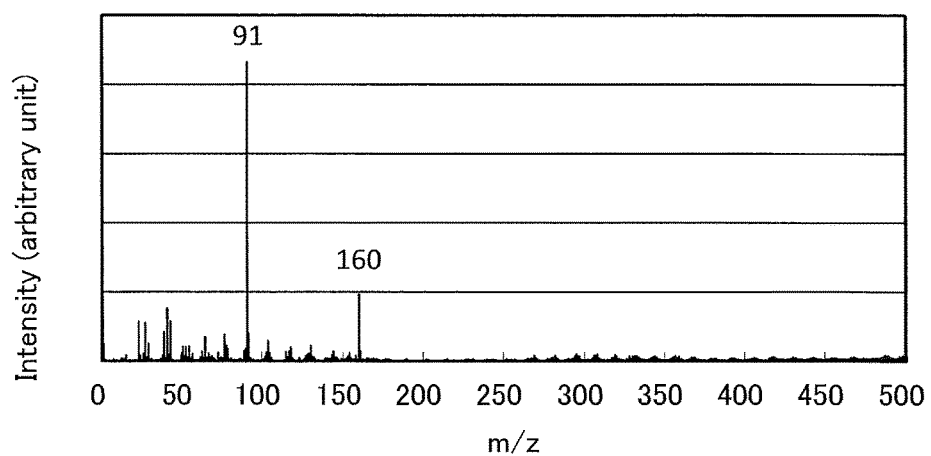
FIGS. 9A and 9B show qualitative spectra of [Ir(Prn3tzl-mp)$_3$](abbreviation) represented by the structural formula (116), which were measured by ToF-SIMS.
Figure 9B:
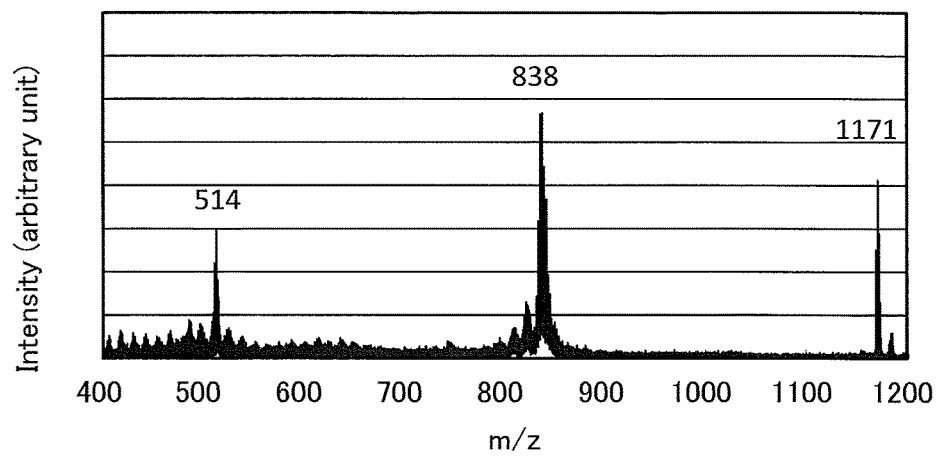

FIGS. 9A and 9B show qualitative spectra of [Ir(Prn3tzl-mp)$_3$](abbreviation) obtained in this example, which were measured with a time-of-flight secondary ion mass spectrometer (ToF-SIMS).

FIG. 9A shows the measurement results obtained from positive ions. In FIG. 9A, the horizontal axis represents m/z ranging from 0 to 500 and the vertical axis represents intensity (arbitrary unit). FIG. 9B shows the measurement results obtained from positive ions. In FIG. 9B, the horizontal axis represents m/z ranging from 400 to 1200 and the vertical axis represents intensity (arbitrary unit).

TOF SIMS 5 (produced by ION-TOF GmbH) was used as a measurement apparatus, and Bi$_3^{++}$ was used as a primary ion source. Note that irradiation with primary ions was performed in a pulsed manner with a pulse width of 11.3 ns. The irradiation amount was greater than or equal to $8.2 \times 10^{10}$ ions/cm$^2$ and less than or equal to $6.7 \times 10^{11}$ ions/cm$^2$ (or less than or equal to $1 \times 10^{12}$ ions/cm$^2$), the acceleration voltage was 25 keV, and the current value was 0.2 pA. Powder of [Ir(Prn3tzl-mp)$_3$](abbreviation) was a sample for the measurement.

The results in FIGS. 9A and 9B revealed that as for [Ir(Prn3tzl-mp)$_3$](abbreviation) that is one embodiment of the present invention, peaks of product ions of partial skeletons are detected mainly around m/z=91, around m/z=160, around m/z=514, and around m/z=838, and a peak derived from a precursor ion is detected around m/z=1171.

In the ToF-SIMS analysis, "around" is used to express changes in values of product ions and precursor ions due to the existence and absence of hydrogen ions and the existence of isotopes, and these changes in values are in an acceptable range included in similar skeletons.

The results in FIGS. 9A and 9B show characteristics derived from [Ir(Prn3tzl-mp)$_3$](abbreviation) and therefore can be regarded as important data for identifying [Ir(Prn3tzl-mp)$_3$](abbreviation) contained in a mixture. Note that the peak detected around m/z=91 is probably derived from a methylphenyl skeleton included in [Ir(Prn3tzl-mp)$_3$](abbreviation) and the peak detected around m/z=160 is probably derived from a partial skeleton in which the methylphenyl skeleton included in [Ir(Prn3tzl-mp)$_3$](abbreviation) is bonded to a 1,2,4-triazole skeleton.

The results in FIGS. 9A and 9B are results obtained when [Ir(Prn3tzl-mp)$_3$](abbreviation) was analyzed by ToF-SIMS as one mode of an organic compound. Needless to say, the results of the ToF-SIMS analysis vary depending on the structure of the organic compound. For example, in the case where the organic compound is a complex as shown in the structural formula (127) in Embodiment 1, the value of a precursor ion is likely to be smaller than that in the case of [Ir(Prn3tzl-mp)$_3$](abbreviation) described in this example. In view of the above, the precursor ion is preferably detected in the range of m/z=600 to m/z=2000. In the case where the skeleton bonded to the 1,2,4-triazole skeleton is a phenyl skeleton, product ions are detected around m/z=76. In the case of a composite skeleton in which a biphenyl skeleton, an alkyl group, and a methylphenyl skeleton are bonded to the 1,2,4-triazole skeleton, product ions derived from the composite skeleton are detected around m/z=300.

Portions which easily dissociate from a precursor ion are detected as product ions in ToF-SIMS analysis. Examples of the product ions which are particularly easy to detect include a product ion in which the 1,2,4-triazole skeleton is bonded to the phenyl skeleton and a product ion of the phenyl skeleton. Thus, the difference between the above two kinds of product ions corresponds to the molecular mass (69) of the 1,2,4-triazole skeleton.

Next, an analysis of [Ir(Prn3tzl-mp)$_3$](abbreviation) obtained in this example was conducted by infrared absorption spectroscopy (hereinafter, IR analysis). For the measurement of an IR spectrum, Fourier transform infrared spectroscopy (Nexus 670 manufactured by Thermo Nicolet) was employed. As the infrared absorption spectroscopy (IR analysis), a pellet method in which a sample and pure alkali halide through which infrared rays pass (e.g., potassium bromide, sodium chloride, and potassium chloride) are pulverized, mixed, and molded by application of pressure, or a liquid membrane technique in which a sample is mixed with liquid (e.g., liquid paraffin) having an absorption spectrum which does not affect the absorption band to be measured to form a paste may be employed. Note that in this example, a pellet method using potassium bromide was employed for the measurement.

Figure 28:
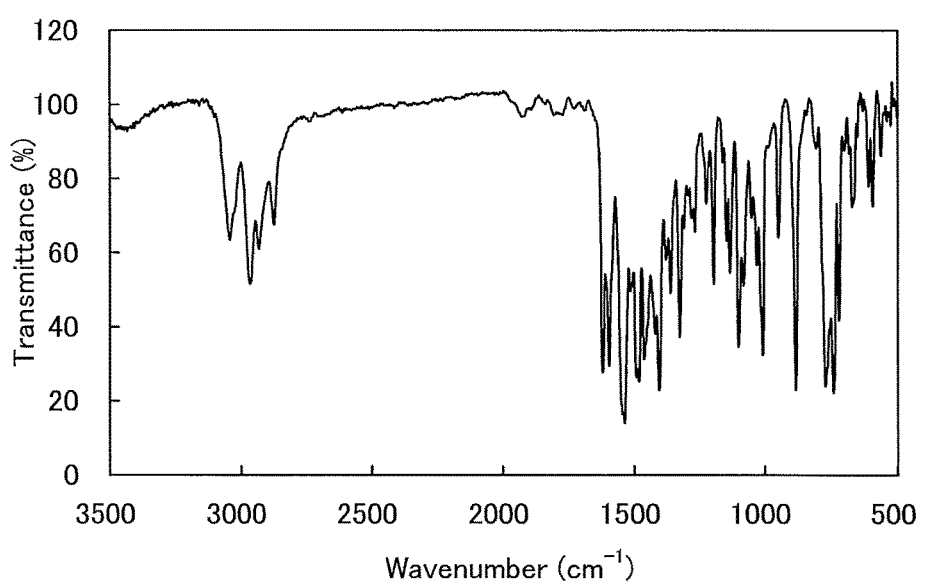
FIG. 28 is an IR chart of [Ir(Prn3tzl-mp)$_3$](abbreviation) represented by the structural formula (116).

FIG. 28 shows results of the IR analysis. The results in FIG. 28 revealed that the absorption peaks of [Ir(Prn3tzl-mp)$_3$](abbreviation) obtained in this example were detected between 3500 cm$^{-1}$ to 1500 cm$^{-1}$, mainly around 3030 cm$^{-1}$, 1600 cm$^{-1}$, and 1540 cm$^-$. As shown in FIG. 28, absorption peaks derived from an alkyl group, and the like are observed in addition to the above-described absorption peaks.

In the IR analysis, "around" is used to mean that absorption peaks which are +30 cm$^{-1}$ from the values given above are in an acceptable range. This is because influence of an absorption band due to a solvent or measurement errors are generated in the IR analysis. Note that the IR analysis indicates that the absorption peaks detected around 3030 cm$^{-1}$, around 1600 cm$^{-1}$, and around 1540 cm$^{-1}$ are signals from C—H stretch vibration, C—C stretch vibration, and C=N stretch vibration, respectively. FIG. 28 shows that the absorption peak detected around 1540 cm$^{-1}$ is particularly detected noticeably. The results in FIG. 28 show characteristics derived from [Ir(Prn3tzl-mp)$_3$](abbreviation) and therefore can be regarded as important data for identifying [Ir(Prn3tzl-mp)$_3$](abbreviation) contained in a mixture.

Figure 10:
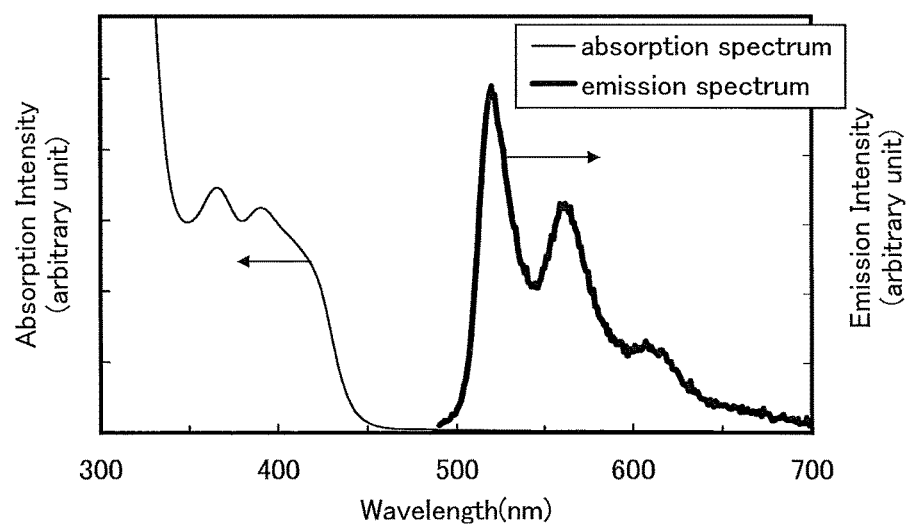
FIG. 10 shows an ultraviolet-visible absorption spectrum and an emission spectrum of [Ir(Prn3tzl-mp)$_3$](abbreviation) represented by the structural formula (116) in a dichloromethane solution.

Next, an ultraviolet-visible absorption spectrum (hereinafter, simply referred to as absorption spectrum) and an emission spectrum of [Ir(Prn3tzl-mp)$_3$](abbreviation) in a dichloromethane solution were measured. The absorption spectrum was measured with the use of an ultraviolet-visible light spectrophotometer (V550, manufactured by JASCO Corporation) in the state where a dichloromethane solution (0.087 mmol/L) was put in a quartz cell at room temperature. The emission spectrum was measured with the use of a fluorescence spectrophotometer (FS920, manufactured by Hamamatsu Photonics Corporation) in the state where the degassed dichloromethane solution (0.087 mmol/L) was put in a quartz cell at room temperature. FIG. 10 shows measurement results of the absorption spectrum and emission spectrum. In FIG. 10, the horizontal axis represents wavelength and the vertical axis represents absorption intensity and emission intensity. In FIG. 10, two solid lines are shown; a thin line represents the absorption spectrum, and a thick line represents the emission spectrum. Note that the absorption spectrum in FIG. 10 is a result obtained by subtraction of a measured absorption spectrum of only dichloromethane that was put in a quartz cell from the measured absorption spectrum of the dichloromethane solution (0.087 mmol/L) in a quartz cell.

As shown in FIG. 10, [Ir(Prn3tzl-mp)$_3$](abbreviation) has emission peaks at 520 nm and 562 nm, and yellow light was observed from the dichloromethane solution.

Example 2

Synthesis Example 2

In this example, a synthesis example of tris{4-phenyl-2-[1-(2-methylphenyl)-5-propyl-1H-1,2,4-triazol-3-yl-κN4]phenyl-κC}iridium(III) (another name: tris [3-(3-biphenyl)-1-(2-methylphenyl)-5-propyl-1H-1,2,4-triazolato]iridium (III)) (abbreviation: [Ir(Pr5b3tzl-mp)$_3$]) represented by the structural formula (118) in Embodiment 1 is specifically described. The structure of [Ir(Pr5b3tzl-mp)$_3$](abbreviation) is shown below.

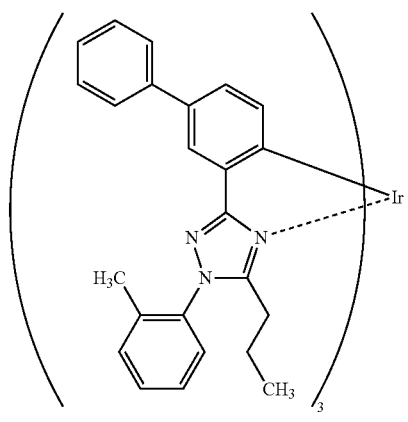

[Ir(Pr5b3tzl-mp)$_3$]

Step 1: Synthesis of N-(1-ethoxy-3-bromobenzylidene)butyramide

First, 10 g of ethyl 3-bromobenzimidate hydrochloride, 100 mL of toluene, and 8.9 g of triethylamine (Et$_3$N) were put into a 300-mL three-neck flask and the mixture was stirred at room temperature for 10 minutes. With a 50-mL dropping funnel, a mixed solution of 4.7 g of butyryl chloride and 30 mL of toluene was added dropwise to this mixture, and the mixture was stirred at room temperature for 24 hours. After a predetermined time elapsed, the reaction mixture was suction-filtered, and the filtrate was concentrated to give N-(1-ethoxy-3-bromobenzylidene)butyramide (a yellow oily substance, a yield of 93%). The synthesis scheme of Step 1 is shown in (B-1).

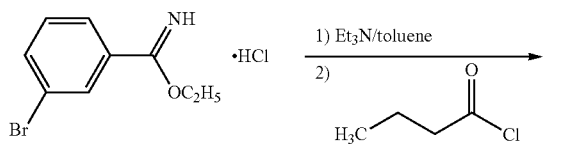

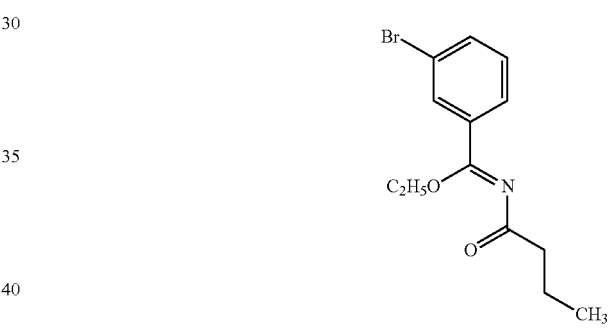

Step 2: Synthesis of 3-(3-bromophenyl)-1-(2-methylphenyl)-5-propyl-1H-1,2,4-triazole Next, 6.5 g of o-tolyl hydrazine hydrochloride and 100 mL of carbon tetrachloride were put into a 200-mL three-neck flask, 4.1 g of triethylamine (Et$_3$N) was added dropwise to this mixture little by little, and the mixture was stirred at room temperature for 1 hour. After a predetermined time elapsed, 12 g of N-(1-ethoxy-3-bromobenzylidene) butyramide obtained in Step 1 above was added to the mixture, and the mixture was stirred at room temperature for 48 hours. After the reaction, water was added to the reaction mixture and the aqueous layer was subjected to extraction with chloroform. The organic layer and the obtained solution of the extract were combined and washed with water and saturated saline. Anhydrous magnesium sulfate was added to the organic layer for drying and the obtained mixture was concentrated to give an oily substance. The obtained oily substance was purified by flash column chromatography. As the developing solvent, a mixed solvent of hexane and ethyl acetate in a ratio of 5:1 (v/v) was used. The obtained fraction was concentrated to give 3-(3-bromophenyl)-1-(2-methylphenyl)-5-propyl-1H-1,2,4-triazole (a red oily substance, a yield of 80%). The synthesis scheme of Step 2 is shown in (B-2).

trated, yielding oily compound. This oily substance was purified by flash column chromatography. As the developing solvent, a mixed solvent of hexane and ethyl acetate in a ratio of 5:1 (v/v) was used. The obtained fraction was concentrated, so that 3-(3-biphenyl)-1-(2-methylphenyl)-5-propyl-1H-1,2,4-triazole (abbreviation: HPr5b3tzl-mp) was obtained (a pale yellow oily substance, a yield of 84%). The synthesis scheme of Step 3 is shown in (B-3).

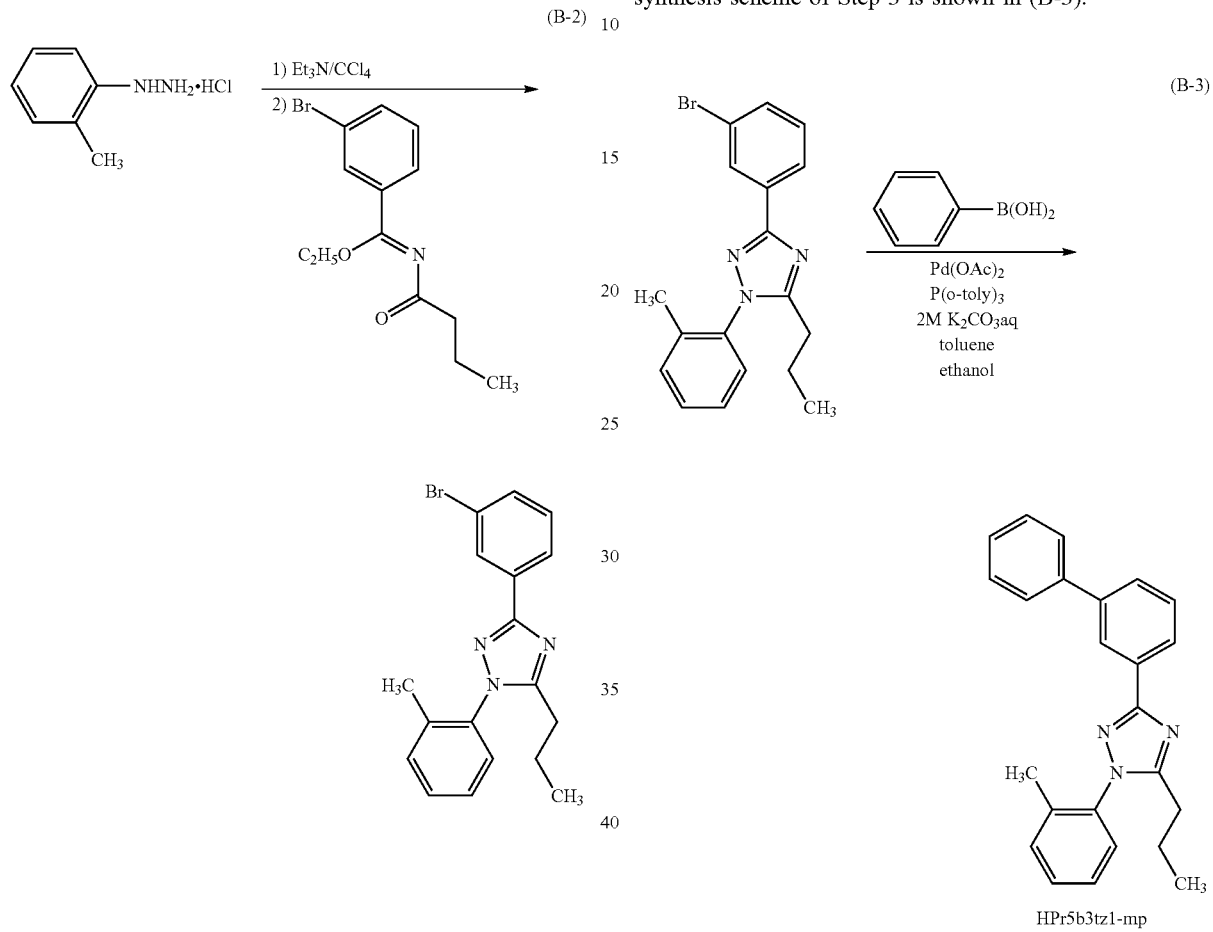

Step 3: Synthesis of 3-(3-biphenyl)-1-(2-methylphenyl)-5-propyl-1H-1,2,4-triazole (abbreviation: HPr5b3tzl-mp)

Next, 12 g of 3-(3-bromophenyl)-1-(2-methylphenyl)-5-propyl-1H-1,2,4-triazole obtained in Step 2 above, 4.8 g of phenylboronic acid, 0.30 g of tri(ortho-tolyl)phosphine, 100 mL of toluene, 15 mL of ethanol, and 39 mL of 2M aqueous solution of potassium carbonate were put into a 200-mL three-neck flask, and the air in the flask was replaced with nitrogen. To this mixture was added 0.073 g (0.33 mmol) of palladium(II) acetate, and the mixture was heated and stirred at 80° C. for 10 hours. The aqueous layer of the obtained reacted solution was subjected to extraction with toluene, and the obtained solution of the extract and the organic layer were combined and washed with a saturated aqueous solution of sodium hydrogen carbonate and saturated saline. Anhydrate magnesium sulfate was added to the organic layer for drying, and the resulting mixture was gravity-filtered to give filtrate. The obtained filtrate was concen-

Step 4: Synthesis of di-μ-chloro-tetrakis{4-phenyl-2-[1-(2-methylphenyl)-5-propyl-1H-1,2,4-triazol-3-yl-N 4]phenyl-κC}diiridium(III) (abbreviation: [Ir(Pr5b3tzl-mp)₂Cl]₂)

Next, 1.5 g of HPr5b3tzl-mp which is the ligand obtained in Step 3 above, 0.61 g of iridium chloride hydrate, 12 mL of 2-ethoxyethanol, and 4 mL of water were put into a 50-mL recovery flask and the air in the flask was replaced with argon. This reaction container was subjected to microwaves under conditions of 100 W and 100° C. for 1.5 hour to cause a reaction. The obtained reaction mixture was suction-filtered and the obtained solid was washed with ethanol to give a dinuclear complex [Ir(Pr5b3tzl-mp)₂Cl]₂ (abbreviation) (yellow brown powder, a yield of 8.4%). The synthesis scheme of Step 4 is shown in (B-4).

(B-4)

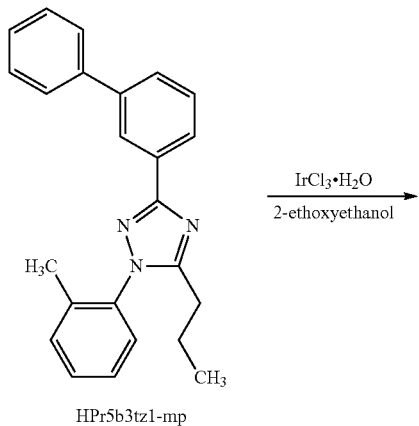

HPr5b3tz1-mp

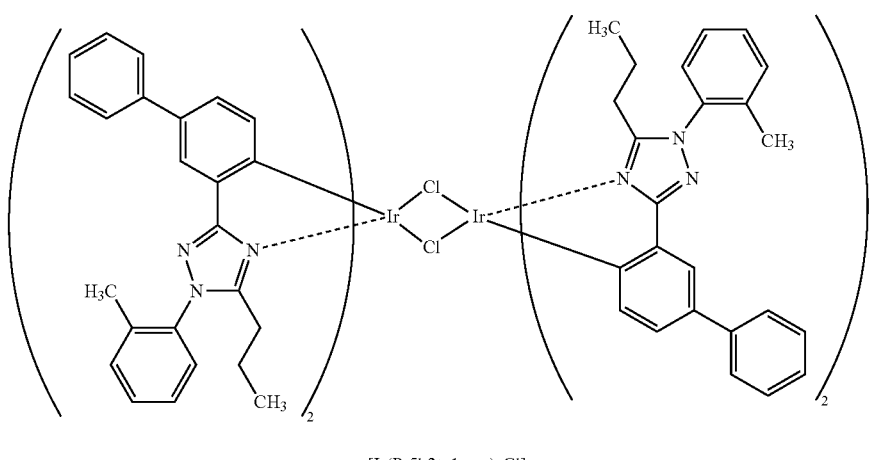

[Ir(Pr5b3tz1-mp)₂Cl]₂

Step 5: Synthesis of tris {4-phenyl-2-[1-(2-methylphenyl)-5-propyl-1H-1,2,4-triazol-3-yl-N4]phenyl-κC}iridium(III) (abbreviation: [Ir(Pr5b3tzl-mp)₃])

Next, 0.60 g of [Ir(Pr5b3tzl-mp)₂Cl]₂ (abbreviation) which is the dinuclear complex obtained in Step 4 above, 1.7 g of HPr5b3tzl-mp which is the ligand, and 0.39 g of silver trifluoromethanesulfonate (TfOAg) were put into a reaction container provided with a three-way cock and a cold tube, and the mixture was heated and stirred in a nitrogen atmosphere at 170° C. for 42 hours. The obtained reaction mixture was dissolved in dichloromethane and insoluble solids were removed. The obtained filtrate was washed with water and saturated saline, and anhydrous magnesium sulfate was then added to the organic layer for drying. The obtained mixture was subjected to gravity filtration, and the filtrate was concentrated to give a solid. This solid was purified by silica gel column chromatography. As the developing solvent, a mixed solvent of dichloromethane and hexane in a ratio of 2:1 (v/v) was used. The obtained fraction was condensed to obtain a solid. This solid was recrystallized with a mixed solvent of dichloromethane and ethanol to give [Ir(Pr5b3tzl-mp)₃](abbreviation), the organometallic complex of one embodiment of the present invention (pale yellow powder, a yield of 48%). The synthetic scheme of Step 5 is shown in (B-5).

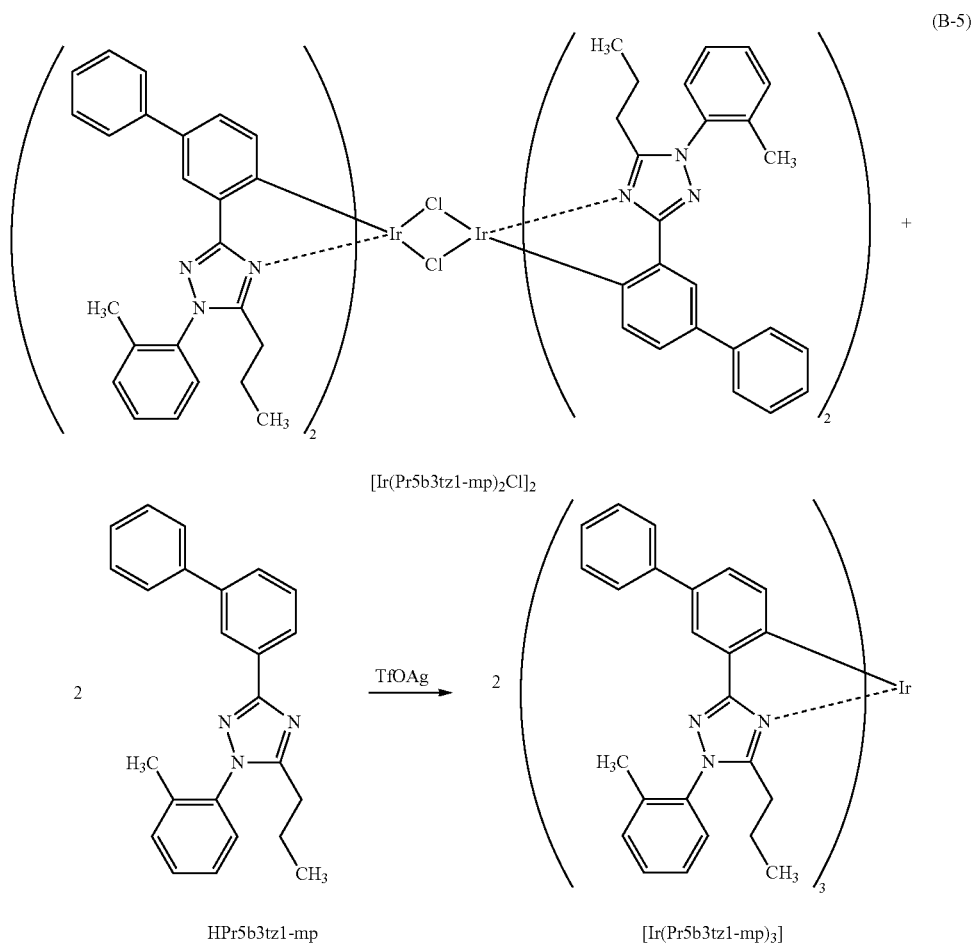

Figure 11:
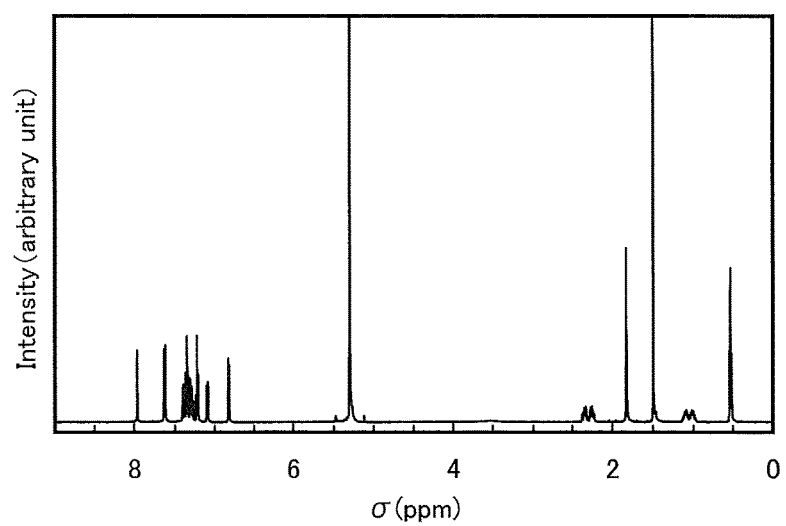
FIG. 11 is a $^1$H NMR chart of tris{4-phenyl-2-[1-(2-methylphenyl)-5-propyl-1H-1,2,4-triazol-3-yl-κN4]phenyl-κC}iridium(III) ([Ir(Pr5b3tzl-mp)$_3$](abbreviation)) represented by a structural formula (118).

An analysis result by nuclear magnetic resonance spectroscopy ($^1$H NMR) of the pale yellow powder prepared in Step 5 described above is shown below. FIG. 11 is the $^1$H NMR chart. The results revealed that [Ir(Pr5b3tzl-mp)$_3$] (abbreviation) represented by the structural formula (118) was obtained in Synthesis Example 2.

The following is the $^1$H NMR data of the obtained substance: $^1$H NMR. δ (CD$_2$Cl$_2$): 0.54 (t, 9H), 0.99-1.14 (m, 6H), 1.83 (s, 9H), 2.22-2.38 (m, 6H), 6.82 (d, 3H), 7.09 (dd, 3H), 7.21-7.23 (t, 6H), 7.27-7.41 (m, 15H), 7.62 (d, 6H), 7.97 (d, 3H).

Next, [Ir(Pr5b3tzl-mp)$_3$](abbreviation) obtained in this example was analyzed by liquid chromatography mass spectrometry (LC/MS).

The LC/MS analysis was carried out with Acquity UPLC (produced by Waters Corporation) and Xevo G2 T of MS (produced by Waters Corporation).

In the MS analysis, ionization was carried out by an electrospray ionization (ESI) method. At this time, the capillary voltage and the sample cone voltage were set to 3.0 kV and 30 V, respectively, and detection was performed in a positive mode. A component which underwent the ionization under the above-described conditions was made to collide with an argon gas in a collision cell to dissociate into product ions. The energy (collision energy) for the collision with argon was 70 eV. The mass range for the measurement was m/z=100 to 1300.

Figure 12:
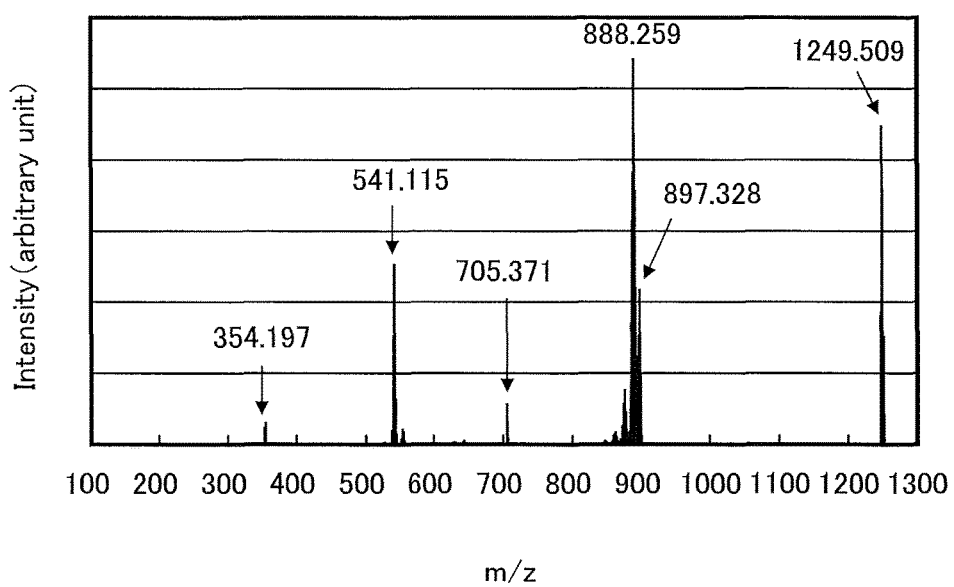
FIG. 12 shows results of LC/MS analysis of [Ir(Pr5b3tzl-mp)$_3$](abbreviation) represented by the structural formula (118).

FIG. 12 shows results of the MS analysis. The results in FIG. 12 revealed that as for [Ir(Pr5b3tzl-mp)$_3$](abbreviation) that is one embodiment of the present invention, peaks of product ions are detected mainly around m/z=354, around m/z=541, around m/z=705, around m/z=888, and around m/z=897 and a peak derived from a precursor ion is detected around m/z=1249.

Here, in the LC/MS analysis, "around" is used to express changes in values of product ions and precursor ions due to the existence and absence of hydrogen ions and the existence of isotopes, and these changes in values are in an acceptable range included in similar skeletons. Note that the results in FIG. 12 show characteristics derived from [Ir(Pr5b3tzl-mp)$_3$](abbreviation) and therefore can be regarded as important data for identifying [Ir(Pr5b3tzl-mp)$_3$](abbreviation) contained in a mixture.

Figure 13A:
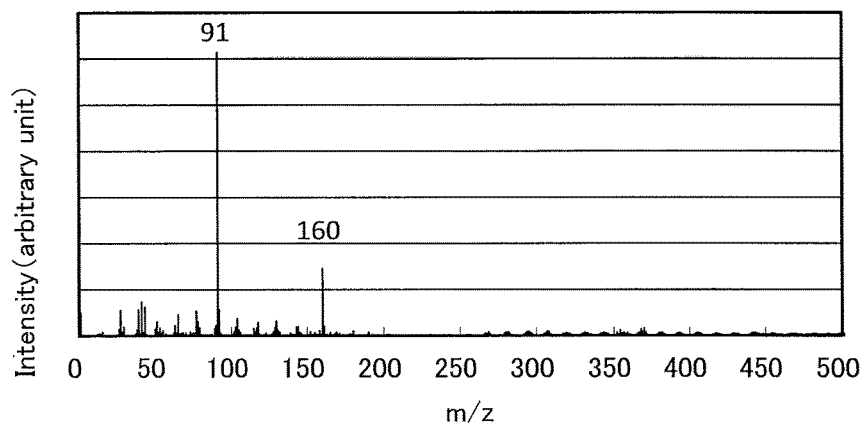
FIGS. 13A and 13B show qualitative spectra of [Ir(Pr5b3tzl-mp)$_3$](abbreviation) represented by the structural formula (118) measured by ToF-SIMS.
Figure 13B:
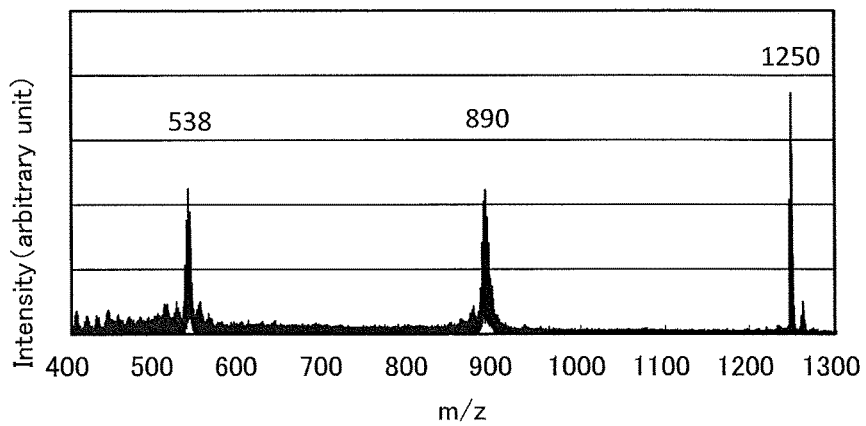

Further, [Ir(Pr5b3tzl-mp)$_3$](abbreviation) that is one embodiment of the present invention was measured with a time-of-flight secondary ion mass spectrometer (ToF-SIMS); FIGS. 13A and 13B show the obtained qualitative spectra.

FIG. 13A shows the measurement results obtained from positive ions. In FIG. 13A, the horizontal axis represents m/z ranging from 0 to 500 and the vertical axis represents intensity (arbitrary unit). FIG. 13B shows the measurement results obtained from positive ions. In FIG. 13B, the horizontal axis represents m/z ranging from 400 to 1300 and the vertical axis represents intensity (arbitrary unit).

TOF SIMS 5 (produced by ION-TOF GmbH) was used as a measurement apparatus, and Bi$_3^{++}$ was used as a primary ion source. Note that irradiation with primary ions was performed in a pulsed manner with a pulse width of 11.3 ns. The irradiation amount was greater than or equal to $8.2 \times 10^{10}$ ions/cm$^2$ and less than or equal to $6.7 \times 10^{11}$ ions/cm$^2$ (or less than or equal to $1 \times 10^{12}$ ions/cm$^2$), the acceleration voltage was 25 keV, and the current value was 0.2 pA. Powder of [Ir(Pr5b3tzl-mp)₃](abbreviation) was a sample for the measurement.

The results in FIGS. 13A and 13B revealed that as for [Ir(Pr5b3tzl-mp)₃](abbreviation) that is one embodiment of the present invention, peaks of product ions of partial skeletons are detected mainly around m/z=91, around m/z=160, around m/z=538, and around m/z=890, and a peak derived from a precursor ion is detected around m/z=1250.

In the ToF-SIMS analysis, "around" is used to express changes in values of product ions and precursor ions due to the existence and absence of hydrogen ions and the existence of isotopes, and these changes in values are in an acceptable range included in similar skeletons.

The results in FIGS. 13A and 13B show characteristics derived from [Ir(Pr5b3tzl-mp)₃](abbreviation) and therefore can be regarded as important data for identifying [Ir(Pr5b3tzl-mp)₃](abbreviation) contained in a mixture. Note that the peak detected around m/z=91 is probably derived from a methylphenyl skeleton included in [Ir(Pr5b3tzl-mp)₃](abbreviation) and the peak detected around m/z=160 is probably derived from a partial skeleton in which a methylphenyl skeleton included in [Ir(Pr5b3tzl-mp)₃](abbreviation) is bonded to a 1,2,4-triazole skeleton.

Next, an analysis of [Ir(Pr5b3tzl-mp)₃](abbreviation) obtained in this example was conducted by infrared absorption spectroscopy (hereinafter, IR analysis). For the measurement of an IR spectrum, Fourier transform infrared spectroscopy (Nexus 670 manufactured by Thermo Nicolet) and a pellet method using potassium bromide were employed.

Figure 29:
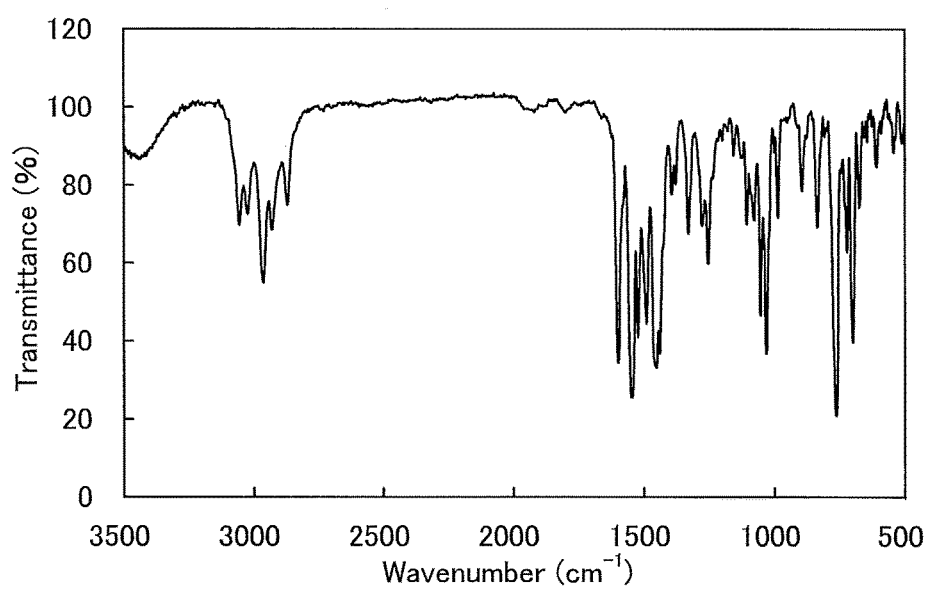
FIG. 29 is an IR chart of [Ir(Pr5b3tzl-mp)$_3$](abbreviation) represented by the structural formula (118).

FIG. 29 shows results of the IR analysis. The results in FIG. 29 revealed that the absorption peaks of [Ir(Pr5b3tzl-mp)₃](abbreviation) obtained in this example were detected between 3500 cm$^{-1}$ to 1500 cm$^{-1}$, mainly around 3030 cm$^{-1}$, around 1600 cm$^{-1}$, and around 1540 cm$^{-1}$. As shown in FIG. 29, absorption peaks derived from an alkyl group, and the like are observed in addition to the above-described absorption peaks.

In the IR analysis, "around" is used to mean that absorption peaks which are ±30 cm$^{-1}$ from the values given above are in an acceptable range. This is because influence of an absorption band due to a solvent or measurement errors are included in the IR analysis. Note that the absorption peaks detected around 3030 cm$^{-1}$, around 1600 cm$^{-1}$, and around 1540 cm$^{-1}$ are probably signals from C—H stretch vibration, C—C stretch vibration, and C=N stretch vibration, respectively. FIG. 29 shows that the absorption peak detected around 1540 cm$^{-1}$ is particularly detected noticeably. The results in FIG. 29 show characteristics derived from [Ir(Pr5b3tzl-mp)₃] (abbreviation) and therefore can be regarded as important data for identifying [Ir(Pr5b3tzl-mp)₃] (abbreviation) contained in a mixture.

Figure 14:
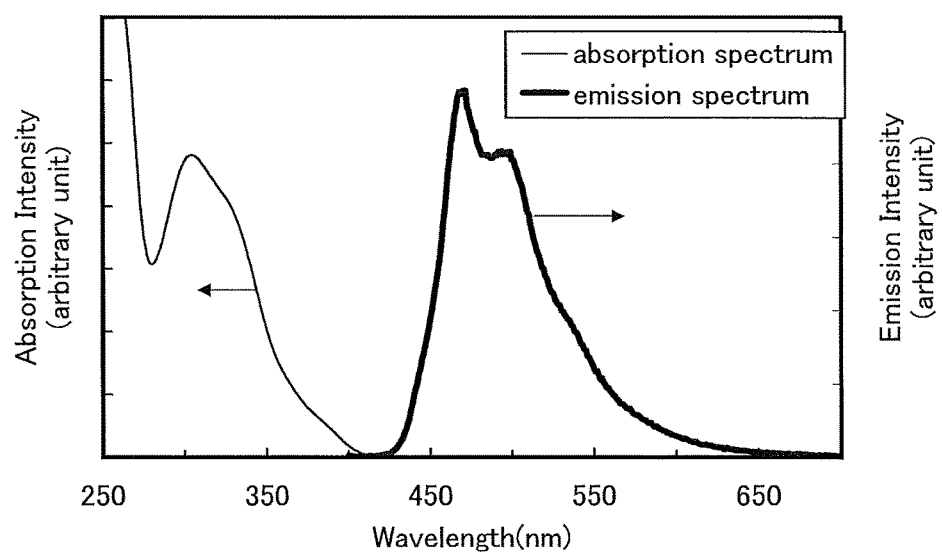
FIG. 14 shows an ultraviolet-visible absorption spectrum and an emission spectrum of [Ir(Pr5b3tzl-mp)$_3$](abbreviation) represented by the structural formula (118) in a dichloromethane solution.

Next, an ultraviolet-visible absorption spectrum (hereinafter, simply referred to as absorption spectrum) and an emission spectrum of [Ir(Pr5b3tzl-mp)₃](abbreviation) in a dichloromethane solution were measured. The absorption spectrum was measured with the use of an ultraviolet-visible light spectrophotometer (V550, manufactured by Japan Spectroscopy Corporation) in the state where the dichloromethane solution (0.041 mmol/L) was put in a quartz cell at room temperature. The emission spectrum was measured with the use of a fluorescence spectrophotometer (FS920, manufactured by Hamamatsu Photonics Corporation) in the state where the degassed dichloromethane solution (0.041 mmol/L) was put in a quartz cell at room temperature. FIG. 14 shows measurement results of the absorption spectrum and emission spectrum. In FIG. 14, the horizontal axis represents wavelength and the vertical axis represents absorption intensity and emission intensity. In FIG. 14, two solid lines are shown; a thin line represents the absorption spectrum, and a thick line represents the emission spectrum. Note that the absorption spectrum in FIG. 14 is a result obtained by subtraction of the absorption spectrum of only dichloromethane that was put in a quartz cell from the measured absorption spectrum of the dichloromethane solution (0.041 mmol/L) in a quartz cell.

As shown in FIG. 14, [Ir(Pr5b3tzl-mp)₃](abbreviation) has emission peaks at 469 nm and 497 nm, and light-blue light was observed from the dichloromethane solution.

Example 3

In this example, a light-emitting element 1 which includes a light-emitting layer containing the organic compound which is described in Embodiment 1 and Example 1 and is represented by the structural formula (116) was evaluated. Chemical formulae of materials used in this example are shown below.

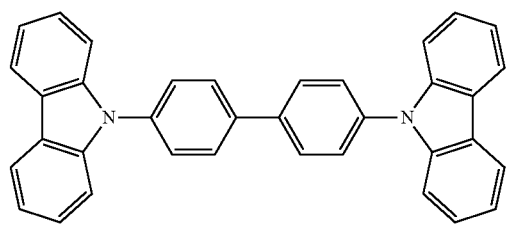

CBP

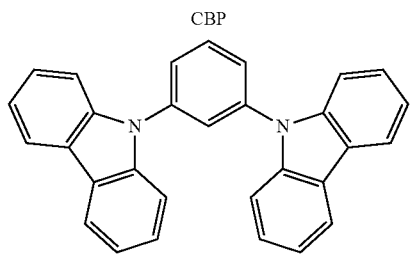

mCP

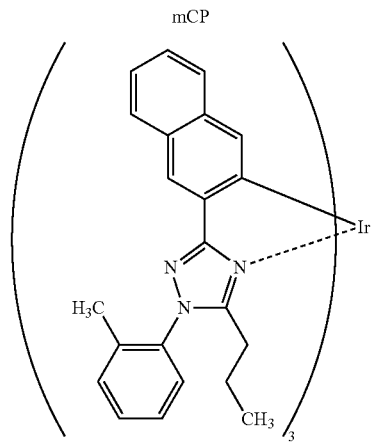

Ir(Prn3tz1-mp)₃

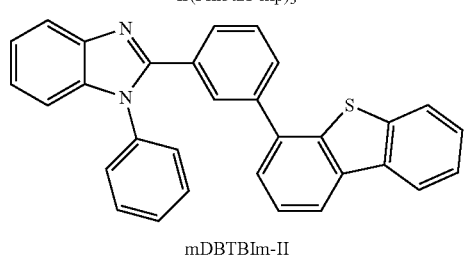

mDBTBIm-II

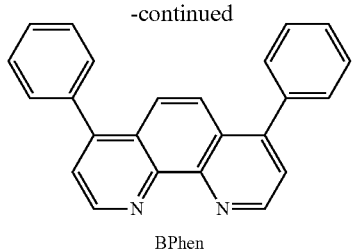

BPhen

Figure 15:
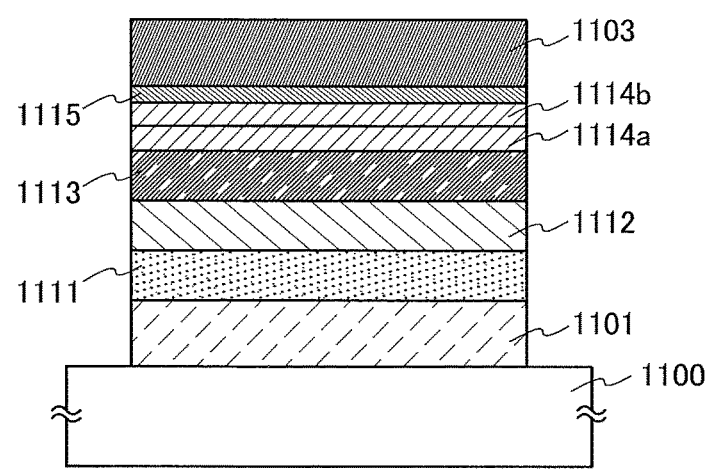
FIG. 15 illustrates a light-emitting element of Example.

The light-emitting element 1 is described with reference to FIG. 15. A method for manufacturing the light-emitting element 1 of this example is described below.

(Light-Emitting Element 1)

First, an indium oxide-tin oxide compound containing silicon or silicon oxide (ITO-SiO$_2$, hereinafter abbreviated to ITSO) was deposited by a sputtering method over a substrate 1100, so that a first electrode 1101 was formed. Note that the composition ratio of In$_2$O$_3$ to SnO$_2$ and SiO$_2$ in the target used was 85:10:5 [wt %]. The thickness of the first electrode 1101 was 110 nm and the electrode area was 2 mm×2 mm. Here, the first electrode 1101 is an electrode that functions as an anode of the light-emitting element.

Next, as pretreatment for forming the light-emitting element over the substrate 1100, the surface of the substrate was washed, baked at 200° C. for 1 hour, and subjected to UV ozone treatment for 370 seconds.

After that, the substrate 1100 was transferred into a vacuum evaporation apparatus where the pressure had been reduced to approximately 10$^{-4}$ Pa, and subjected to vacuum baking at 170° C. for 30 minutes in a heating chamber of the vacuum evaporation apparatus, and then the substrate 1100 was cooled down for about 30 minutes.

Next, the substrate 1100 provided with the first electrode 1101 was fixed to a substrate holder in the vacuum evaporation apparatus so that a surface on which the first electrode 1101 was provided faced downward. The pressure in the vacuum evaporation apparatus was reduced to about 10$^{-4}$ Pa. Then, on the first electrode 1101, 4,4'-di(N-carbazolyl)biphenyl (abbreviation: CBP) and molybdenum oxide were deposited by co-evaporation, whereby a hole-injection layer 1111 was formed. The thickness of the hole-injection layer 1111 was 60 nm, and the weight ratio of CBP (abbreviation) to molybdenum oxide was adjusted to 4:2 (=CBP: molybdenum oxide). Note that the co-evaporation method refers to an evaporation method in which evaporation is carried out from a plurality of evaporation sources at the same time in one treatment chamber.

Next, on the hole-injection layer 1111, a film of 1,3-bis(N-carbazolyl)benzene (abbreviation: mCP) was formed to a thickness of 20 nm, whereby a hole-transport layer 1112 was formed.

Further, mCP (abbreviation) and [Ir(Prn3tzl-mp)$_3$](abbreviation) synthesized in Example 1 were deposited by co-evaporation, whereby a light-emitting layer 1113 was formed on the hole-transport layer 1112. Here, the weight ratio of mCP (abbreviation) to [Ir(Prn3tzl-mp)$_3$](abbreviation) was adjusted to 1:0.06 (=mCP: [Ir(Prn3tzl-mp)$_3$]). The thickness of the light-emitting layer 1113 was set to 30 nm.

Note that [Ir(Prn3tzl-mp)$_3$](abbreviation) is a guest material (dopant) in the light-emitting layer 1113.

Next, on the light-emitting layer 1113, a film of 2-[3-(dibenzothiophen-4-yl)phenyl]-1-phenyl-1H-benzimidazole (abbreviation: mDBTBIm-II) was formed to a thickness of 20 nm, whereby a first electron-transport layer 1114a was formed.

After that, on the first electron-transport layer 1114a, a film of bathophenanthroline (abbreviation: BPhen) was formed to a thickness of 15 nm, whereby a second electron-transport layer 1114b was formed.

Further, a film of lithium fluoride (LiF) was formed to a thickness of 1 nm over the second electron-transport layer 1114b by evaporation, whereby an electron-injection layer 1115 was formed.

Lastly, a film of aluminum was formed to a thickness of 200 nm by evaporation, whereby second electrode 1103 functioning as a cathode was formed. Thus, the light-emitting element 1 of this example was manufactured.

Table 1 shows an element structure of the light-emitting element 1 obtained as described above.

TABLE 1

|  | First electrode | Hole-injection layer | Hole-transport layer | Light-emitting layer | First electron-transport layer | Second electron-transport layer | Electron-injection layer | Second electrode |
| --- | --- | --- | --- | --- | --- | --- | --- | --- |
| Light-emitting element 1 | ITSO 110 nm | CBP:MoOx (=4:2) 60 nm | mCP 20 nm | mCP:Ir(Prn3tzl-mp)$_3$ (=1:0.06) 30 nm | mDBTBIm-II 20 nm | BPhen 15 nm | LiF 1 nm | Al 200 nm |

Then, in a glove box containing a nitrogen atmosphere, the light-emitting element 1 was sealed so as not to be exposed to the air (specifically, a sealant was applied onto an outer edge of the element and heat treatment was performed at 80° C. for 1 hour at the time of sealing). After that, operation characteristics of the light-emitting element 1 were measured. Note that the measurement was carried out at room temperature (in an atmosphere kept at 25° C.).

Figure 16:
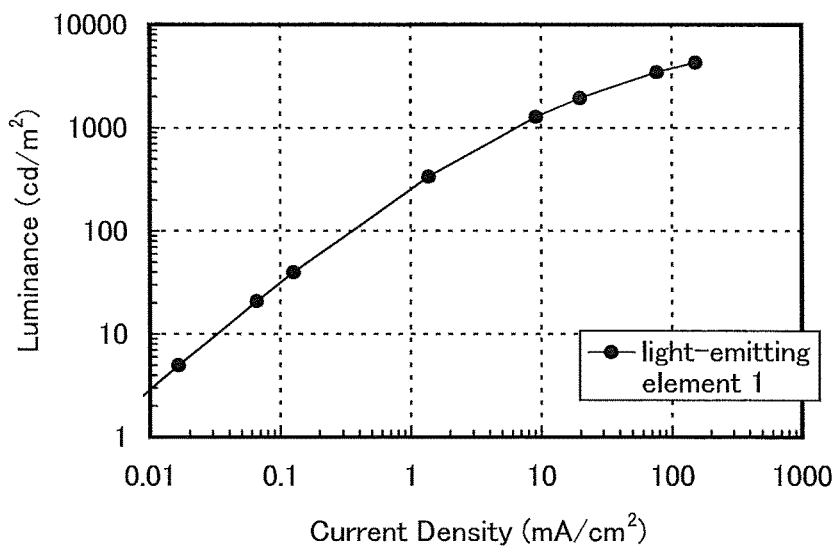
FIG. 16 shows luminance-current density characteristics of a light-emitting element 1.
Figure 17:
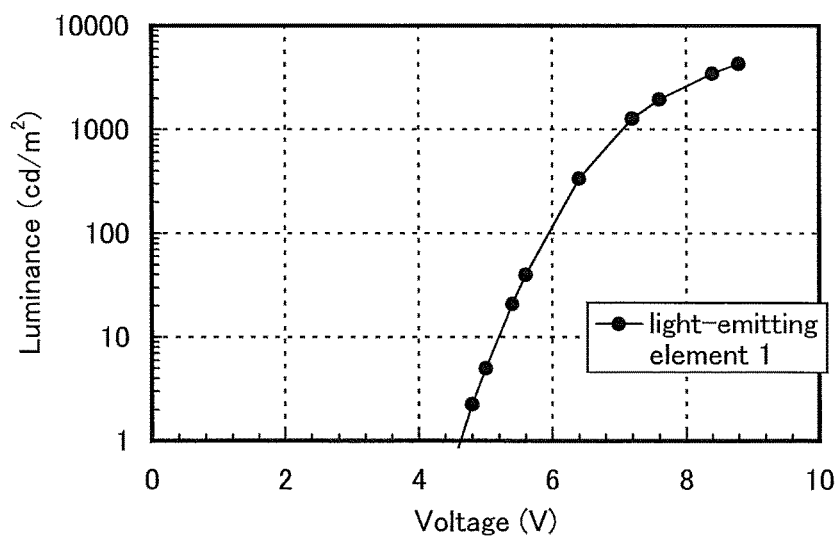
FIG. 17 shows luminance-voltage characteristics of the light-emitting element 1.
Figure 18:
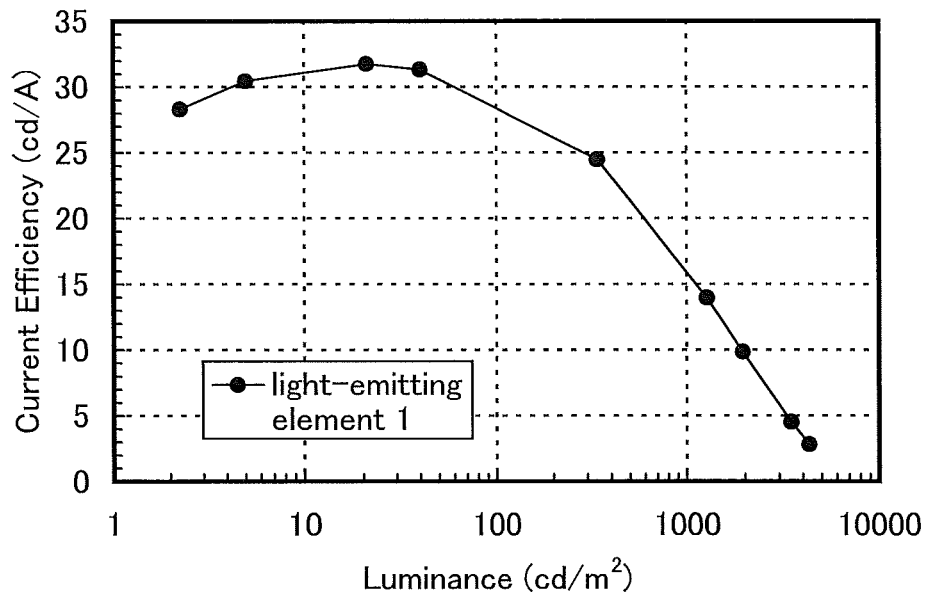
FIG. 18 shows current efficiency-luminance characteristics of the light-emitting element 1.
Figure 19:
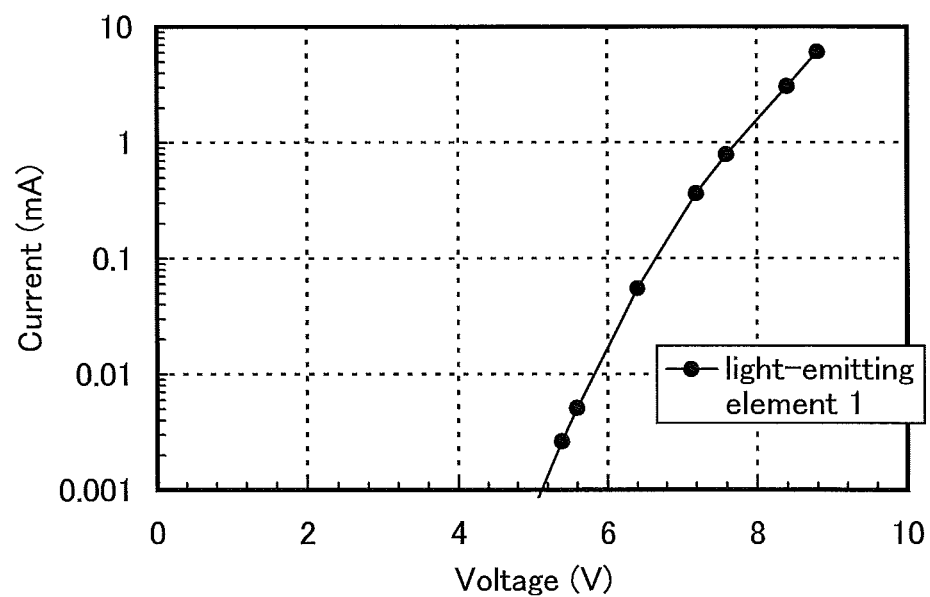
FIG. 19 shows current characteristics-voltage of the light-emitting element 1.

FIG. 16 shows the current density-luminance characteristic of the light-emitting element 1. In FIG. 16, the horizontal axis represents current density (mA/cm$^2$) and the vertical axis represents luminance (cd/m$^2$). FIG. 17 shows the voltage-luminance characteristics of the light-emitting element 1. In FIG. 17, the horizontal axis represents voltage (V) and the vertical axis represents luminance (cd/m$^2$). FIG. 18 shows the luminance-current efficiency characteristics of the light-emitting element 1. In FIG. 18, the horizontal axis represents luminance (cd/m$^2$) and the vertical axis represents current efficiency (cd/A). FIG. 19 shows the voltage-current characteristics of the light-emitting element 1. In FIG. 19, the horizontal axis represents voltage (V) and the vertical axis represents current (mA).

FIG. 16 and FIG. 18 show that the light-emitting element 1 has high efficiency. Further, FIG. 16, FIG. 17, and FIG. 19 show that the light-emitting element 1 has low driving voltage and low power consumption.

Next, Table 2 shows the voltage (V), current density (mA/cm$^2$), CIE chromaticity coordinates (x, y), luminance (cd/m$^2$), current efficiency (cd/A), and external quantum efficiency (%) of the light-emitting element 1 at a luminance of 1275 cd/m$^2$

TABLE 2

| | Voltage | Current density | CIE chromaticity coordinates | | Luminance | Current efficiency | External quantum |
|---|---|---|---|---|---|---|---|
| | (V) | (mA/cm$^2$) | x | y | (cd/m$^2$) | (cd/A) | efficiency (%) |
| Light-emitting element 1 | 7.2 | 9.1 | 0.37 | 0.61 | 1275 | 14 | 4.2 |

Figure 20:
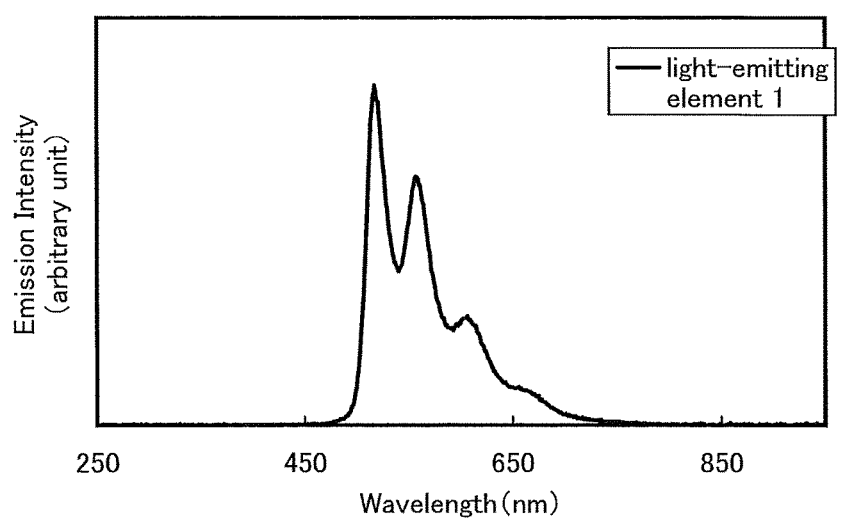
FIG. 20 shows an emission spectrum of the light-emitting element 1.

FIG. 20 shows an emission spectrum at a current density of the light-emitting element 1 of 2.5 mA/cm$^2$. As shown in FIG. 20, the emission spectrum of the light-emitting element 1 has peaks at 517 nm, 557 nm, and 609 nm.

In addition, as shown in Table 2, the CIE chromaticity coordinates of the light-emitting element 1 were (x, y)= (0.37, 0.61) at a luminance of 1275 cd/m$^2$. These results show that light originating from the dopant was obtained.

As described above, the light-emitting element 1 in which [Ir(Prn3tzl-mp)$_3$](abbreviation) was used for the light-emitting layer can efficiently emit light in the blue-green range. This indicates that [Ir(Prn3tzl-mp)$_3$](abbreviation) can be favorably used as a guest material of a light-emitting material which emits light in a wavelength band of blue to yellow.

Example 4

In this example, a light-emitting element 2 having a structure different from that of the light-emitting element 1 described in Example 3 was evaluated. Chemical formulae of materials used in this example are shown below.

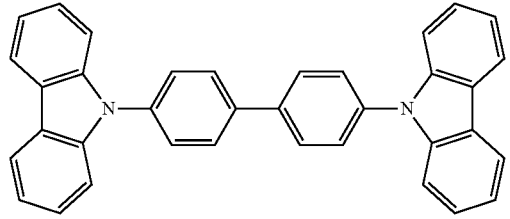

CBP

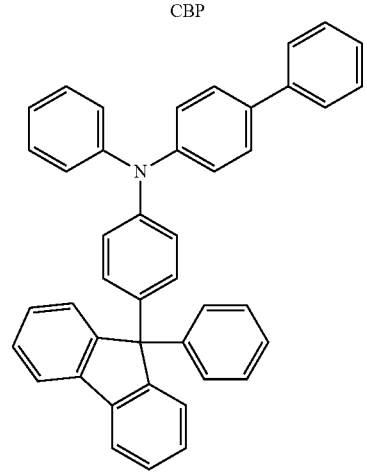

BPAFLP

-continued

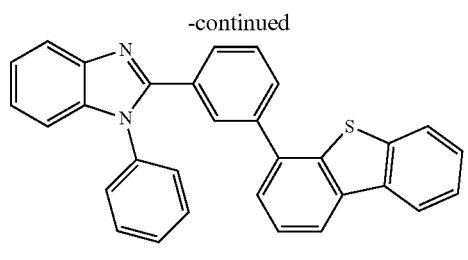

mDBTBIm-II

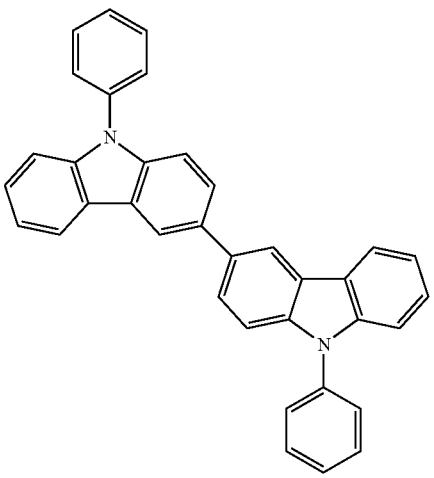

PCCP

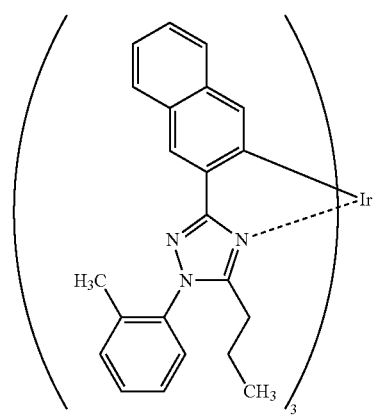

Ir(Prn3tz1-mp)$_3$

-continued

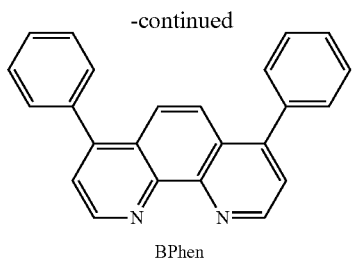
BPhen

Figure 21:
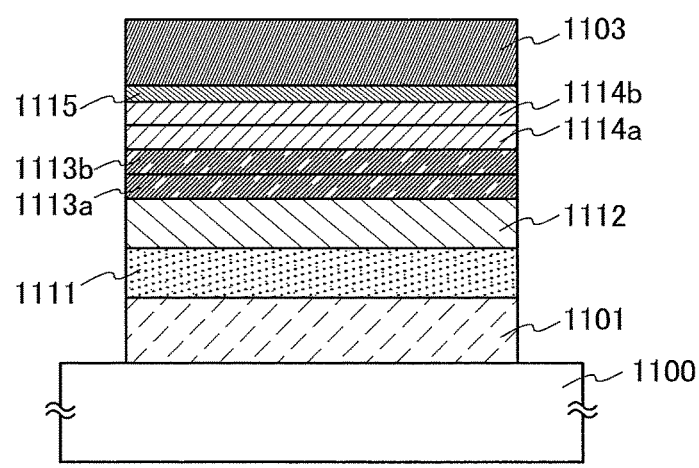
FIG. 21 illustrates a light-emitting element of Example.

The light-emitting element 2 is described with reference to FIG. 21. A method for manufacturing the light-emitting element 2 of this example is described below.

(Light-Emitting Element 2)

First, an indium oxide-tin oxide compound containing silicon or silicon oxide (ITSO) was deposited by a sputtering method over a substrate 1100, so that a first electrode 1101 was formed. Note that the composition ratio of $In_2O_3$ to $SnO_2$ and $SiO_2$ in the target used was 85:10:5 [wt %]. The thickness of the first electrode 1101 was 110 nm and the electrode area was 2 mm×2 mm. Here, the first electrode 1101 is an electrode that functions as an anode of the light-emitting element.

Next, as pretreatment for forming the light-emitting element over the substrate 1100, the surface of the substrate was washed, baked at 200° C. for 1 hour, and subjected to UV ozone treatment for 370 seconds.

After that, the substrate 1100 was transferred into a vacuum evaporation apparatus where the pressure had been reduced to approximately $10^{-4}$ Pa, and subjected to vacuum baking at 170° C. for 30 minutes in a heating chamber of the vacuum evaporation apparatus, and then the substrate 1100 was cooled down for about 30 minutes.

Next, the substrate 1100 provided with the first electrode 1101 was fixed to a substrate holder in the vacuum evaporation apparatus so that a surface on which the first electrode 1101 was provided faced downward. The pressure in the vacuum evaporation apparatus was reduced to about $10^{-4}$ Pa. Then, on the first electrode 1101, 4,4'-di(N-carbazolyl) biphenyl (abbreviation: CBP) and molybdenum oxide were deposited by co-evaporation, whereby a hole-injection layer 1111 was formed. The thickness of the hole-injection layer 1111 was 60 nm, and the weight ratio of CBP (abbreviation) to molybdenum oxide was adjusted to 4:2 (=CBP: molybdenum oxide).

Next, on the hole-injection layer 1111, a film of 4-phenyl-4'-(9-phenylfluoren-9-yl)triphenylamine (abbreviation: BPAFLP) was formed to a thickness of 20 nm, whereby the hole-transport layer 1112 was formed.

Further, 2-[3-(dibenzothiophen-4-yl)phenyl]-1-phenyl-1H-benzimidazole (abbreviation: mDBTBIm-II), 9-phenyl-9H-3-(9-phenyl-9H-carbazol-3-yl)-carbazole (abbreviation: PCCP), and tris{3-[1-(2-methylphenyl)-5-propyl-1H-1,2,4-triazol-3-yl-κN4]-2-naphthalenyl-C}iridium(III), (another name: tris[1-(2-methylphenyl)-3-(2-naphthyl)-5-propyl-1H-1,2,4-triazolato]iridium(III)), (abbreviation: [Ir(Prn3tzl-mp)$_3$]) synthesized in Example 1 were deposited by co-evaporation to form a first light-emitting layer 1113a on the hole-transport layer 1112. Here, the weight ratio of mDBTBIm-II (abbreviation) to PCCP (abbreviation) and [Ir(Prn3tzl-mp)$_3$](abbreviation) was adjusted to 1:0.3: 0.06 (=mDBTBIm-II: PCCP: [Ir(Prn3tzl-mp)$_3$]). The thickness of the first light-emitting layer 1113a was set to 20 nm.

Next, on the first light-emitting layer 1113a, mDBTBIm-II (abbreviation) and [Ir(Prn3tzl-mp)$_3$](abbreviation) were deposited by co-evaporation to form a second light-emitting layer 1113b. Here, the weight ratio of mDBTBIm-II (abbreviation) to [Ir(Prn3tzl-mp)$_3$](abbreviation) was adjusted to 1:0.06 (=mDBTBIm-II: [Ir(Prn3tzl-mp)$_3$]). The thickness of the second light-emitting layer 1113b was set to 20 nm.

Note that [Ir(Prn3tzl-mp)$_3$](abbreviation) is a guest material (dopant) in each of the first light-emitting layer 1113a and the second light-emitting layer 1113b.

Next, on the second light-emitting layer 1113b, a film of mDBTBIm-II (abbreviation) was formed to a thickness of 15 nm, whereby the first electron-transport layer 1114a was formed.

Next, a film of BPhen (abbreviation) was formed to a thickness of 20 nm on the first electron-transport layer 1114a, whereby the second electron-transport layer 1114b was formed.

Further, a film of lithium fluoride (LiF) was formed to a thickness of 1 nm over the second electron-transport layer 1114b by evaporation, whereby an electron-injection layer 1115 was formed.

Lastly, a film of aluminum was formed to a thickness of 200 nm by evaporation, whereby second electrode 1103 functioning as a cathode was formed. Thus, the light-emitting element 2 of this example was manufactured.

Table 3 shows an element structure of the light-emitting element 2 obtained as described above.

TABLE 3

| | First electrode | Hole-injection layer | Hole-transport layer | First light-emitting layer | Second light-emitting layer | First electron-transport layer | Second electron-transport layer | Electron-injection layer | Second electrode |
|---|---|---|---|---|---|---|---|---|---|
| Light-emitting element 2 | ITSO 110 nm | CBP:MoOx (=4:2) 60 nm | BPAFLP 20 nm | mDBTBIm-II:PCCP:Ir(Prn3tzl-mp)$_3$ (=1:0.3:0.06) 20 nm | mDBTBIm-II:Ir(Prn3tzl-mp)$_3$ (=1:0.06) 20 nm | mDBTBIm-II 15 nm | BPhen 20 nm | LiF 1 nm | Al 200 nm |

Then, in a glove box containing a nitrogen atmosphere, the light-emitting element 2 was sealed so as not to be exposed to the air (specifically, a sealant was applied onto an outer edge of the element and heat treatment was performed at 80° C. for 1 hour at the time of sealing). After that, operation characteristics of the light-emitting element 2 were measured. Note that the measurement was carried out at room temperature (in an atmosphere kept at 25° C.).

Figure 22:
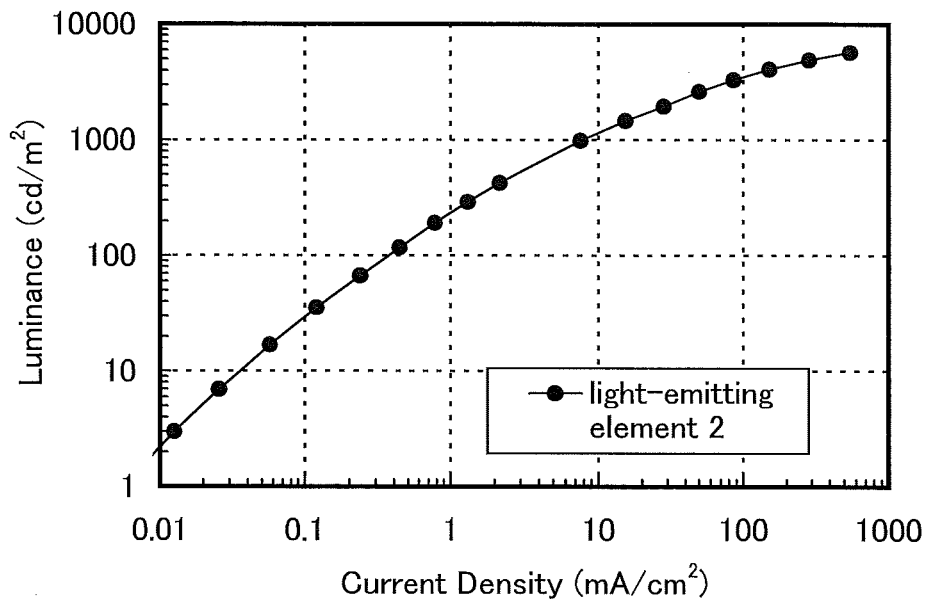
FIG. 22 shows luminance-current density characteristics of a light-emitting element 2.
Figure 23:
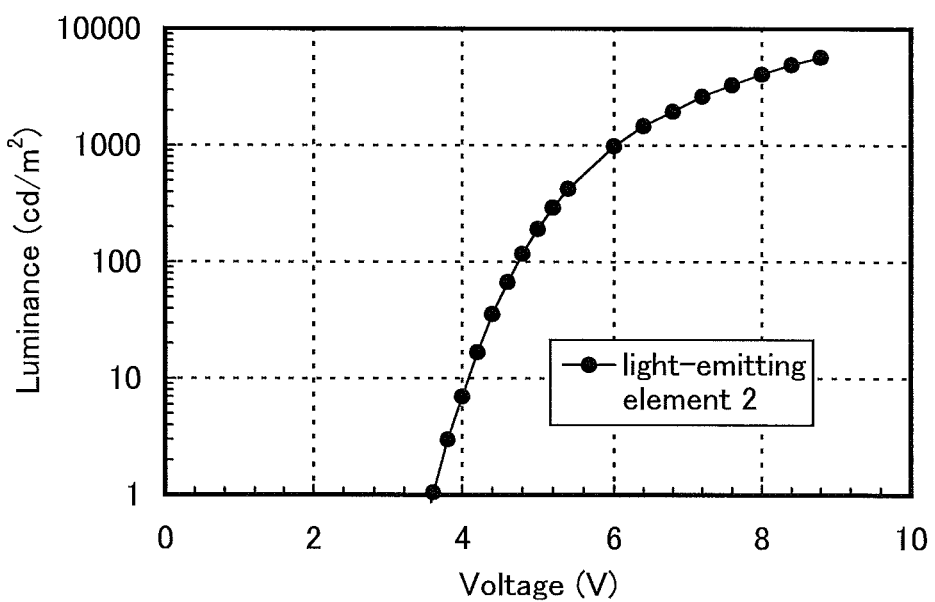
FIG. 23 shows luminance-voltage characteristics of the light-emitting element 2.

FIG. 22 shows the current density-luminance characteristic of the light-emitting element 2. In FIG. 22, the horizontal axis represents current density (mA/cm$^2$) and the vertical axis represents luminance (cd/m$^2$). FIG. 23 shows the voltage-luminance characteristics of the light-emitting element 2. In FIG. 23, the horizontal axis represents voltage (V) and the vertical axis represents luminance (cd/m$^2$). FIG.

Figure 24:
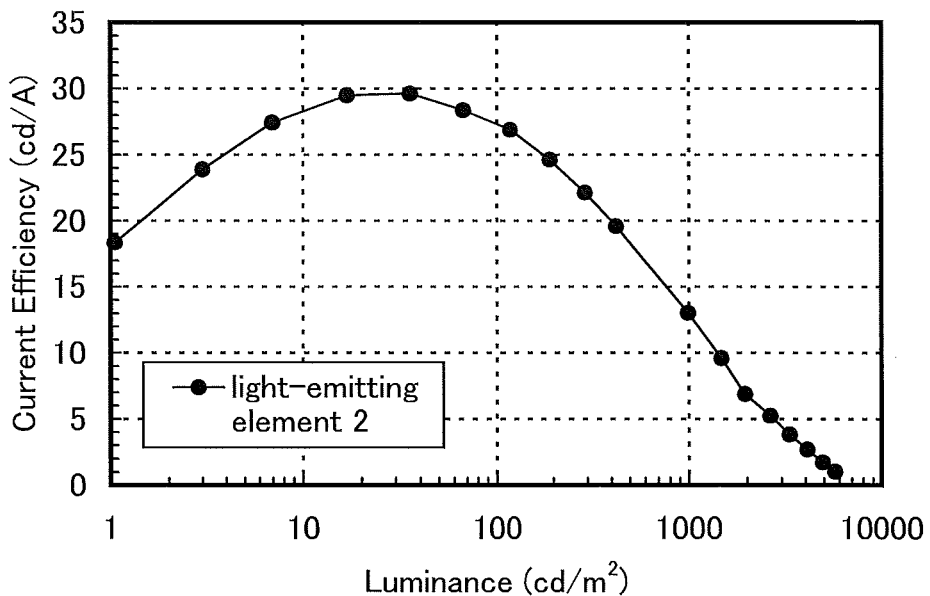
FIG. 24 shows current efficiency-luminance characteristics of the light-emitting element 2.
Figure 25:
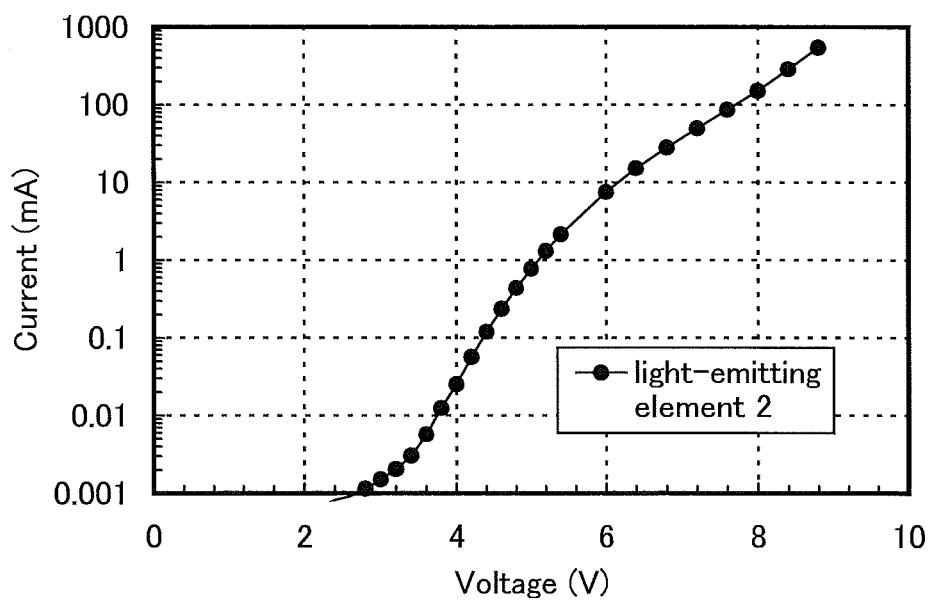
FIG. 25 shows current-voltage characteristics of the light-emitting element 2.

24 shows the luminance-current efficiency characteristics of the light-emitting element 2. In FIG. 24, the horizontal axis represents luminance (cd/m$^2$) and the vertical axis represents current efficiency (cd/A). FIG. 25 shows the voltage-current characteristics of the light-emitting element 2. In FIG. 25, the horizontal axis represents voltage (V) and the vertical axis represents current (mA).

FIG. 22 and FIG. 24 show that the light-emitting element 2 had high efficiency. Further, FIG. 22, FIG. 23, and FIG. 25 show that the light-emitting element 2 had low driving voltage and low power consumption.

Next, Table 4 shows the voltage (V), current density (mA/cm$^2$), CIE chromaticity coordinates (x, y), luminance (cd/m$^2$), current efficiency (cd/A), and external quantum efficiency (%) of the light-emitting element 2 at a luminance of 989 cd/m$^2$.

TABLE 4

| | Voltage (V) | Current density (mA/cm$^2$) | CIE chromaticity co-ordinates x | CIE chromaticity co-ordinates y | Luminance (cd/m$^2$) | Current efficiency (cd/A) | External quantum efficiency (%) |
|---|---|---|---|---|---|---|---|
| Light-emitting element 2 | 6.0 | 7.6 | 0.36 | 0.61 | 989 | 13 | 3.9 |

Figure 26:
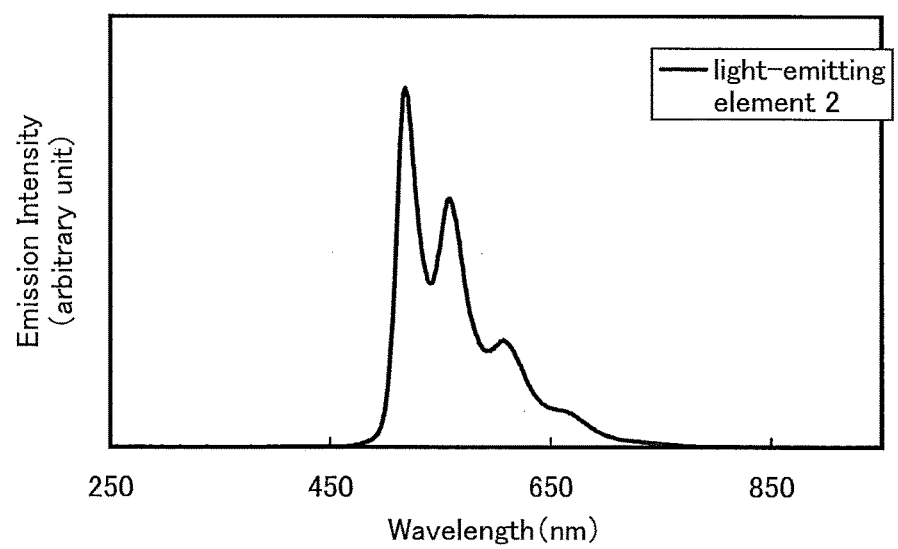
FIG. 26 shows an emission spectrum of the light-emitting element 2.

FIG. 26 shows an emission spectrum at a current density of the light-emitting element 2 of 2.5 mA/cm$^2$. As shown in FIG. 26, the emission spectrum of the light-emitting element 2 has peaks at 518 nm, 559 nm, and 607 nm.

In addition, as shown in Table 4, the CIE chromaticity coordinates of the light-emitting element 1 were (x, y)= (0.36, 0.61) at a luminance of 989 cd/m$^2$. These results show that light originating from the dopant was obtained.

As described above, the light-emitting element 2 in which [Ir(Prn3tzl-mp)$_3$](abbreviation) was used for the light-emitting layer can efficiently emit light in the blue-green range. This indicates that [Ir(Prn3tzl-mp)$_3$](abbreviation) can be favorably used as a guest material of a light-emitting material which emits light in a wavelength band of blue to yellow.

Figure 27:
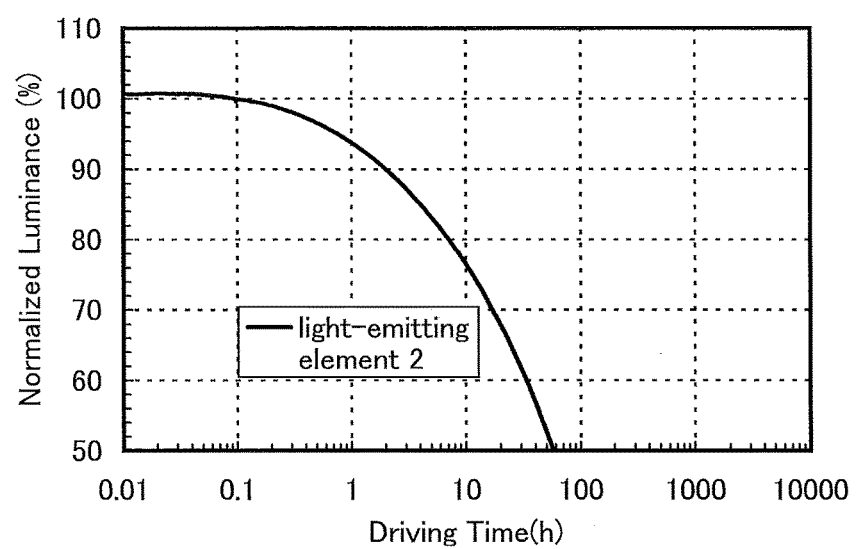
FIG. 27 shows normalized luminance-driving time characteristics of the light-emitting element 2.

Next, a reliability test was performed on the light-emitting element 2. FIG. 27 shows results of the reliability test.

In the reliability test, the light-emitting element 2 was driven under the conditions where the initial luminance was 1000 cd/m$^2$ and the current density was constant. The results are shown in FIG. 27. The horizontal axis represents driving time (h) of the elements, and the vertical axis represents normalized luminance (%) on the assumption that the initial luminance is 100%. As shown in FIG. 27, it took about 57 hours of driving time for the normalized luminance of the light-emitting element 2 to decline to 50% or lower.

FIG. 27 shows that the light-emitting element 2 has a long lifetime.

The above results show that the light-emitting element 2 in which [Ir(Prn3tzl-mp)$_3$](abbreviation) is used for the light-emitting layer has high efficiency, low driving voltage, low power consumption, and a long lifetime.

This application is based on Japanese Patent Application serial no. 2012-261797 filed with Japan Patent Office on Nov. 30, 2012, the entire contents of which are hereby incorporated by reference.

What is claimed is:

1. A light-emitting element comprising:
a first organic compound;
a second organic compound; and
a third organic compound,
wherein an absorption edge of an absorption spectrum of the third organic compound is 440 nm or less,
wherein the second organic compound comprises:
a 1,2,4-triazole skeleton;
a phenyl skeleton;
an arylene skeleton; and
a metal selected from Group 9 or Group 10,
wherein nitrogen at the 4-position of the 1,2,4-triazole skeleton coordinates to the metal and nitrogen at the 1-position of the 1,2,4-triazole skeleton is bonded to the phenyl skeleton,
wherein the arylene skeleton is bonded to the 3-position of the 1,2,4-triazole skeleton and the metal,
wherein an alkyl group having 1 to 4 carbon atoms is bonded to the 5-position of the 1,2,4-triazole skeleton and the metal, and
wherein by ToF-SIMS analysis, the second organic compound gives a peak of a precursor ion in a range of m/z=600 to m/z=2000 and a peak of a product ion in a range of m/z=75 to m/z=300.

2. The light-emitting element according to claim 1, wherein the second organic compound gives a peak of a first product ion around m/z=91, a peak of a second product ion around m/z=160, and a peak of a precursor ion around m/z=1171.

3. The light-emitting element according to claim 2, wherein a difference in m/z between the peaks of the first product ion and the second product ion corresponds to a molecular weight of the 1,2,4-triazole skeleton.

4. The light-emitting element according to claim 1, wherein the second organic compound gives a peak of a first product ion around m/z=91, a peak of a second product ion around m/z=160, and a peak of a precursor ion around m/z=1250.

5. The light-emitting element according to claim 1, wherein the metal is iridium.

6. A light-emitting device comprising the light-emitting element according to claim 1.

7. A light-emitting element comprising:
a first electrode;
a second electrode facing the first electrode; and
a light-emitting layer between the first electrode and the second electrode, the light-emitting layer including a first organic compound, a second organic compound, and a third organic compound,
wherein an absorption edge of an absorption spectrum of the third organic compound is 440 nm or less, wherein the second organic compound comprises:
a 1,2,4-triazole skeleton;
a phenyl skeleton;
an arylene skeleton; and
a metal selected from Group 9 or Group 10,
wherein nitrogen at the 4-position of the 1,2,4-triazole skeleton coordinates to the metal and nitrogen at the 1-position of the 1,2,4-triazole skeleton is bonded to the phenyl skeleton,
wherein the arylene skeleton is bonded to the 3-position of the 1,2,4-triazole skeleton and the metal,
wherein an alkyl group having 1 to 4 carbon atoms is bonded to the 5-position of the 1,2,4-triazole skeleton and the metal, and
wherein by ToF-SIMS analysis, the second organic compound gives a peak of a precursor ion in a range of m/z=600 to m/z=2000 and a peak of a product ion in a range of m/z=75 to m/z=300.

8. The light-emitting element according to claim 7, wherein the second organic compound gives a peak of a first product ion around m/z=91, a peak of a second product ion around m/z=160, and a peak of a precursor ion around m/z=1171.

9. The light-emitting element according to claim 8, wherein a difference in m/z between the peaks of the first product ion and the second product ion corresponds to a molecular weight of the 1,2,4-triazole skeleton.

10. The light-emitting element according to claim 7, wherein the second organic compound gives a peak of a first product ion around m/z=91, a peak of a second product ion around m/z=160, and a peak of a precursor ion around m/z=1250.

11. The light-emitting element according to claim 7, wherein the metal is iridium.

12. A light-emitting device comprising the light-emitting element according to claim 7.

13. The light-emitting device according to claim 12, further comprising a touch sensor.

14. A light-emitting element comprising:
a first organic compound;
a second organic compound; and
a third organic compound,
wherein an absorption edge of an absorption spectrum of the third organic compound is 440 nm or less,
wherein the second organic compound comprises:
a 1,2,4-triazole skeleton;
a phenyl skeleton;
an arylene skeleton; and
a metal selected from Group 9 or Group 10,
wherein nitrogen at the 4-position of the 1,2,4-triazole skeleton coordinates to the metal and nitrogen at the 1-position of the 1,2,4-triazole skeleton is bonded to the phenyl skeleton,
wherein the arylene skeleton is bonded to the 3-position of the 1,2,4-triazole skeleton and the metal,
wherein an alkyl group having 1 to 4 carbon atoms is bonded to the 5-position of the 1,2,4-triazole skeleton and the metal, and
wherein the second organic compound gives a peak around 1540 $cm^{-1}$ by IR analysis.

15. The light-emitting element according to claim 14, wherein the second organic compound further gives peaks around 3030 $cm^{-1}$ and around 1600 $cm^{-1}$.

16. The light-emitting element according to claim 14, wherein the peak around 1540 $cm^{-1}$ is derived from C=N stretch vibration.

17. The light-emitting element according to claim 14, wherein the metal is iridium.

18. A light-emitting device comprising the light-emitting element according to claim 14.

* * * * *